United States Patent [15] 3,703,222

Lusti et al. [45] Nov. 21, 1972

[54] SOLID STATE CONTROL SYSTEM

[72] Inventors: John Lusti, River Vale; John Charles Doane, Somerset, both of N.J.

[73] Assignee: Otis Elevator Company, New York, N.Y.

[22] Filed: Jan. 21, 1971

[21] Appl. No.: 108,549

[52] U.S. Cl. ..............................................187/29 R

[51] Int. Cl. ..............................................B66b 1/18

[58] Field of Search...................187/29; 317/101 DH

[56] References Cited

UNITED STATES PATENTS

| | | | |
|---|---|---|---|
| 3,300,686 | 1/1967 | Johnson et al. | ......317/101 DH |
| 3,417,842 | 12/1968 | Kuzara et al | ................187/29 |
| 3,447,037 | 5/1969 | Nissim | ................317/101 DH |

*Primary Examiner*—Bernard A. Gilheany
*Assistant Examiner*—W. E. Duncanson, Jr.
*Attorney*—Joseph L. Sharon and Robert T. Mayer

[57] ABSTRACT

Improved solid state control systems for elevators in which the solid state components are mounted on printed circuit boards, the conductor paths of which interconnect the components of each individual board and connect them to circuit terminals which enable the connections of various components on different boards to each other. A first plurality of printed circuit boards whose components are properly interconnected provides basic control circuitry for one elevator car operating in a single car system. When appropriately connected to the control equipment associated with its car so as to receive control signals therefrom this circuitry operates in response to such signals in a predetermined manner to control its car according to a particular mode of operation. Included among the conductor paths on the circuit boards of this first plurality and connected between circuit terminals and solid state components thereof are a number of paths which are unnecessary to the operation of the basic control circuitry. These enable the connection of auxiliary equipment to the basic control circuitry which causes that circuitry to operate differently in response to the control signals it receives from the associated control equipment even though the interconnections between the components of the basic control circuitry and the connection between it and the associated control equipment remain unaltered. The printed circuit boards employed in supervisory control systems for groups of elevator cars possess a similar such universal character.

64 Claims, 42 Drawing Figures

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY [signature] ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

INVENTORS
JOHN LUSTI
JOHN CHARLES DOANE
BY R. T. Mayer ATTORNEY

SOLID STATE CONTROL SYSTEM

This invention relates to control systems and more particularly to control systems employing solid state components.

While the invention is applicable to solid state control systems in general, it is especially applicable to those used to control what might in broad terms be called conveyor cars. It will hereinafter be described, however, as used in more limited applications and specifically in solid state control systems for elevators.

The use of plug-in type printed circuit boards in solid state control systems considerably reduces the difficulties involved in repairing such systems. With these boards, a system which breaks down because of a misoperating circuit can be repaired by the simple expediency of removing the "bad" board upon which the misoperating circuit is mounted and replacing it with a "good," duplicate board. Despite the fact that this eliminates a perplexing maintenance and repair problem, it is not a solution without its own drawbacks.

It is desirable to build some control systems, particularly those for elevator cars, so that they can be provided with some optional operations. Where this is the case, the standard operating circuits of these systems, i.e., those circuits common to elevator systems in general, operate differently with the addition of different options. In the past this meant that if printed circuit boards were to be used in elevator control systems different boards would have to be manufactured and stocked for the standard, or common, operating circuits for virtually every difference in their operation. Because of the number of optional operations available with elevator control systems, this could easily increase the inventory of printed circuit boards to an impractical amount and result in an uneconomical increase in the cost of the average elevator control system.

It is an object of this invention to provide improved solid state control systems.

It is another object of this invention to improve solid state control systems by reducing the inventory of printed circuit boards that are employed in such systems.

It is another object of this invention to provide a solid state elevator control system which is easy to service and yet universal enough to permit part of it to be used for various different types of elevator installations both single and plural car.

It is another object of this invention to provide apparatus for solid state elevator control systems including switching logic circuits mounted on printed circuit boards which boards are useful in many different types of systems including both single and plural car systems.

It is still another object of this invention to provide apparatus for single and plural car solid state elevator control systems including controlling switching circuitry mounted on printed circuit boards which is capable of having additional signals transmitted thereto from auxiliary switching circuitry which cause the same controlling circuitry to be operable in different manners so as to enable the same controlling circuitry to be used to control cars of different systems in different ways.

It is a still further object of this invention to provide apparatus for plural car solid state elevator control systems in which the switching circuitry is segregated into individual car control circuitry and group supervisory control circuitry wherein each individual car control circuitry is capable of operating its associated car in a predetermined manner if the group supervisory control circuitry should fail to operate in its intended manner.

These and other objects are accomplished by increasing the utility of the printed circuit boards of the disclosed systems so that identical ones of them can be used in different systems whether single or plural car and whether possessing different optional operations or not possessing any at all.

One of the advantages of the invention is the expected reduction in cost of solid state elevator control systems because of the reduction in the number of printed circuit boards that it is necessary to manufacture and to stock in order to provide control systems for different types of elevators.

It is a feature of the invention that if a component fails on one of the printed circuit boards which form the previously mentioned controlling switching circuitry of a car whose operation is vital to the continued functioning of a building and the failure prevents the car from operating a corresponding board can be removed from a less important car and substituted in the system of this vital car. This enables it to continue to operate and such substitution is possible notwithstanding the controlling switching circuitry of this less important car is operable in a manner different from that of the vital car.

The hereinafter disclosed constructed embodiment of the invention is in a control system for an elevator car severing a plurality of stops in response to control signals produced by associated control equipment including call registering devices and a car position indicating means. The system comprises a plurality of printed circuit boards. Each board includes a plurality of printed circuit conductor paths and a plurality of electrical components mounted thereon interconnected by associated conductor paths which transmit signals between said components. Each board also includes a plurality of circuit terminals connected to various ones of the electrical components of its associated board by conductor paths associated with said board. Wiring means interconnects the electrical components of different boards through respective circuit terminals and transmits signals therebetween. The wiring means also connects the electrical components through the circuit terminals to receive the control signals produced by said associated control equipment thereby forming controlling switching logic circuits for the car. These circuits are operable in a particular manner in response to the control signals to control the car. The system also comprises auxiliary switching logic circuits. Auxiliary wiring means connects the auxiliary switching logic circuits to circuit terminals of the controlling switching logic circuits and in predetermined circumstances to the associated control equipment thereby transforming the controlling switching logic circuits to operate in response to the forementioned control signals in a manner different from the particular manner. The controlling switching logic circuits, however, are operable in the particular manner in response to the forementioned control signals notwithstanding the failure of the auxiliary switching logic circuits to operate to a first condition, and said auxiliary switching logic circuits are removably connected to said controlling circuits whereby if said auxiliary circuits fail to a second condition they are readily disconnectable whereupon said controlling circuits are also operable in the particular manner.

In accordance with the invention there is also provided for use in control systems for conveyor cars, apparatus capable of being arranged in different systems to operate in different manners to provide different operating characteristics to the cars thereof. Each car of each system serves a plurality of stops in response to control signals produced by associated control equipment including call registering devices and car position indicating means. The apparatus for each car of each system includes a plurality of circuit boards. Each board includes a plurality of electrical components. The apparatus also includes wiring means for each car of each system for interconnecting the electrical components of the circuit boards of its associated car and for connecting them to receive the control signals produced by the associated control equipment thereby forming basic control circuitry. The basic control circuitry of each car is operable in a predetermined manner in response to identical control signals to provide its associated car with predetermined operating characteristics. The apparatus also includes auxiliary circuit boards for each car whose basic control circuitry is to operate in response to the control signals in a manner different from the predetermined manner to provide its respective car with operating characteristics different from the predetermined ones. Each auxiliary circuit board includes a plurality of electrical components. In addition, the apparatus includes auxiliary wiring means for each auxiliary circuit board for connecting the electrical components of its associated auxiliary circuit board to the basic control circuitry provided for the associated car and under certain conditions to the associated control equipment for the respective car to make the associated basic control circuitry operable in its specifically different manner. Moreover, each first recited circuit board of a car is interchangeable with the corresponding circuit board of another car with the basic control circuitry of both retaining the ability to operate in the predetermined manner notwithstanding the basic control circuitry of the one car when connected to its associated auxiliary circuit board or boards is operable in response to identical control signals in a manner different from that of the other car so as to provide the one car with operating characteristics different from the other car.

Other objects, advantages and features of the invention will be apparent to those skilled in the art from the following disclosure when taken in conjunction with the appended claims and accompanying drawing in which, FIG. 1 is a schematic diagram of solid state switching logic circuits mounted on one of the circuit boards employed for performing switching functions in response to the registration of calls and the position of a single associated elevator car;

Figure 1:
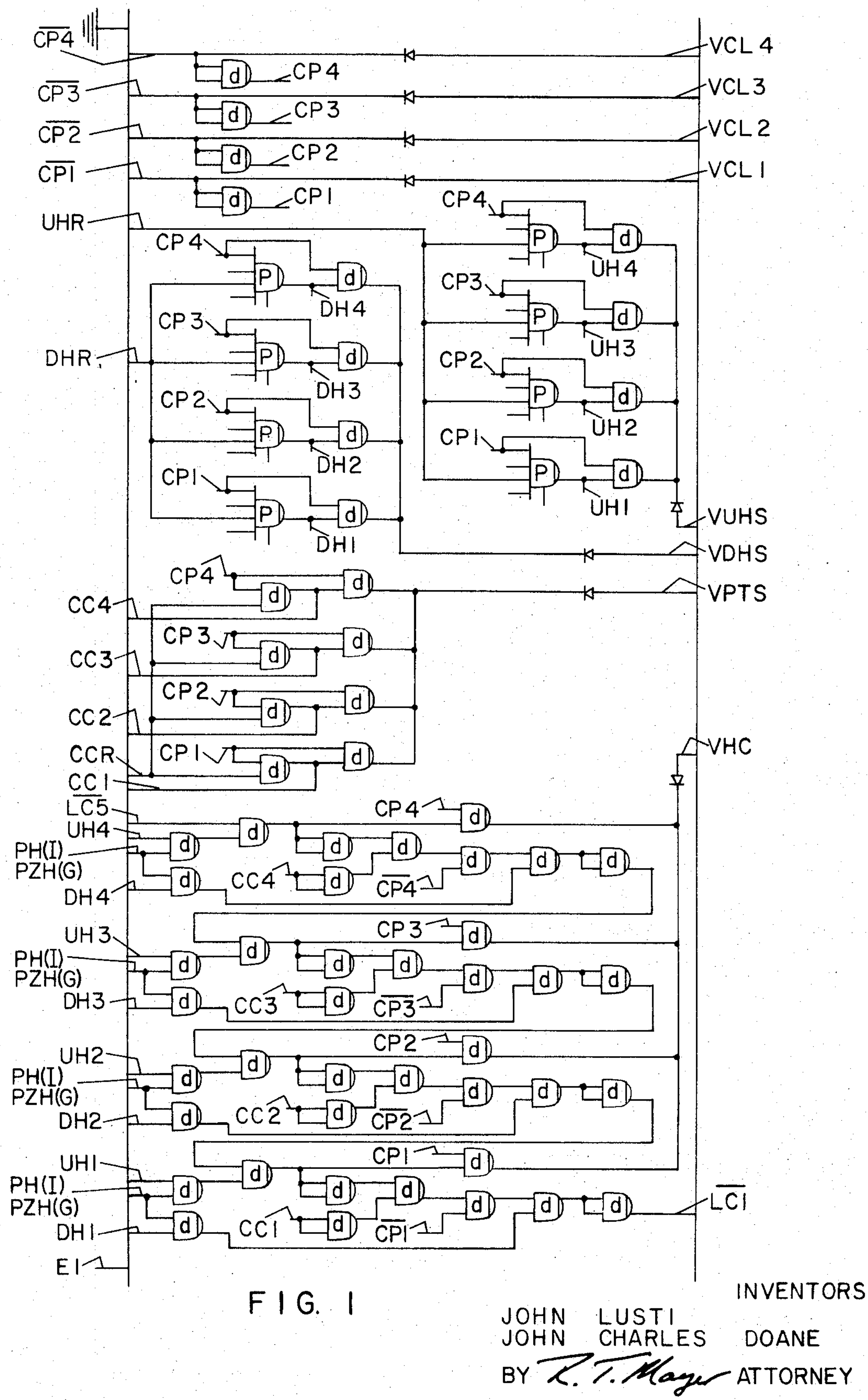
Figure 6:
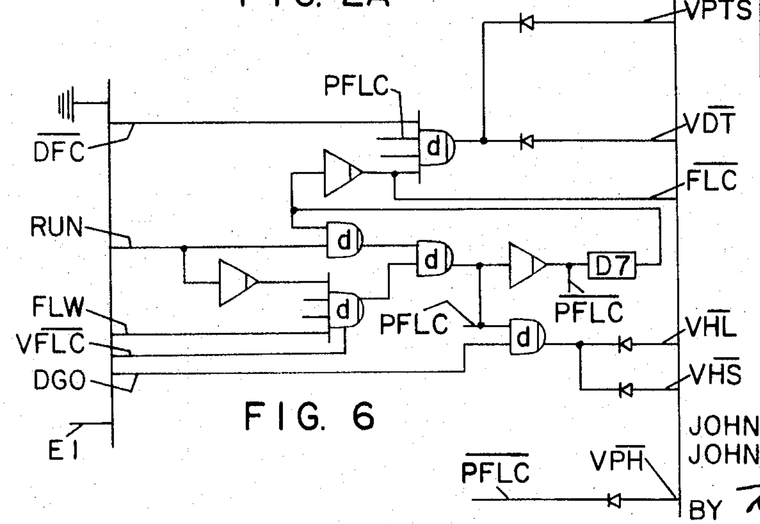
Figure 4:
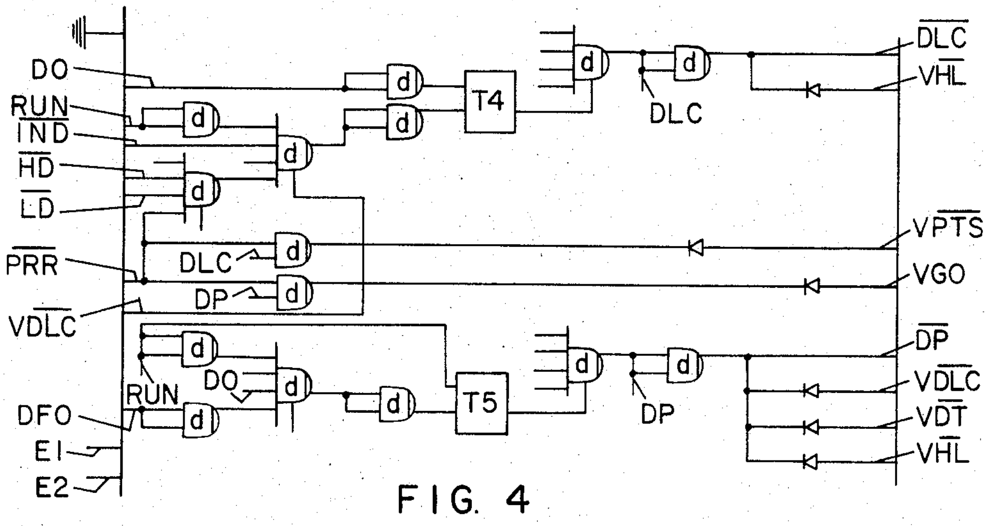
Figure 4A:
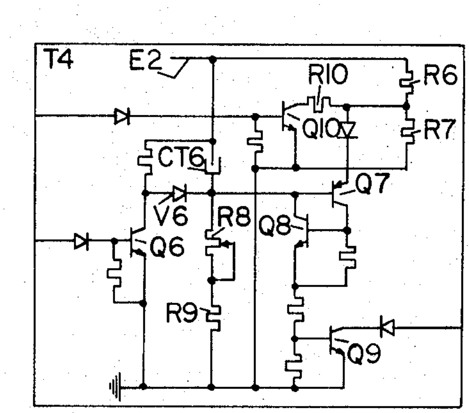
Figure 4B:
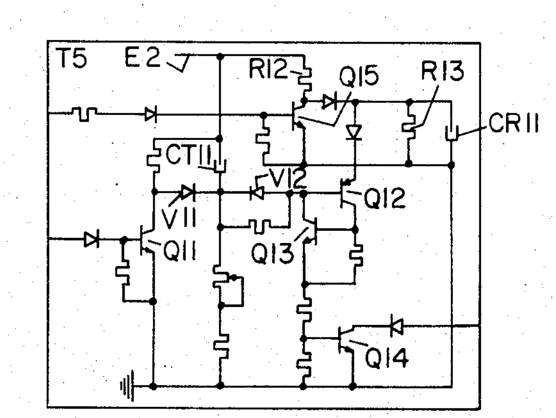
Figure 5:
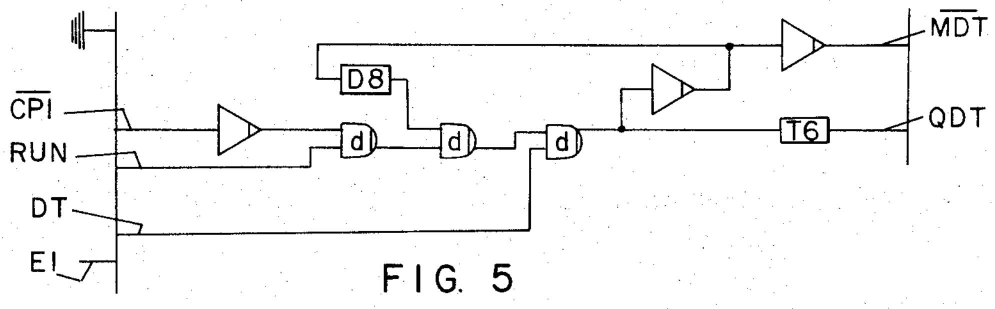
Figure 9:
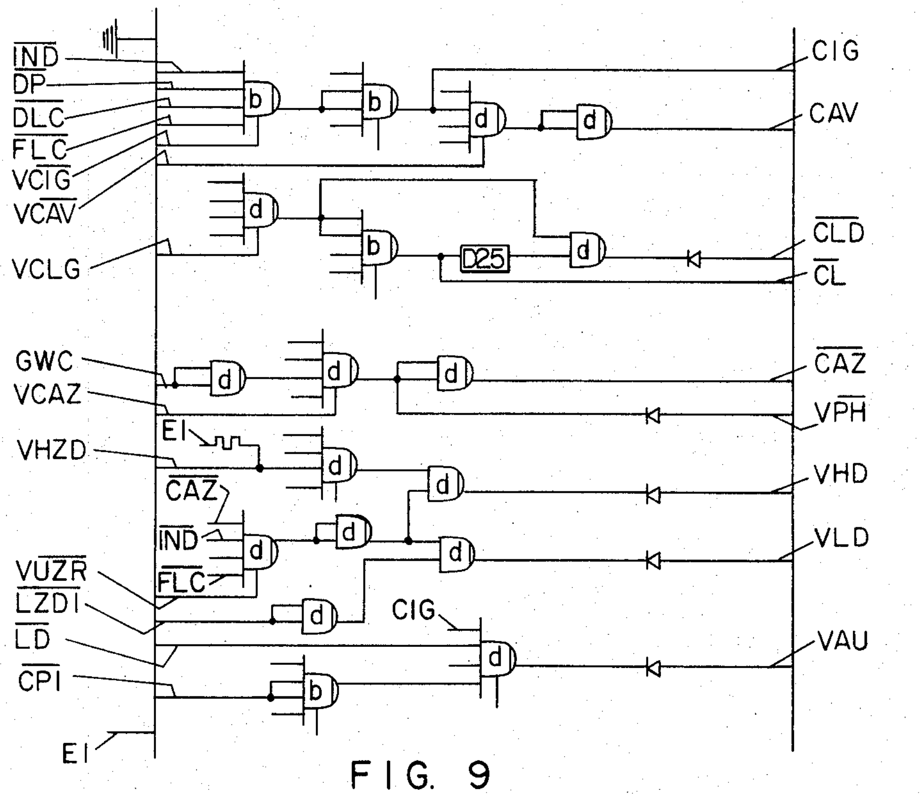
Figure 7A:
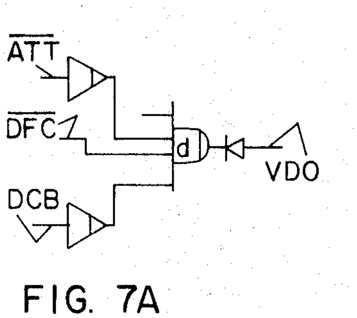
Figure 7B:
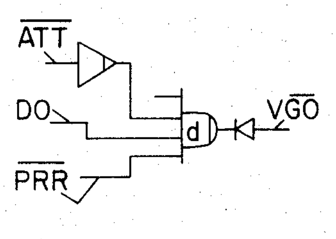
Figure 7C:
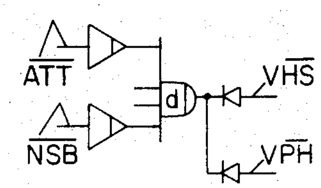
Figure 8:
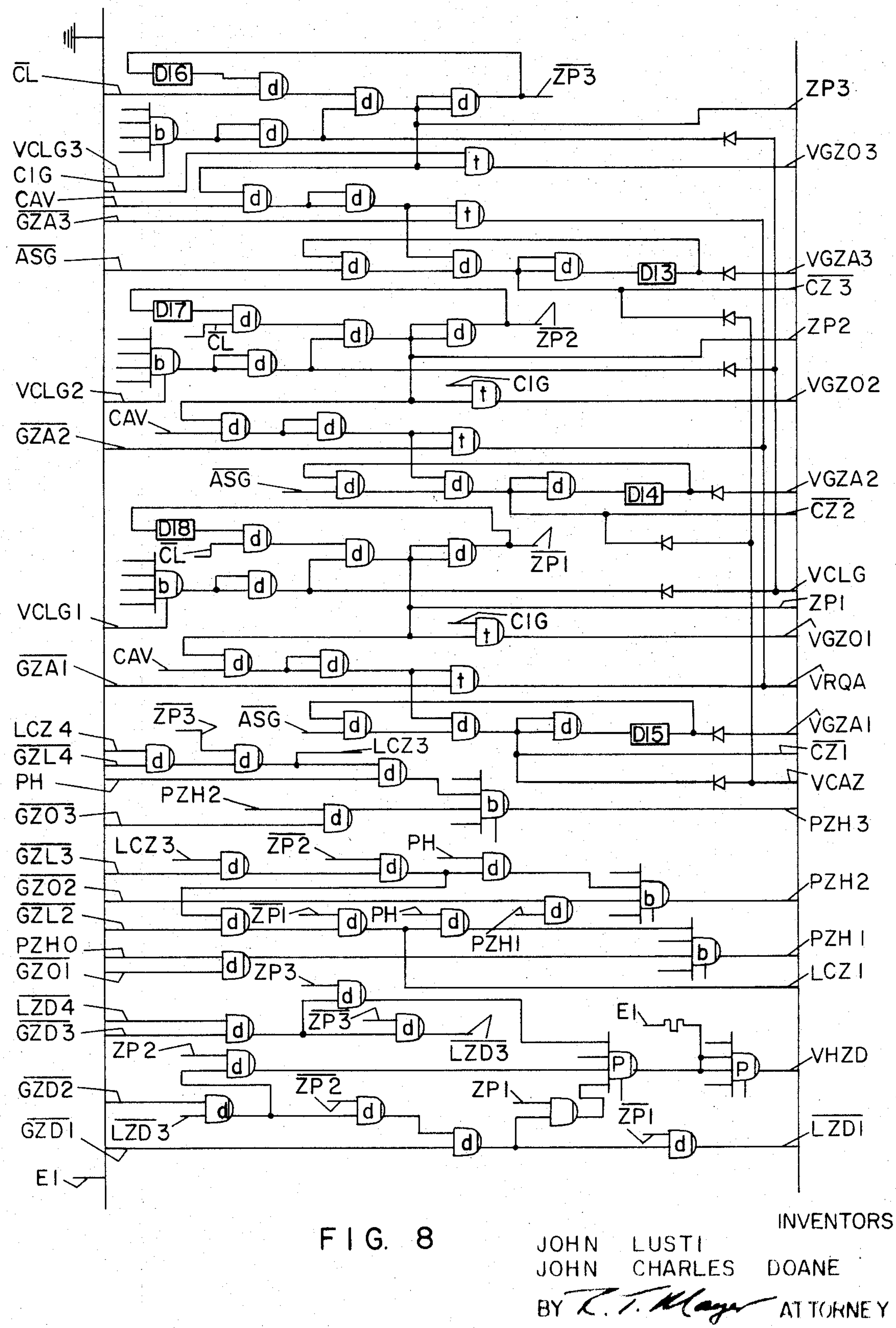
Figure 10:
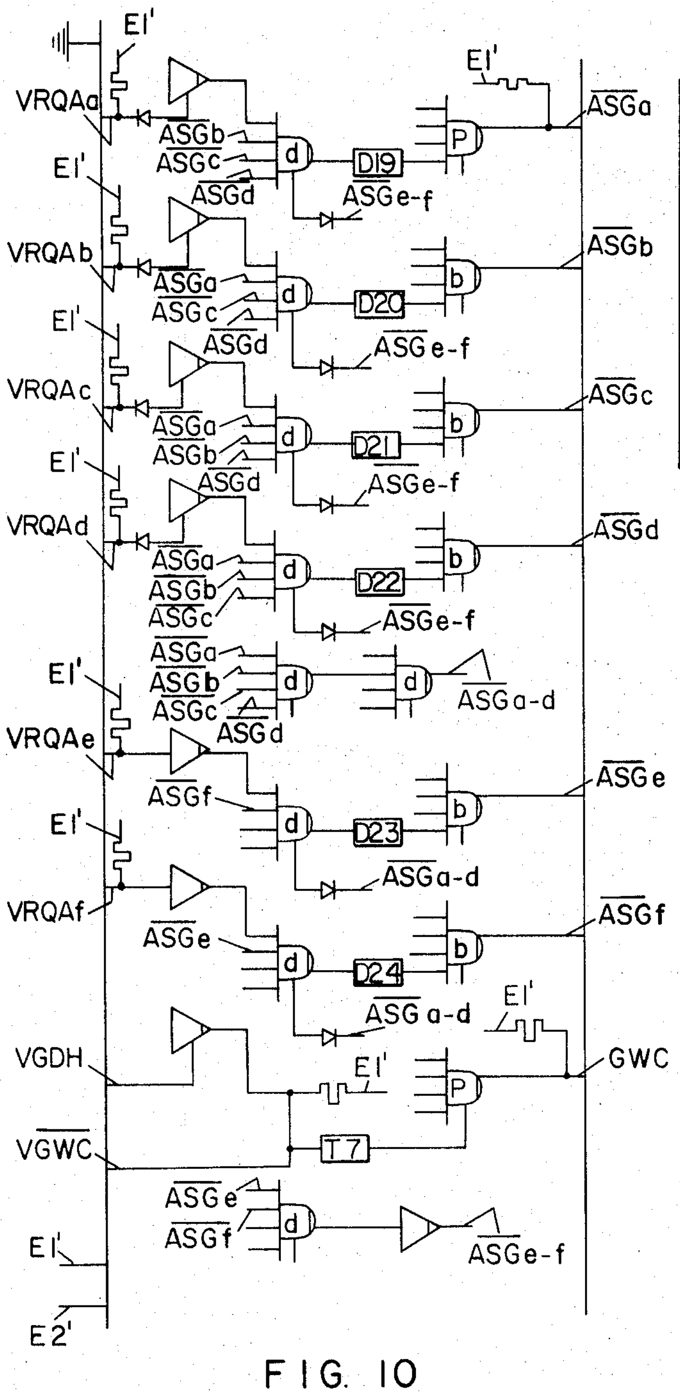
Figure 10A:
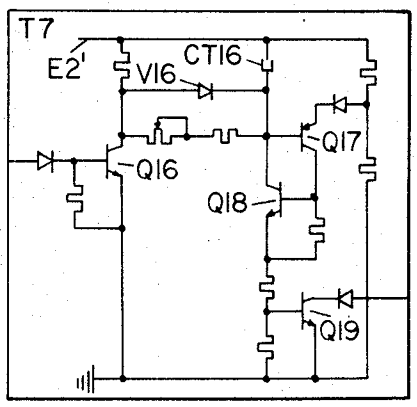
Figure 11:
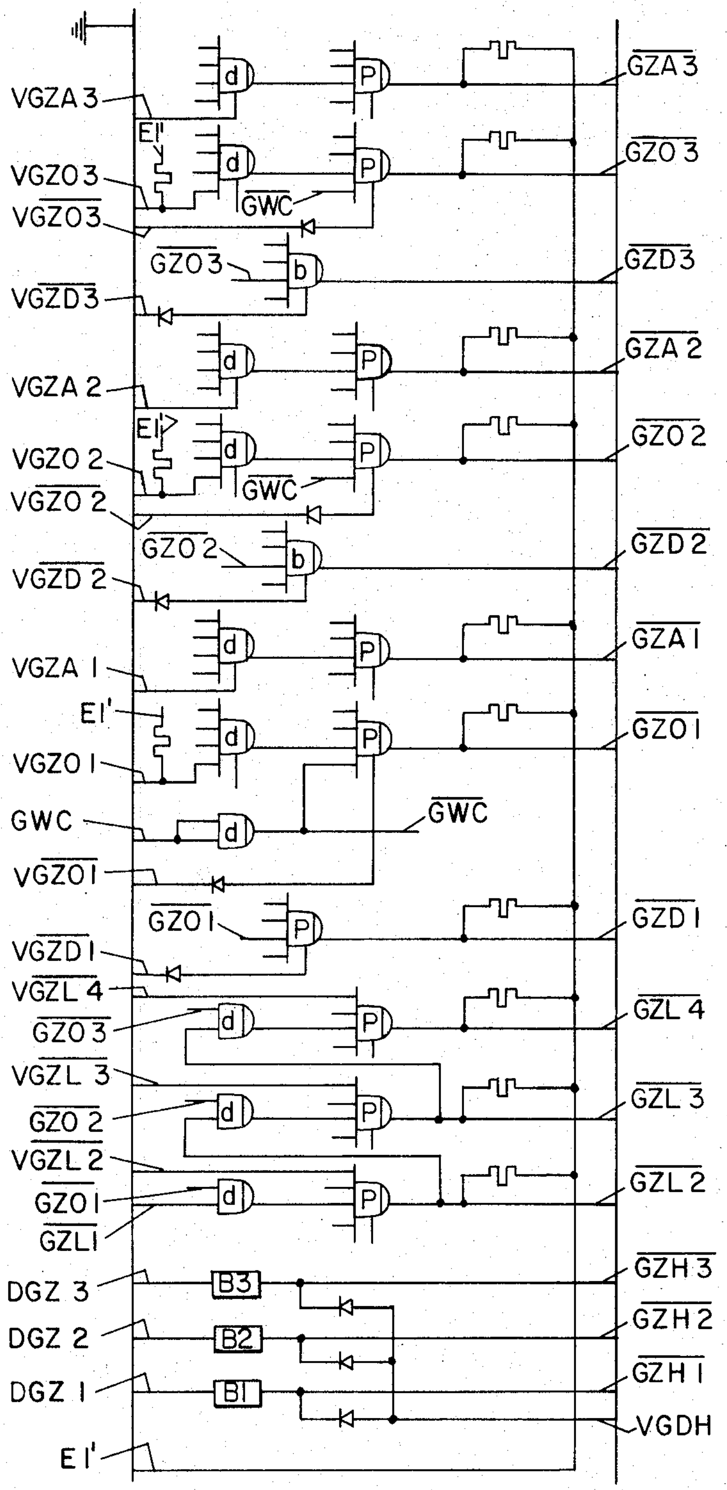
Figure 11A:
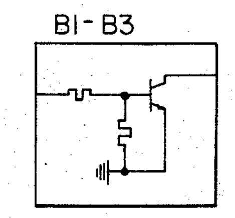
Figure 12A:
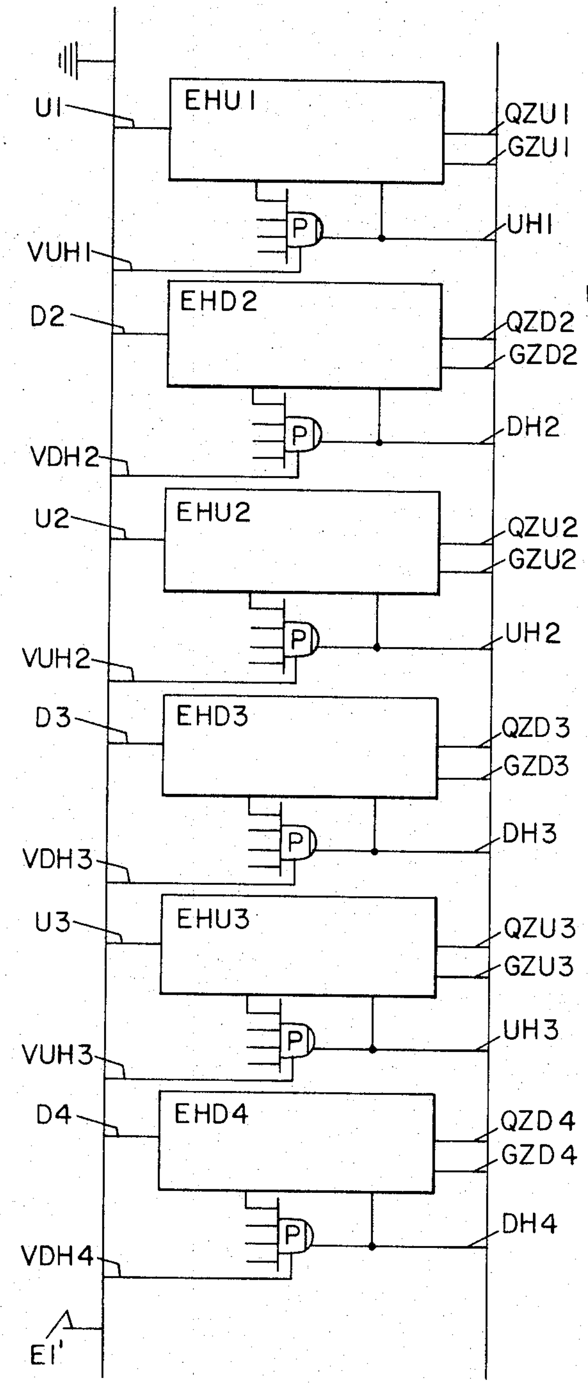
Figure 12B:
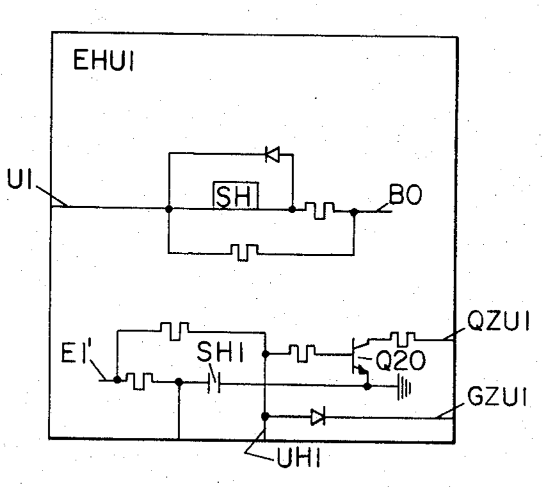
Figure 12C:
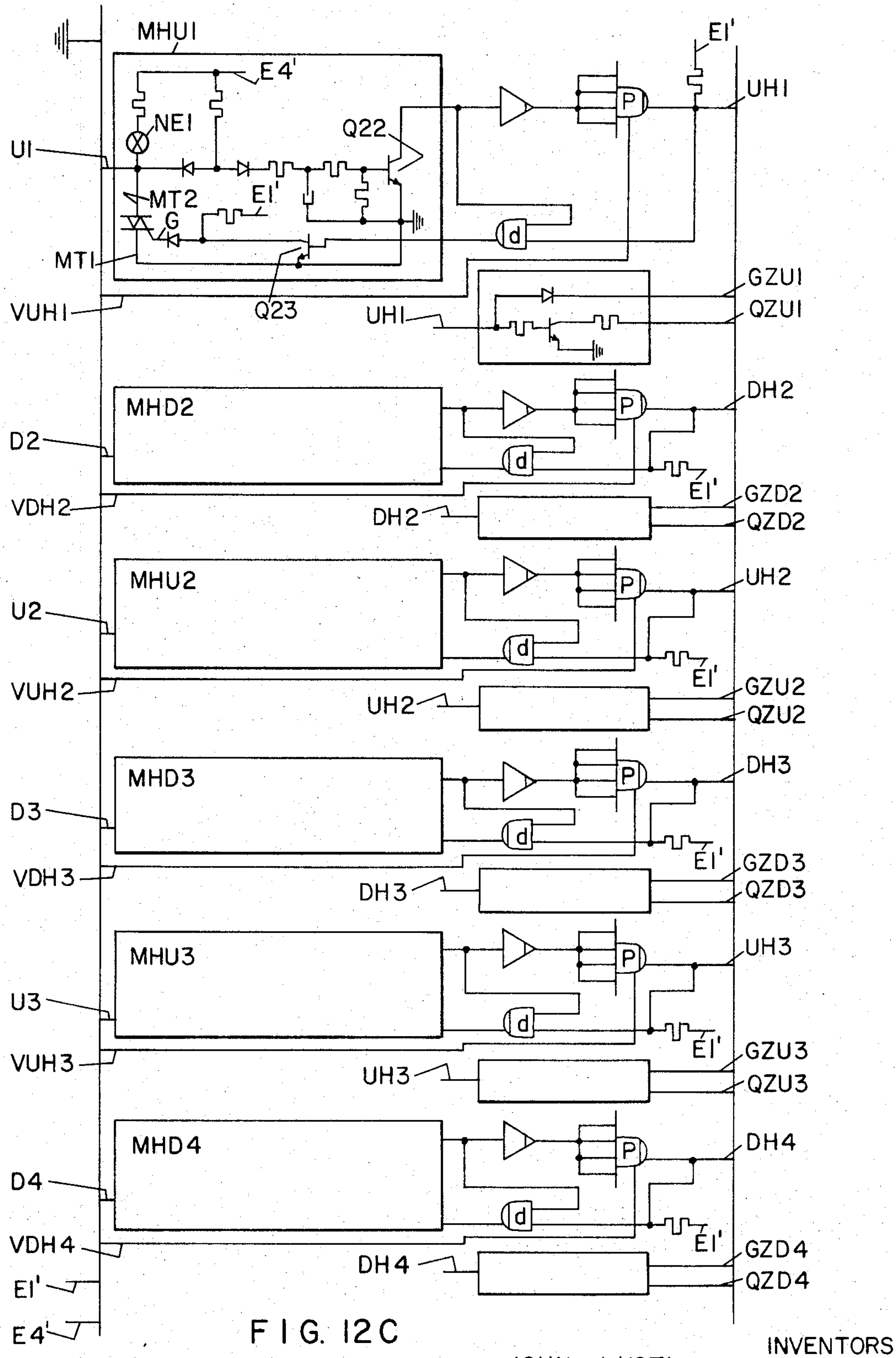
Figures 13A, 13C, 13D:
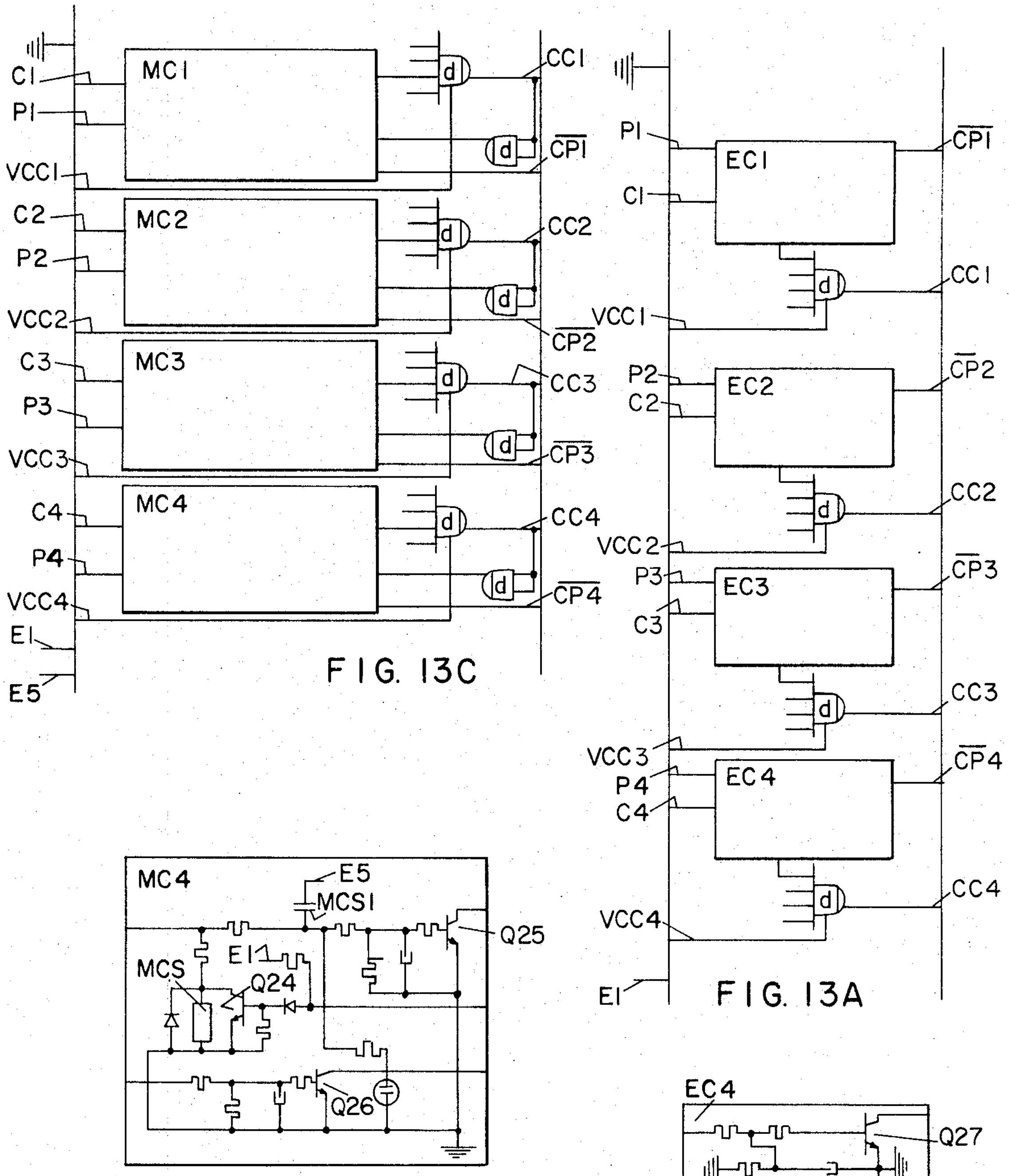
Figure 13B:
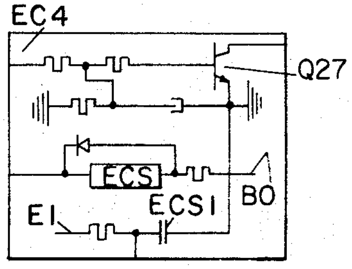
Figure 14:
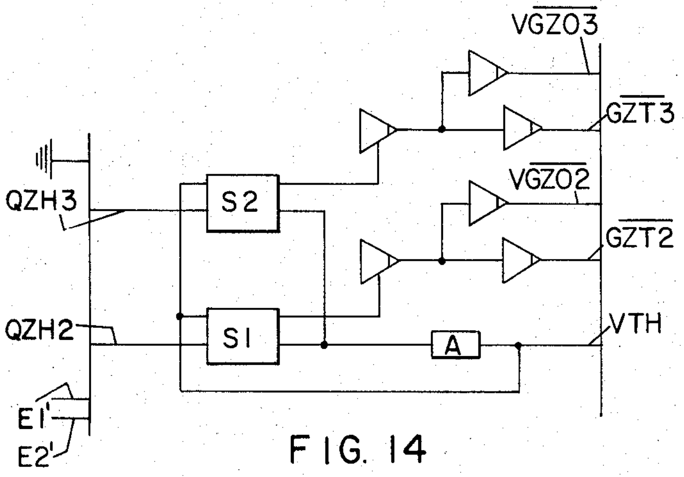
Figure 14A:
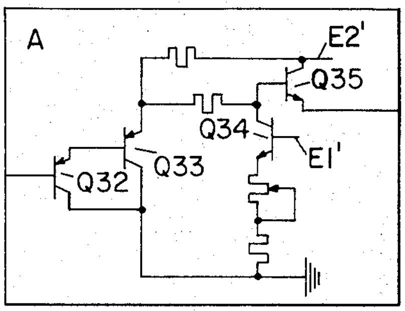
Figure 14B:
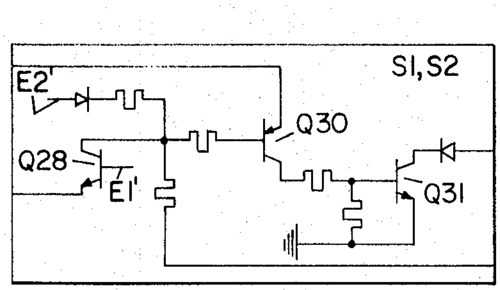
Figure 15:
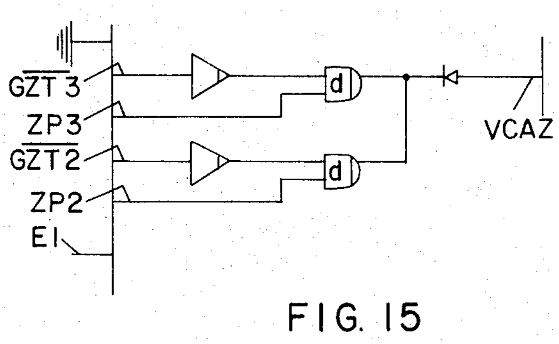
Figure 16:
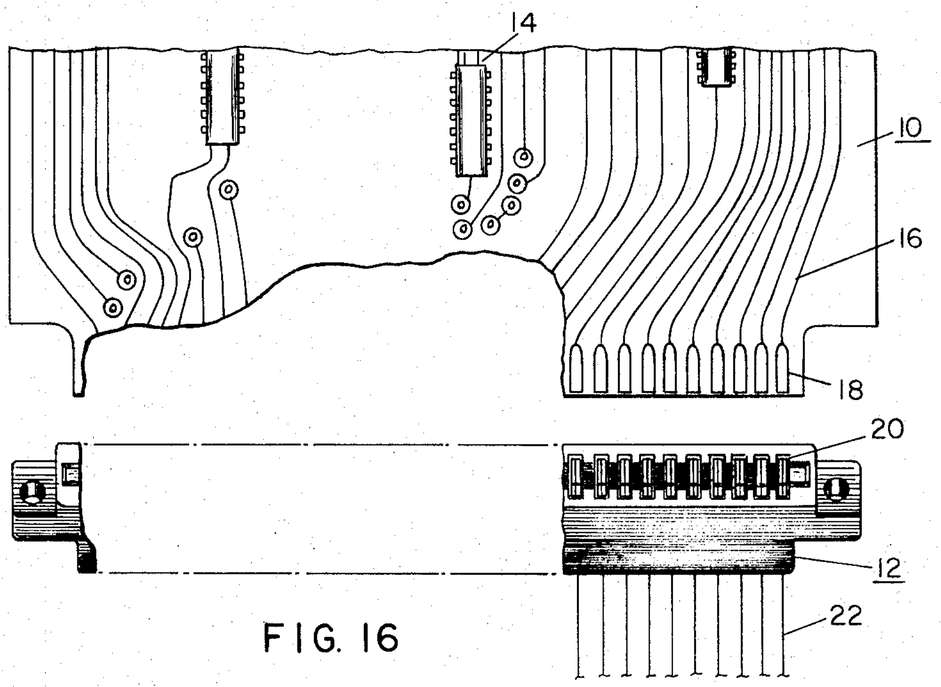
Figure 17:
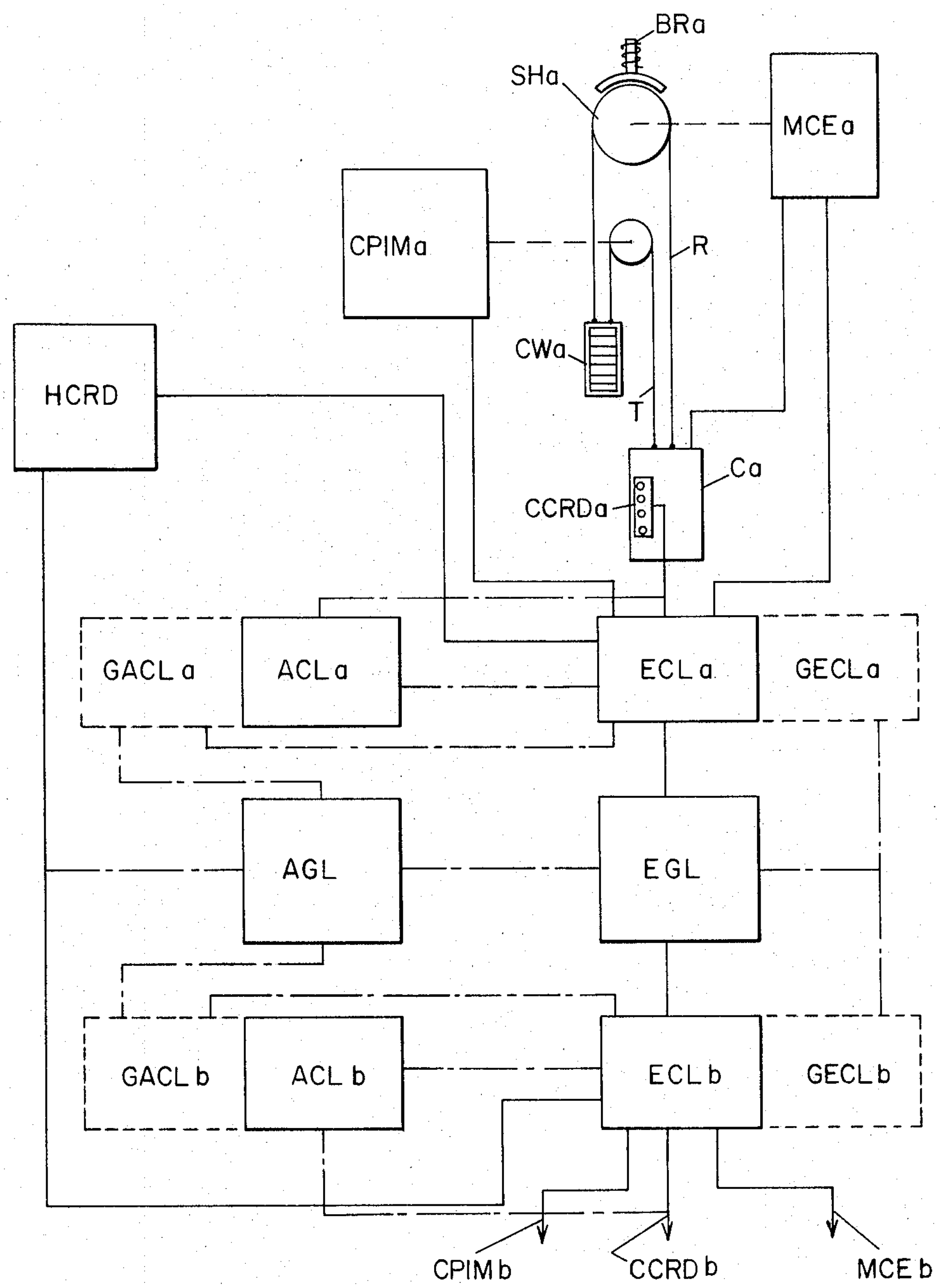

FIGS. 3B to 3H comprise a table of symbols used throughout the drawing as well as schematic diagrams of the circuits represented by these symbols;

FIGS. 4A and 4B are schematic diagrams of timing circuits used in FIG. 4;

FIGS. 5 is a schematic diagram of solid state switching logic circuits mounted on another of the circuit boards employed for performing various switching functions for a single associated elevator car;

FIG. 6 is a schematic diagram of solid state switching logic circuits mounted on yet another of the circuit boards employed for performing various switching functions for a single associated elevator car;

FIGS. 7A, 7B and 7C are representative diagrams of various switching circuits for enabling a single associated elevator car to perform various optional operations;

FIGS. 8 and 9 are schematic diagrams of solid state switching logic circuits mounted on two circuit boards employed for performing various switching functions for a single associated elevator car to enable it to operate in a supervised group;

FIGS. 10 and 11 are schematic diagrams of solid state switching logic circuits mounted on two circuit boards employed for performing various switching functions for a plurality of elevators to enable them to operate as a supervised group;

FIG. 10A is a schematic diagram of a timing circuit used in the switching logic circuits of FIG. 10;

FIG. 11A is a schematic diagram of a buffer circuit used in the switching logic circuitry of FIG. 11;

FIGS. 12A and 12B are schematic diagrams of interface circuits for hall call registering devices of the electronic touch button type;

FIG. 12C is a schematic diagram of interface circuits for hall call registering devices of the mechanical push button type;

FIGS. 13A and 13B are schematic diagrams of interface circuits for car position indicating means and car call registering devices of the electronic touch button type;

FIGS. 13C and 13D are schematic diagrams of interface circuits for car position indicating means and car call registering devices of the mechanical push button type;

FIG. 14 is a schematic diagram of solid state switching logic circuits mounted on another of the circuit boards employed for performing various switching functions for a group of supervised elevator cars;

FIG. 14A is the schematic diagram of an averaging circuit used with the switching logic circuits of FIG. 14;

FIG. 14B is the schematic diagram of a summation circuit used in the switching logic circuits of FIG. 14;

FIG. 15 is a schematic diagram of solid state switching logic circuits mounted on yet another of the circuit boards employed for performing switching functions for a group of supervised elevator cars;

FIG. 16 is a partial representation of a typical printed circuit board used in the present invention together with a plug-in type receptacle for receiving the board;

FIG. 17 is a block diagram of part of an elevator control system disclosed herein.

In each of the Figures of the drawing in which logic circuits mounted on circuit boards are illustrated, input terminals appear on the left-hand side of the drawing and output terminals on the right. Each of these Figures is a schematic representation in that the paths of the conductors on each board for simplicity sake are not represented as they would actually appear. Anyone skilled in the art, however, would be capable of providing suitable conductor paths for these boards. Each input and output circuit terminal on a board is represented by the junction of a conductor path designated by particular reference characters with the vertical lines appearing on the right and left-hand side of the Figure. These terminals are connected by wiring means (not shown) in the form of flexible wires which unless otherwise indicated join correspondingly designated terminals on various ones of the Figures. Each conductor path designated by reference characters and terminated intermediate the right and left-hand vertical lines of a Figure connects one electrical component on its associated board with another on the same board or with a circuit terminal on the same board.

The invention is disclosed in an elevator system having a single car operating as a simplex, selective collective elevator and also in a system having a plurality of cars operating as a supervised group in which the cars operate under a well known arrangement in zones of landings and each primarily responds to calls in a particular zone according to its location with respect to the zone and the locations of the other cars in the group.

The following tables identify the locations in the Figures of the drawing of the various input and output circuits to and from the equipment shown in the drawing. This includes not only circuits to and from components on different circuit board and circuits internal to various circuit boards but circuits to and from other equipment as well.

Equipment Individual to a Car Operating as a Single Elevator

| Reference Characters For Circuits | Input On Figure | Output On Figure |
|---|---|---|
| AD | 3 and 17 | 3 |
| ADV | 2 | 17 |
| $\overline{ATT}$ | 7A, 7B and 7C | 17 |
| AU | 3 and 17 | 3 |
| C1, C2, etc. | 13A and 13C | 17 |
| CC1, CC2, etc. | 1 | 13A and 13C |
| CCR | 1 | 3 |
| $\overline{CP1}$, $\overline{CP2}$, etc. | 1 | 13A and 13C |
| D2, D3, etc. | 12A and 12C | 17 |
| DCB | 2 and 7A | 17 |
| $\overline{DFC}$ | 2, 3, 6 and 7A | 17 |
| DFO | 2 and 5 | 17 |
| DGO | 6 | 3 |
| $\overline{DGO}$ | 3 | 3 |
| DH1 | 1 | 1 |
| DH2, DH3, etc. | 1 | 12A and 12C |
| DLC | 4 | 4 |
| $\overline{DLC}$ | 2 and 17 | 4 |
| DHR | 1 | 3 |
| DO | 4, 7B and 17 | 2 |
| $\overline{DOB}$ | 2 | 17 |
| DP | 4 | 4 |
| $\overline{DP}$ | 9 | 4 |
| DT | 3 and 5 | 2 |
| $\overline{DT}$ | 2 and 3 | 2 and 3 |
| DT and RDT | 3 | 3 |
| FD | 3 | 3 |
| $\overline{FLC}$ | 17 | 6 |
| FLW | 6 | 17 |
| GO | 2 and 17 | 3 |
| $\overline{HC}$ | Not used | 3 |
| HD | 3 | 3 |
| $\overline{HD}$ | 4 and 3 | 3 |
| HL | 3 | 3 |
| $\overline{HL}$ | 17 | 3 |
| HS | 2 | 3 |
| IND | 2 | 17 |
| $\overline{IND}$ | 3 and 4 | 2 |
| $\overline{LCI}$ | 3 | 1 |
| $\overline{LC5}$ | Not shown | 1 |
| LD | 3 | 3 |
| $\overline{LD}$ | 3 and 4 | 3 |
| $\overline{MDT}$ | 2 | 5 |
| $\overline{NSB}$ | 7C | 17 |
| P1, P2, etc. | 13A and 13C | 17 |
| PH | 1 | 2 |
| $\overline{POT}$ | 2 | 17 |
| $\overline{PRR}$ | 3 and 4 | 2 |
| PTS | 2 and 3 | 3 |
| QDT | 2 | 5 |
| $\overline{RDT}$ | 3 | 2 |
| RUN | 2, 3, 4, 5 and 6 | 17 |
| $\overline{RVD}$ | 2 | 17 |
| THS | 3 | 3 |
| U2, etc. | 12A and 12C | 17 |
| UHR | 1 | 3 |
| UH1, UH2, etc. | 1 | 12A and 12C |
| VAD | 3 | Not shown |
| VAU | 3 | 9 |
| VCC1, VCC2, etc. | 13A and 13C | Not shown |
| VCL | 3 | 1 |
| VDHS | 3 | 1 |
| $V\overline{DLC}$ | 4 | 4 |
| VDO | 2 | 7A |
| VDT | 2 | 4 and 6 |
| VGO | 3 | 4 |
| $V\overline{GO}$ | 3 | 7B |
| VHC | 3 | 1 |
| VHD | 3 | 9 |
| $V\overline{HL}$ | 3 | 4 and 6 |
| $V\overline{HS}$ | 3 | 6 and 7C |
| VLD | 3 | 9 |
| $V\overline{PH}$ | 2 | 6 and 7C |
| VPTS | 3 | 1 |
| $V\overline{PTS}$ | 3 | 6 |
| VUHS | 3 | 1 |

Equipment Individual to a Car Operating in a Supervised Group and Equipment Common to All Elevators in a Supervised Group

| Reference Characters For Circuits | Input On Figure | Output On Figure |
|---|---|---|
| $\overline{ASG}$ | 8 | 10 |
| $\overline{ASG}$*a–d* | 10 | 10 |
| $\overline{ASG}$*e–f* | 10 | 10 |
| CAV | 8 | 9 |
| $\overline{CAZ}$ | 9 | 9 |
| CIG | 8 | 9 |
| $\overline{CL}$ | 8 | 9 |
| $\overline{CLD}$ | 3 | 9 |
| $\overline{CP1}$ | 9 | 13A and 13C |
| $\overline{CZ1}$, $\overline{CZ2}$ and $\overline{CZ3}$ | Not used | 8 |
| DGZ1 | 11 | 12A and 12B–GZD and GZU circuits for hall calls in first zone. |
| DGZ2 | 11 | 12A and 12B–GZD and GZU circuits for hall calls in second zone. |
| DGZ3 | 11 | 12A and 12B–GZD and GZU circuits for hall calls in third zone. |

| | | |
|---|---|---|
| $\overline{\text{DLC}}$ | 9 | 4 |
| $\overline{\text{DP}}$ | 9 | 4 |
| $\overline{\text{FLC}}$ | 9 | 6 |
| GWC | 9, 11 and 17 | 10 |
| $\overline{\text{GWC}}$ | 11 | 11 |
| $\overline{\text{GZA1}}$ | 8 | 11 |
| $\overline{\text{GZA2}}$ | 8 | 11 |
| $\overline{\text{GZA3}}$ | 8 | 11 |
| GZD2, etc. | 11–DGZ circuit for associated zone. | 12A and 12C |
| $\overline{\text{GZD1}}$, $\overline{\text{GZD2}}$ and $\overline{\text{GZD3}}$ | 8 | 11 |
| $\overline{\text{GZH1}}$, $\overline{\text{GZH2}}$ and $\overline{\text{GZH3}}$ | Not used | 11 |
| $\overline{\text{GZL1}}$ | Not used | 11 |
| $\overline{\text{GZL2}}$, $\overline{\text{GZL3}}$ and $\overline{\text{GZL4}}$ | 8 | 11 |
| $\overline{\text{GZO1}}$, $\overline{\text{GZO2}}$ and $\overline{\text{GZO3}}$ | 8 | 11 |
| $\overline{\text{GZT2}}$ and $\overline{\text{GZT3}}$ | 15 | 14 |
| GZU1, etc. | 11–DGZ circuit for associated zone. | 12A and 12C |
| $\overline{\text{IND}}$ | 9 | 2 |
| LCZ1 | Not shown | 8 |
| LCZ3 | 8 | 8 |
| LCZ4 | 8 | Not shown |
| $\overline{\text{LD}}$ | 9 | 3 |
| $\overline{\text{LZD1}}$ | 9 | 8 |
| $\overline{\text{LZD3}}$ | 8 | 8 |
| LZD4 | 8 | Not shown |
| PH | 8 | 2 |
| PZHO | 8 | 8 |
| PZH1, PZH2 and PZH3 | 1 | 8 |
| QZD2, etc. | 14–QZH circuit for associated zone. | 12A and 12C |
| QZH2 | 14 | 12A and 12C–QZD and QZU circuits for hall calls in second zone. |
| QZH3 | 14 | 12A and 12C–QZD and QZU circuits for hall calls in third zone. |
| QZU, etc. | 14–QZH circuit for associated zone. | 12A and 12C |
| VAU | 9 | 3 |
| V$\overline{\text{CAV}}$ | 9 | Not used |
| VCAZ | 9 | 8 and 15 |
| V$\overline{\text{CIG}}$ | 9 | Not used |
| VCLG | 9 | 8 |
| VCLG1, VCLG2 and VCLG3 | 8 | Not used |
| VDH2, VDH3, etc. | 12A and 12C | Not used |
| VGDH | 10 | 11 |
| V$\overline{\text{GWC}}$ | 10 | Not used |
| VGZA1, VGZA2 and VGZA3 | 11 | 8 |
| VGZD1, VGZD2 and VGZD3 | 11 | Not used |
| VGZL2, VGZL3 and VGZL4 | 11 | Not used |
| VGZO1, VGZO2 and VGZO3 | 11 | 8 |
| V$\overline{\text{GZO1}}$ | 11 | Not used |
| V$\overline{\text{GZO2}}$ and V$\overline{\text{GZO3}}$ | 11 | 14 |
| VHD | 9 | 3 |
| VHZD | 9 | 8 |
| VLD | 9 | 3 |
| VPH | 9 | 2 |
| VRQA | 10 | 8 |
| VTH | Not used | 14 |
| VUZR | 9 | Not used |
| ZP1 | 8 | 8 |
| $\overline{\text{ZP1}}$ | 8 | 8 |
| ZP2 | 8 and 15 | 8 |
| $\overline{\text{ZP2}}$ | 8 | 8 |
| ZP3 | 8 and 15 | 8 |
| $\overline{\text{ZP3}}$ | 8 | 8 |

The systems as disclosed are much more simplified than they would be in commercial installations in the sense that the equipment for controlling the movement of the cars, the door means equipment for controlling the opening and closing of car doors and various control equipment mounted in and on the car is not shown in detail. All of this equipment will hereinafter be referred to as associated control equipment which also includes the call registering equipment and the car position indicating equipment. Those skilled in the art will understand from the disclosure how this associated control equipment is to be connected to the solid state equipment that is shown herein in detail. It is also to be understood that where any of the associated control equipment operates at potentials higher than the potential at which the solid state equipment operates, signals are transmitted between the two through suitable interface circuits. This is done for other associated control equipment in a manner similar to the herein explained manner in which it is done for the signals transmitted between the solid state equipment and the call registering and car position indicating equipment. In the constructed embodiment disclosed herein all signals transmitted between the associated control equipment and the solid state equipment are, in fact, transmitted through such interface circuits but the circuits have not been shown for the sake of simplicity.

Before proceeding with a description of the invention it will be helpful to refer to the table of symbols which are used throughout the drawing. This table appears in FIGS. 3B to 3H. Each of the gate circuits represented by these symbols operates to produce a binary 0, or ground, signal whenever a binary 1 signal, i.e., a signal of the potential applied along line E1, is applied to all its inputs and a binary 1 signal whenever a binary 0 signal is applied to anyone of its inputs.

Figure 3:
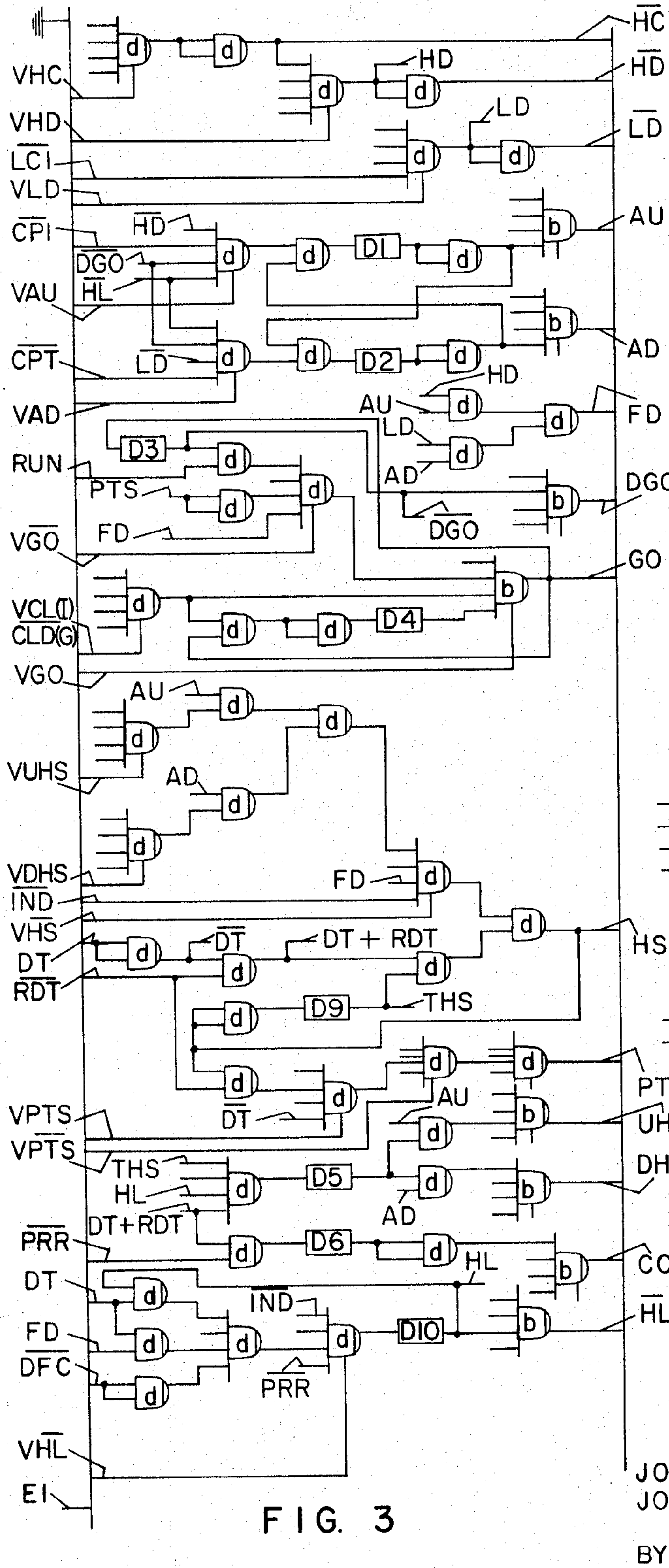
Figure 3A:
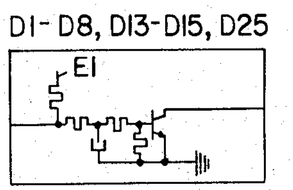
FIG. 3A is a schematic diagram of a time delay circuit used in the switching logic circuitry of FIG. 3 and other Figures of the drawing.
Figure 3B:
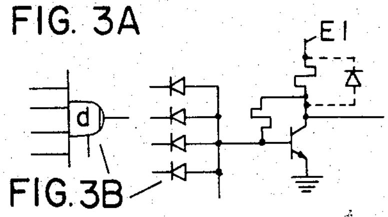

Whenever the symbol in FIG. 3B appears with the lower case letter *d* inside it, it represents a diode transistor logic gate with five inputs one of which is an expander node. The four lines on the left of this symbol represent four of these inputs each of which is connected to an internal diode. The line at the bottom represents the expander node which can accommodate a plurality of additional connections to the gate. Each of these additional connections to each gate can be made through an individual external diode to isolate one from the other. The schematic diagram of FIG. 3B as well as those of FIGS. 3C through 3H, it should be understood, are only representative of typical circuits which provide operations equivalent to that provided by the types of gate circuits they are associated with. As a result, although each of the gate circuits represented in these Figures are commercially purchasable, the schematic diagrams do not necessarily represent any particular commercially purchasable gate.

Figure 3C:
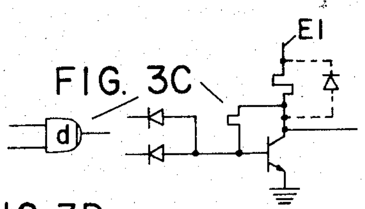

Whenever the symbol of FIG. 3C appears with the lower case letter *d* inside it, it represents a diode transistor logic gate with two inputs but otherwise internally similar to the gate of FIG. 3B. These two inputs are represented by the lines on the left of the symbol and each one is connected to an internal diode.

Figure 3D:
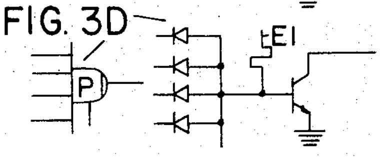

The symbol of FIG. 3D also represents a diode transistor logic gate but this is of the power amplifier class which is capable of conducting more current than either of the above two gates. This also includes five inputs one of which is an expander node. The lines on the left of the symbol in this Figure also represent four of these inputs, each of which is connected to an internal diode. The line at the bottom of the symbol represents the expander node which can accommodate a plurality of additional connections to the gate. Each additional connection to each of these gates also can be made through an individual external diode. The output transistor of this device in contrast to that of FIG. 3B does not contain an internal resistor in its collector circuit and each place where one of these devices is used it is connected to a conductor path which is connected to an external resistor.

Figure 3E:
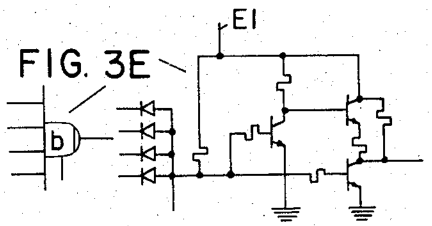

The symbol of FIG. 3E represents a diode transistor logic gate of the buffer amplifier class which is also capable of conducting more current than either of the gates of FIGS. 3B or 3C. It also includes five inputs one of which is an expander node. These are represented in the same manner as those of the gates of FIGS. 3C and 3E. Each of the inputs other than the expander node is made through an internal diode while additional connections to its expander node can be made through external diodes.

Figure 3F:
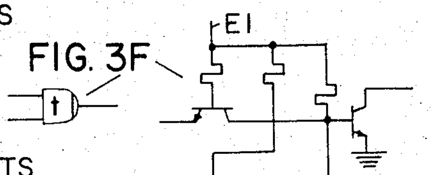

The symbol of FIG. 3F represents a transistor transistor logic gate which includes two standard inputs, each of which is connected to an internal transistor. Like the power amplifier of FIG. 3E the output transistor of this device also does not contain an internal resistor in its collector circuit and each place where one of these devices is used it is similarly connected to an external resistor.

Figure 3G:
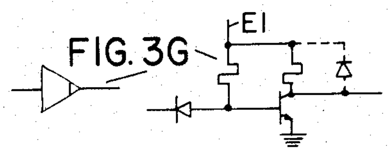

The symbol of FIG. 3G represents an inverting gate of the diode transistor class whose one input, represented by the line on its left, is connected to an internal diode.

Figure 3H:
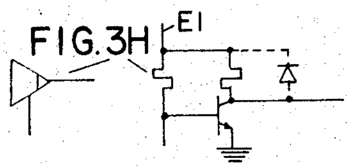

The symbol of FIG. 3H also is an inverter of the diode transistor class. Its input is not connected to an internal diode and, therefore, can be connected to circuits which contain external diodes.

Referring now to FIG. 1, position indicating, call stopping and removal and higher and lower call solid state circuits for four landings are illustrated. These circuits are all provided for and associated with one car and are mounted on a printed circuit board comprising part of what is referred to herein as the controlling switching circuitry or the controlling switching logic circuits or the basic control circuitry or by similar such language. This means that a board or boards of this nature are provided for every car which is controlled by a system of the types disclosed. Circuits of the foregoing variety for only four landings are illustrated as being mounted on the one printed circuit board shown in FIG. 1 for convenience sake. Actually in the constructed embodiment the size of the components selected for these circuits in relation to the size of the printed circuit boards used permits circuits of this nature for up to five landings to be mounted on one of these boards. Corresponding circuits are provided for each additional landing in a system for each car of the system on similar boards, each of which can contain the circuits for one or more landings up to five depending upon how many landings there are in the system. All the boards of this nature for one car are connected to one another by wiring the circuit terminal connected to the conductor path designated $\overline{LC1}$ of each board associated with higher landings to the circuit terminal connected to the conductor path with the highest $\overline{LC}$ designation, in this case $\overline{LC5}$, of the board associated with the immediately preceding lower landings.

Each conductor path $\overline{CP1}$, etc. is associated with a respective landing and is connected through its associated circuit terminal to a suitable interface circuit (FIG. 13A or 13C) to receive a binary 0 signal whenever its associated car position indicating equipment CPIM (FIG. 17) indicates the location of its associated car at its associated landing. Otherwise the signals along these paths are in the binary 1 condition. Each of these paths is also connected to an associated diode transistor logic gate, hereinafter referred to as a *dtl* gate, which inverts the signals it receives for use elsewhere on this circuit board. In addition, each conductor path $\overline{CP1}$, etc. is also connected through a diode to an associated circuit terminal by way of conductor paths VCL1, etc. Each circuit terminal connected to a conductor path VCL1, etc. is connected to the circuit terminal of the conductor path designated VCL(I) (FIG. 3) for a simplex selective collective elevator. (The letter I in parenthesis in the foregoing reference characters indicates that these characters are associated with the specific conductor path only for simplex elevators.) When associated with an elevator car operating in a supervised group each of the circuit terminals of conductor paths VCL1, etc. associated with the landings in each zone of the disclosed group system is connected to the circuit terminal of conductor paths VCLG1, etc. (FIG. 8) which is associated with the respective zone. The circuits of FIG. 8 to which conductor paths VCLG1, etc. are connected each terminate on a conductor path designated VCLG. The circuit terminal associated with this conductor path is in turn connected to the circuit terminal associated with the identically designated conductor path in FIG. 9. The circuits of FIG. 9 connected to this latter conductor path terminate on a conductor path designated $\overline{CLD}$. The circuit terminal associated with this conductor path is connected to the same circuit terminal which is associated with the conductor path which is designated VCL(I) (FIG. 3) when used with a simplex elevator. To avoid confusion when this conductor path is employed with a car that is operating in a supervised group it is not designated VCL(I) but rather is designated $\overline{CLD}$ (G). (The upper case letter G in parenthesis signifies that the conductor path associated therewith is so designated for a car operating in a supervised group.)

It is to be observed that each of the terminals associated with conductor paths VCL1, etc., whether used in connection with a simplex elevator or one that is operating in a group, is connected to a circuit terminal which is associated with a conductor path that is connected to the expander node of a dtl gate. As a result practically any number of conductor paths VCL1, etc. can be connected to anyone of these circuit terminals. This means that as far as these circuits of FIGS. 1, 3, 8 and 9 are concerned the apparatus comprising the circuit boards upon which these circuits are mounted is universal in the sense that for all practical purposes it is capable of being used for a car in a simplex selective collective system serving any number of landings or for a car in a group supervisory system of the type hereinafter disclosed with any number of zones, each having any number of landings. The qualification for all practical purposes is added to the foregoing statements because, as anyone skilled in the art will understand, the number of these diode circuits that can be connected together is, in fact, limited but only in so far as to insure that the sum of the leakage currents of these diodes do not exceed the current rating of the output circuit of any of the preceding and the input circuit of any of the succeeding components connected to these circuits. In no way is this considered a restriction on the use of the disclosed invention. It is simply a physical limitation of the tested embodiment resulting from a practical design choice. Similar such limitations have also been established because of the choice of other components employed in other circuits of the tested embodiment. These will be explained hereinafter where appropriate and particularly involve a limitation on the maximum number of landings that can be served by either a single or plural car system constructed in accordance with the disclosed tested embodiment and a limitation on the number of landings that can be segregated into any one zone of a plural car group supervisory system constructed in accordance with the disclosed tested embodiment. None of these limitations, however, are the result of any shortcomings inherent in the invention disclosed and any one could be changed by the simple expediency of changing the components of the tested embodiment without departing from the scope and spirit of the invention. Thus, notwithstanding these limitations, the apparatus of the present invention is for all practical purposes considered to be of a universal character.

Besides the foregoing the forementioned circuits of FIGS. 1, 3, 8 and 9 are practical because the diode in each conductor path VCL1, etc. isolates the other components of the associated conductor path from the other components of every other conductor path which might be connected to the same circuit terminal to which the first-mentioned conductor path is connected. Thus, when any one of the conductor paths VCL1, etc. is transferred to the binary 0 condition none of the other components to which the other conductor paths are connected are affected thereby. As a result the binary 0 condition on a conductor path indicating the location of the car at the associated landing is prevented from interfering with the logic of the system and falsely indicating the position of the car at any other landing.

A separate call stopping and removal circuit is provided for each up hall call, each down hall call and each car call in a system. Thus, the number of boards of the FIG. 1 variety provided in any system depends upon the number of car and hall call registration device provided in the installation with which the system is associated as well as upon the number of landings in the installation. On each board of the type shown in FIG. 1 the call stopping and removal circuits are connected to conductor paths UHR, DHR and CCR. In this way they are segregated into three groups — one for up hall calls connected to path UHR, one for down hall calls connected to path DHR and one for car calls connected to path CCR. The circuit terminals of conductor paths UHR, DHR and CCR of FIG. 1 are connected to the terminals of identically designated conductor paths of FIG. 3. Each of these latter paths is connected to the output of a buffer amplifier which in the tested embodiment has a fan-out of (i.e. can sink the current produced by) 25 of the commercial *dt*1 gates used in the embodiment. Since one of these buffers is connected to a separate dt1 gate for each up hall call or each down hall call or each car call which can be registered in a system, the fan out capacity of these buffers establishes the limitation on the maximum number of landings that can be served by a typical system constructed in accordance with the tested embodiment. Thus in such a system in which a separate car call registering device is provided for each car for each landing served by the system, the maximum number of landings that can be served by the system is 25.

The circuits of each of the three groups of call stopping and removal circuits, the up hall call, the down hall call and the car call, on each board of the FIG. 1 variety are connected in what is commonly referred to as a "wired OR" configuration. The output of each "wired OR" on each board is connected through an individual diode to a respective conductor path VUHS, VDHS and VPTS. The circuit terminals associated with these conductor paths on each board are connected to circuit terminals associated with similarly designated conductor paths connected to the expander nodes of *dt*1 gates shown on FIG. 3.

Each up and down hall call stopping and removal circuit includes a power amplifier, one of the inputs of which is connected to conductor path UHR or DHR, respectively. Another input of each of these power amplifiers is connected to an associated position signal transmitted along conductor paths CP1, etc. The output of each of these power amplifiers is connected to an associated hall call conductor path UH1, etc. or DH1, etc. It is also connected to one of the inputs of a two input dt1 gate, the other input of which is connected to an associated car position conductor path CP1, etc. When the associated position signal along a conductor path CP1, etc. and the call removal signal along conductor path UHR or DHR both transfer to the binary 1 condition the associated power amplifier sinks all current to which its output is connected. This removes the effect of the associated call from the system by transferring and clamping the signal along the associated conductor path UH1, etc. or DH1, etc. to the binary 0 condition. Power amplifiers are used in these circuits because in a group system conductor paths UH1, etc. and DH1, etc. are connected to the higher and lower call circuits for each car in the system as well as to the interface circuits of the hall call registering devices (FIGS. 12A, 12B and 12C).

Power amplifiers are also employed in these circuits for another reason. As mentioned earlier in connection with FIG. 3D, a power amplifier of the dt1 class does not have an internal resistor in the collector circuit of its transistor. In those dt1 gates which are made with an internal collector resistor, unidirectional conduction paths inherently exists in parallel with the resistor (See FIG. 3B). These paths form what might be called a diode circuit which will conduct from the collector to the power supply to which the resistor is connected if the collector is at a higher potential than the power supply. Thus, if, owing to a failure, the collector resistor power supply for such a dt1 gate should be shorted to ground, which in the disclosed embodiment corresponds to the binary 0 condition, the collector or output of the gate transfers to the binary 0 condition. If used in the hall call stopping and removal circuits of the disclosed embodiment such gates upon the shorting to ground of their power supply would cause paths UH1, etc. to be maintained in the binary 0 condition. This would not only prevent their associated car from stopping for hall calls but since the hall call stopping and removal circuits of all cars are connected to paths UH1, etc. it would also prevent all other cars from stopping in response to hall calls and in effect prevent the registration of hall calls.

The use of power amplifiers in these circuits eliminate the foregoing problem since they have neither internal collector resistors nor unidirectional conduction paths in their collector circuits. Instead an external resistor is connected to the collector, or output, circuit of each of these dtl gates. These resistors are mounted on the associated hall call interface circuit boards shown in FIGS. 12A, 12B and 12C. Thus, only one such resistor is employed for each hall call for all cars in a group system rather than one resistor for each call for each car. Each of these resistors is connected to a power supply which in a group system is independent of any of the individual car power supplies and common to the group. This prevents the failure of any one car's supply from affecting the group. But moreover the lack of a low impedance path in the collector circuits of these gates enables their outputs to appear to be in the binary 1 condition notwithstanding a failure of the power supply of the hall call interface circuits.

Although it is understood that a down hall call cannot be registered at the lowest landing in an elevator system since the elevator car cannot travel below its lowest landing, a conductor path marked DH1 is provided on this circuit board for such a down hall call. This is done for standardization purposes to make each of this type of circuit board that is manufactured universal in the sense that it is capable of being used for any group of landings in a system. In order to use one of these boards for those landings including the lowest in a building the circuit terminal associated with the conductor path designated DH1 of that particular board is connected to ground which as mentioned corresponds to the binary 0 condition in the disclosed system. Likewise, since these boards are to be universal a UH conductor path will be provided on the circuit board associated with the top landing in the building and this also is connected to ground. As a result, neither of these conductor paths has any affect on the operation of the system.

Car call stopping and removal circuits connected to conductor path CCR are similar to the hall call stopping and removal circuits just described but do not employ power amplifiers for cancelling the effect of the calls in the system since these circuits are not required to sink the same amount of current as the hall call stopping and removal circuits are. And since there is no interconnection between the car call circuits of the various cars of a group there is no reason to provide protection of the same nature in these circuits as in the hall call circuits.

The higher and lower call circuits shown in FIG. 1 include one set of identical components for each landing. Each set is connected to the up and down hall and car call conductor paths of its associated landing UH1, etc., DH1, etc. and CC1, etc. In addition, each is also connected to its associated car position conductor paths CP1, etc. and $\overline{CP1}$, etc. The outputs of the higher and lower call circuits of each car are conductor path $\overline{LC1}$ of the board for the lowest landings served by the car and conductor path VHC of each of this type of board associated with the car. For each car conductor path $\overline{LC1}$ of the board associated with the lowest landings in a system is connected to the circuit terminal associated with the similarly designated conductor path shown in FIG. 3 and conductor path VHC of each of this type of board which is provided for a particular car is similarly connected to the corresponding conductor path shown in FIG. 3. As mentioned previously, conductor path $\overline{LC1}$ of every other board of this type associated with one car is connected through their respective circuit terminals to the conductor path with the highest $\overline{LC}$ designation of the board associated with the preceding landings. In this case the board for the next higher four landings, landings 5 to 8, for example, would have its conductor path $\overline{LC1}$ connected through the associated circuit terminals to conductor path $\overline{LC5}$ of the board for the first to fourth landings as shown in FIG. 1.

Figure 2:
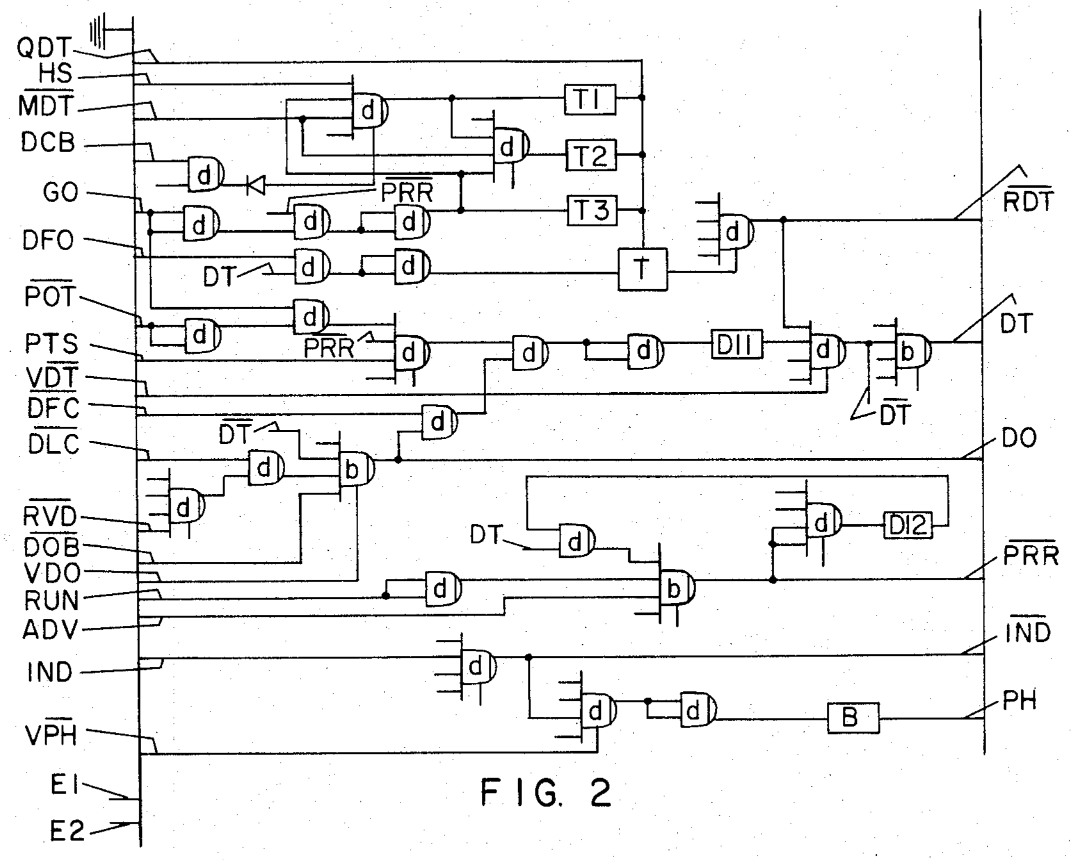
FIGS. 2, 3 and 4 are schematic diagrams of solid state switching logic circuits mounted on three other circuit boards employed for performing various other switching functions for a single associated elevator car.

Each set of higher and lower call circuits for a simplex selective collective elevator also includes a conductor path designated PH(I) connected through associated circuit terminals to conductor path PH of FIG. 2. For a group car each set also includes the same conductor path but in a group system to avoid confusion this is not designated PH(I) but PZH(G). For group cars this path is connected through associated circuit terminals to conductor paths PZH1, etc. (FIG. 8) of associated zones. In a group system conductor path PH of FIG. 2 is connected through suitable circuit terminals by discrete wires (not shown) to the circuits of FIG. 8 for generating signals along conductor paths PZH1, etc. In this manner the higher and lower call circuits are capable of use in conjunction with a car which is operating as a simplex selective collective elevator or one that is operating as a member of a supervised group.

It seems appropriate at this point to mention that the conductor paths PZH1, PZH2 and PZH3 of FIG. 8 associated with each zone are each connected to the output of a buffer amplifier which in the tested embodiment has a fan-out of 25 of the commercial dtl gates used in the embodiment. Since in a group system each of these buffers is connected to two dtl gates in the higher and lower call circuits for each landing of the zone with which it is associated, the fan-out capacity of these buffers establishes the limitation on the maximum number of landings that can be segregated together in any one zone in a typical group supervisory system constructed in accordance with the tested embodiment. Thus, in such a system the maximum number of landings which can be segregated into any one zone is 12.

The operation of each of the sets of higher and lower call circuits is identical. Upon the production of a binary 1 signal along the conductor path designated PH(I) or PZH(G) corresponding to the landing at which a hall call is registered or upon the registration of a car call for that landing the set of circuits for that landing are enabled. A binary 1 signal it will be understood is produced on the car position conductor paths CP1, etc. corresponding to the landing at which the car is located. If the car is at a landing at which an up hall call is registered the two binary 1 signals corresponding to the call along path UH1, etc. and to the position of the car along path CP1, etc. cooperate to produce a binary 0 signal along conductor path VHC. If the car is at a landing at which a down hall call is registered the binary 1 signal corresponding to the call along path DH2, etc. and the binary 1 signals corresponding to the absence of the location of the car at the landings below that at which the call is registered along paths $\overline{CP1}$, etc. cooperate to produce a binary 0 signal along conductor path $\overline{LC1}$. If the car is below the landing for which an up or down hall call or car call is registered the signal corresponding to the call along paths UH1, etc., DH2, etc. or CC1, etc. cooperates with the binary 1 signal along conductor path $\overline{CP1}$, etc. of the landing for which the call is registered and/or the binary 1 signals along conductor paths $\overline{CP1}$, etc. for the landings below that landing and above the landing at which the car is located until finally cooperation is had with the binary 1 signal along the conductor path CP1, etc. for the landing at which the car is located to produce a binary 0 signal along conductor path VHC. If the car is above the landing for which an up or down hall call or car call is registered the signal corresponding to the registered call cooperates with the binary 1 signal along the conductor path $\overline{CP1}$, etc. for the landing at which the call is registered and/or the binary 1 signals along conductor paths $\overline{CP1}$, etc. for the landings below that landing until finally a binary 0 signal is produced along conductor path $\overline{LC1}$.

The connections for conductor paths E1 and ground (not shown other than at the corresponding circuit terminals) are provided to the board from the power supply of the car associated with that board for connection to components requiring the potentials applied along these paths.

The circuits of FIG. 2 are mounted on another of the circuit boards associated with an individual elevator car's basic control circuitry. These circuits among other things provide signals to the car's associated control equipment which enable that equipment to open and close the doors, and to maintain them open for a predetermined period. Signals are also generated which enable both the cancellation of registered calls and the response to registered hall calls by the higher and lower call circuits associated with the car.

The signal for enabling response to registered hall calls is generated along conductor path PH by a control switch designated the hall call responsive switch comprising the dt1 gate connected to path V$\overline{PH}$ whenever a binary 0 signal is applied along conductor path IND. The circuit terminal associated with conductor path IND is connected through a suitable interface circuit (not shown) to the associated control equipment (FIG. 17) which applies a binary 0 signal along path IND whenever its associated car is to operate in response to hall calls as a simplex selective collective elevator or as a member of a group, whichever it may be. In these circumstances, the interface circuit to which conductor path IND is connected receives a signal from a manually operated switch normally located in the elevator car which causes a binary 0 signal to appear along path IND. This switch is operable to cause the signal along path IND to transfer to the binary 1 condition when it is desired to operate the car in other than the appropriate one of the forementioned manners. It is to be understood that it is optional whether or not an elevator car would contain such a switch. For those cars for which such a switch is not provided the circuit terminal associated with and connected to conductor path IND is in effect permanently connected to ground so that a binary 0 is constantly being applied along that path. This may be accomplished either by connecting the circuit terminal of path IND directly to ground or by connecting its interface circuit so that this result is obtained.

Figure 2A:
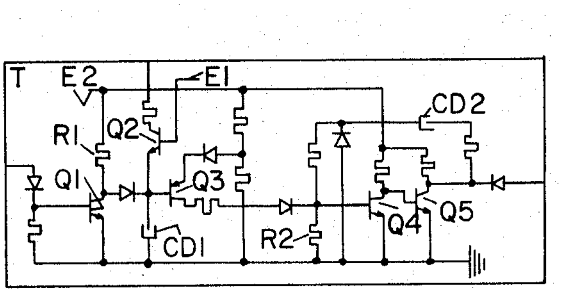
FIGS. 2A and 2B are schematic diagrams of timing circuits used in the switching logic circuits of FIG. 2.
Figure 2B:
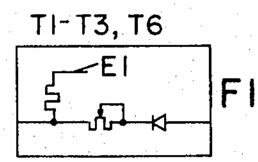
Figure 2C:
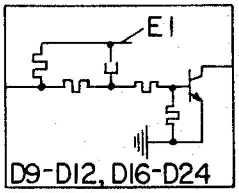
FIG. 2C is a schematic diagram of a time delay circuit used in the switching logic circuitry of FIG. 2 and other Figures of the drawing.
Figure 2D:
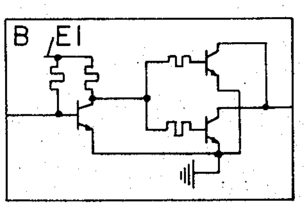
FIG. 2D is a schematic diagram of a buffer circuit used in the switching logic circuits of FIG. 2.

The circuitry of the non-inverting buffer amplifier B connected to path PH is shown in FIG. 2D. As is understood, an input signal in the binary 1 condition causes the input transistor of this amplifier to start conducting. This transfers the parallel output transistors to their non-conducting states, thereby producing a binary 1 at the output of the amplifier. Likewise, a binary 0 applied at the input of this amplifier causes a binary 0 to appear at its output. In the constructed embodiment amplifier B has been designed to have a fan-out of one hundred of the commercially available dt1 gates used in the embodiment. Conductor path PH, under the most extreme conditions, i.e. in a single car system, is connected only to the higher and lower call circuits of FIG. 1 and only to two *dt*1 gates for each landing in those circuits. Since, therefore, such a system is limited by the call stopping and removal circuits to a maximum of 25 landings, amplifier B of the constructed embodiment has sufficient capacity for use with any such system and imposes no limitation on the size of the installations in which the systems of this invention may be used.

Conductor path V$\overline{PH}$ is provided and connected to a circuit terminal on each of the circuit boards built to contain the circuits shown in FIG. 2. As will be explained, this path is used in conjunction with circuitry that provides optional operations. The signal along path PH transfers to the binary 0 condition whenever a binary 0 signal is applied to the control switch circuit terminal connected to path V$\overline{PH}$. This transfer occurs notwithstanding the signal along path IND is in the binary 0 condition and would otherwise cause the signal along path PH to be in the binary 1 condition. Even though the control switch terminal of path V$\overline{PH}$ will only be connected to other circuits if particular optional operations are desired the path and its terminal are provided on each and every board of the FIG. 2 variety made for use in solid state elevator control systems of the disclosed type. This provides standardization in the sense that each of these boards possesses a universal usefulness so that any one of them can be used in any one of these solid state systems regardless whether the particular system usefully employs path V$\overline{PH}$ by connecting its control switch terminal to optional, or auxiliary, equipment. As the previous sentence implies if none of the optional operations for which path V$\overline{PH}$ is used are provided in a particular system its terminal is left unconnected. This provides the same operation as is provided if a binary 1 signal is applied along path V$\overline{PH}$.

Output signal conductor path $\overline{PRR}$, as will be explained, conducts a binary 0 signal to prevent the cancellation of registered calls and a binary 1 signal to permit such cancellation. Primarily this is of use with elevator cars which operate at speeds which require selectors with advance floor scanners, commonly referred to as advancer carriages. A binary 0 signal along path $\overline{PRR}$ prevents the cancellation of calls if the advancer carriage has advanced and the car has not yet started to move.

Just prior to its associated car starting in motion the signal along path $\overline{PRR}$ is in a binary 1 condition. At this time the signal along path DT transfers to the binary 0 condition to permit the associated advancer carriage, if one is provided, and car to start. This transfers the signal along the uppermost input to the buffer dtl gate connected to conductor path $\overline{PRR}$ to the binary 1 condition. If an advancer carriage is provided and it starts to advance as it is supposed to, a binary 1 signal also appears along conductor path ADV. This is received by way of an appropriate interface circuit (not shown) from the car's selector advancer carriage which forms part of the associated control equipment shown in FIG. 17. At the same time since the car has not yet started to move the signal along conductor path RUN is in the binary 0 condition. These three signals cooperate to cause the signal along conductor path $\overline{PRR}$ to transfer to the binary 0 condition. As a result, delay unit D12 (circuitry shown in FIG. 2C) produces a binary 0 signal at the expiration of five milliseconds. This output prevents the signal along conductor path DT from further affecting the signal along path $\overline{PRR}$ and consequently this latter signal remains in the binary 0 condition until the signal along path RUN assumes the binary 1 condition. It is to be understood that conductor path RUN receives a binary 0 signal through an appropriate interface circuit (not shown) from the associated control equipment of FIG. 17 whenever its associated car is stopped and a binary 1 signal whenever the car is moving.

If a circuit board of the FIG. 2 variety is used with an elevator car whose rated running speed is slow enough not to require a selector with an advancer carriage, a binary 1 signal or its equivalent is permanently applied along conductor path ADV. This may be accomplished by leaving the circuit terminal associated with the path unconnected or by arranging the associated interface circuit so that it permanently applies a binary 1 signal to the path.

A binary 1 signal is applied along conductor path DO by the control switch, hereinafter referred to as the door open switch, comprising the buffer dtl gate whose output is connected to path DO, to enable the elevator car door or doors to open. The circuit terminal associated with conductor path DO is connected through an interface circuit (not shown) to the door means of the associated control equipment (FIG. 17) and a binary 1 signal transmitted by it energizes switches which open the car door or doors when the car is located in a predetermined zone (commonly known as the door zone) at a landing at which it is stopping. In response to the stopping operation initiated by a hall or car call the signal along path DT transfers to the binary 0 condition. This causes the signal along path DO to transfer to the binary 1 condition. As will be explained, after a predetermined period the signal along path $\overline{DT}$ transfers to the binary 1 condition causing the signal along path DO to transfer to the binary 0 condition. This operates to deenergize the door control switches of the door means which causes the door or doors to close.

Notwithstanding the signal along path $\overline{DT}$ transfers to the binary 1 condition it will not cause the signal along path DO to transfer to the binary 0 condition if the door open button (not shown) located in the elevator car is pressed. The pressing of the door open button causes a binary 0 signal to appear along path $\overline{DOB}$ and this signal maintains the signal along path DO in the binary 1 condition. The circuit terminal of conductor path $\overline{DOB}$ is connected through an appropriate interface circuit (not shown) to the door open button in the elevator car which comprises part of the associated control equipment.

The elevator car doors also won't be permitted to close if a door reversal device of the safety variety (not shown) is operated provided the doors have not been prevented from closing for a predetermined period. Under these circumstances a binary 0 signal is transmitted along path $\overline{RVD}$ to cause the signal along path DO to assume the binary 1 condition provided a binary 1 signal is also transmitted along path $\overline{DLC}$ indicating that the doors have not been prevented from closing for the predetermined period. The circuit terminal of conductor path $\overline{RVD}$ is connected through an appropriate interface circuit (not shown) to the door reversal device of its associated car which also comprises part of the associated control equipment of FIG. 17.

In addition to the foregoing, a conductor path VDO is also connected to the door open switch comprising the buffer *dt*1 gate whose output is connected to path DO. A binary 0 signal transmitted along path VDO causes the production of a binary 1 signal along path DO even though the signals along paths $\overline{DOB}$, $\overline{RVD}$, $\overline{DLC}$ and $\overline{DT}$ are such that the signal along path DO would otherwise be in the binary 0 condition. Path VDO is used in conjunction with optional operations normally provided a car to make it capable of operating under attendant control. Notwithstanding elevator cars are not provided with equipment that enables them to operate under attendant control, path VDO is provided and connected to its control switch circuit terminal on the circuit boards of the FIG. 2 variety employed with those cars also, for standardization purposes.

Conductor path DT transmits a binary 1 signal as a result of the production of a binary 0 signal along path $\overline{DT}$ by the control switch identified as the door time switch comprising the dtl gate whose expander node is connected to conductor path $\overline{VDT}$. The binary 0 signal along path $\overline{DT}$ maintains the elevator car doors open for a predetermined period and prevents them from closing for that period. If the signal along conductor path $\overline{RDT}$ is in the binary 1 condition the signal along path $\overline{DT}$ assumes the binary 0 condition 5 milliseconds after the signal along path GO transfers to the binary 0 condition if at that time the signals along paths $\overline{PRR}$ and PTS are both in the binary 1 condition. The 5 milliseconds delay just mentioned is provided by delay element D11, the circuitry of which is shown in FIG. 2C. A binary 0 signal along path $\overline{DT}$ is maintained as long as the signals along paths $\overline{RDT}$, $\overline{DFC}$ and DO remain in the binary 1 condition. A binary 1 signal is transmitted along path $\overline{DFC}$ as long as the elevator car doors are not in the fully closed position. This signal is transmitted along path $\overline{DFC}$ from an appropriate interface circuit (not shown) connected to the door means (not shown) of the associated control equipment of FIG. 17.

Notwithstanding the doors are fully closed so that the signal along path $\overline{DFC}$ is in the binary 0 condition and the signal along path GO is in the binary 1 condition the signal along path $\overline{DT}$ can nevertheless transfer to the binary 0 condition provided the signals along paths $\overline{RDT}$, $\overline{POT}$, $\overline{PRR}$ and PTS are in the binary 1 condition. The circuit terminal of conductor path $\overline{POT}$ is connected through an appropriate interface circuit (not shown) to the manually operated emergency stop switch located in its associated elevator car. This switch also comprises a part of what is referred to herein as the associated control equipment. A binary 0 signal is transmitted along path $\overline{POT}$ when its associated switch is not operated and a binary 1 when it is operated.

Conductor path $\overline{VDT}$ as will be explained is used in conjunction with certain optional operations. A binary 0 signal conducted along this path causes a binary 1 signal along path $\overline{DT}$ even though the signals along paths DO, $\overline{DFC}$, PTS, $\overline{PRR}$, $\overline{POT}$, GO and $\overline{RDT}$ are such as to otherwise produce a binary 0 signal along path $\overline{DT}$. Path VDT like paths VPH and VDO is provided on each of the circuit boards of the FIG. 2 variety for standardization proposes notwithstanding it might not be used with a particular car and thus its control switch circuit terminal might be left unconnected. In that situation the door time switch comprising the *dt*1 gate to whose expander node path $\overline{VDT}$ is connected operates in the same manner as it does if a binary 1 signal is applied along path $\overline{VDT}$.

As previously explained, the signals along path $\overline{RDT}$ control the signals along path DT. The signals along path $\overline{RDT}$ in turn are controlled by timer T which upon receiving a binary 1 signal transmits a binary 1 signal to the dt1 gate connected to path $\overline{RDT}$ at the end of a predetermined period to cause the signal along path $\overline{RDT}$ to transfer to the binary 0 condition. This period varies according to the circuit or circuits to ground provided through timers T1, T2 or T3 or through conductor path QDT. Timer T receives a binary 1 signal when the signals along conductor paths DFO and DT are both in the binary 1 condition. The circuit terminal of conductor path DFO is connected through an appropriate interface circuit (not shown) to the door means (not shown) of the associated control equipment of FIG. 17 and transmits a binary 1 signal whenever the elevator car doors are fully opened.

The circuitry of timer T is shown in FIG. 2A. Upon the reception of a binary 1 signal at its input, transistor Q1 begins to conduct enabling condenser CD1 to discharge through transistor Q2 and any circuit to ground through path QDT or timers T1, T2 or T3. When after the forementioned predetermined period condenser CD1 discharges to a predetermined value transistor Q3 starts to conduct and the voltage across resistor R2 increases. This causes transistor Q4 to conduct which in turn transfers transistor Q5 to its non-conducting condition and produces a binary 1 signal at the output of the timer.

A binary 0 signal applied to the input of timer T transfers transistor Q1 to its no-conducting condition and condenser CD1 recharges to the magnitude of the potential along path E2. Upon a sufficient charge being accumulated transistor Q3 transfers to its non-conducting state. If at this time transistor Q5 has been in its non-conducting state for a sufficient period for condenser CD2 to charge fully to the potential of path E2 transistor Q4 also transfers to its non-conducting state. This permits transistor Q5 to begin conducting but the charge on condenser CD2 maintains the output of timer T at a binary 1 state for fifty milliseconds until the charge discharges sufficiently through the circuit to ground provided by transistor Q5. If at the time transistor Q3 ceases conducting condenser CD2 is not charged fully its charging current flowing through resistor R2 maintains transistor Q4 in its conducting state. Thus transistor Q5 remains non-conducting until condenser CD2 charges fully. At that time the circuit operates in the same manner as explained for the situation in which condenser CD2 is fully charged when transistor Q3 ceases to conduct. Timer T3 provides a circuit to ground through its associated dt1 gate for condenser CD1 of timer T when the signal along path GO is in the binary 1 condition or the signal along path $\overline{PRR}$ is in the binary o condition. When timer T3 provides a circuit to ground for timer T, timers T1 and T2 are prevented from providing such. Timer T2 provides a circuit to ground through its associated dt1 gate when not prevented from so doing by the dt1 gate associated with timer T3 and when the signal along path $\overline{MDT}$ assumes the binary 1 condition provided timer T1 is not at that time providing a circuit to ground through its associated dt1 gate. Timer T1 provides a circuit to ground through its associated *dt*1 gate when not prevented from so doing by timer T3 and when the signals along paths HS and $\overline{MDT}$ both are in the binary 1 condition and the signal along path DCB is in the binary 0 condition. When timer T1 provides a circuit to ground for timer T, timer T2 is prevented from providing such.

Conductor path MDT conducts a binary 1 signal and conductor path QDT provides a circuit to ground for timer T under conditions which will later be described in connection with FIG. 5.

The circuit terminal of conductor path DCB is connected through a suitable interface circuit (not shown) to a door close button (not shown) in the elevator car if such a button is provided. This button comprises part of the associated control equipment and through it a binary 1 signal is provided along path DCB when the button is not pressed. Upon the button being pressed a binary 0 signal is conducted along path DCB.

The circuit terminals of conductor paths DCB, $\overline{MDT}$, aNd QDT, it should be understood, are left unconnected in the control system of a particular car if it is intended that that car not operate with the particular optional operations provided in conjunction with these paths. Notwithstanding, these paths are provided on the circuit board of the FIG. 2 variety associated with that car in order that all such circuit boards be identical. If not used in a particular system the components of the FIG. 2 board to which these unused paths are connected operate as if binary 1 signals are applied along them.

The connections for conductor paths E1, E2 and ground (not shown other than at the corresponding circuit terminals) are provided to the board from the power supply of the car associated with that board for connection to components requiring the potentials applied along these paths.

The circuits of FIG. 3 are mounted on another of the circuit boards associated with an individual elevator car's basic control circuitry. These circuits among other things provide signals to the associated control equipment from control switches which establish the up and down directions as the preferred directions of travel, enable the car to start, cause the cancellation of hall and car calls and enable the lighting of hall lanterns, if provided for the associated car. These last mentioned signals also operate on the solid state circuits themselves to maintain an established direction of travel. In addition, the circuits on this board include control switches which provide signals which signify the existence of higher and lower calls as well as signals signifying further demands which require continued travel in an established direction. Other signals generated by the control switches on this board include signals signifying that a stop is to be made in response to a hall call and that a stop is to be made in response to either a hall or a car call.

A binary 0 signal is produced along conductor path $\overline{HC}$ in response to the application of a binary 0 signal along path VHC. This also causes the higher call switch comprising the dtl gate whose expander node is connected to path VHD to produce a binary 1 signal along conductor path HD and a binary 0 signal along conductor path $\overline{HD}$. A binary 0 signal along path VHD causes the higher call switch to produce a binary 1 signal along path HD notwithstanding the signal along path $\overline{HC}$ is in the binary 1 condition which would otherwise cause a binary 0 to appear along path HD. Conductor path VHD is used in conjunction with circuitry that provides optional operations. It is provided and connected to its control switch circuit terminal on each of the circuit boards made in accordance with FIG. 3 notwithstanding that its circuit terminal may in a particular control system be left unconnected to anything other than path VHD. In such cases the higher call switch operates in the same manner as if a binary 1 signal is applied along this path. The provision of conductor path VHD and its associated circuit terminal on each of the FIG. 3 type circuit boards is for the purposes of standardization.

A binary 0 signal is produced along conductor path $\overline{LD}$ and a binary 1 signal along path LD whenever a binary 0 signal is applied along conductor path $\overline{LC1}$. A binary 0 signal along conductor path VLD also causes the lower call switch comprising the *dtl* gate whose expander node is connected to path VLD to produce binary 1 and binary 0 signals along paths LD and $\overline{LD}$, respectively. This occurs notwithstanding the application of a binary 1 signal along conductor path $\overline{LC1}$ which would otherwise cause the signals to be viceversa along these conductor paths. Conductor path VLD is provided and connected to its control switch circuit terminal on each of the circuit boards made in accordance with FIG. 3. This path is for use in conjunction with equipment which provides optional operations. Even though a particular system may not be provided with operations which require path VLD and its circuit terminal they are both provided nevertheless for standardization purposes. In this situation this circuit terminal is left unconnected except for its connection to path VLD and the lower call switch operates as if a binary 1 signal is applied along the path.

The up direction establishing switch comprising the dtl gate of the buffer amplifier type whose output is connected to conductor path AU produces a binary 1 signal along path AU whenever a binary 0 signal is produced along any of paths $\overline{HD}$, $\overline{CP1}$, $\overline{DGO}$, and $\overline{HL}$ provided a binary 0 signal is not being applied to the buffer amplifier comprising the down direction establishing switch whose output is connected to path AD. Similarly the down direction establishing switch produces a binary 1 signal along conductor path AD whenever a binary 0 signal is applied along any of paths $\overline{CPT}$, $\overline{LD}$, $\overline{DGO}$ or $\overline{HL}$ provided a binary 0 signal is not being applied to the up direction establishing switch. The circuit terminal of conductor path $\overline{CP1}$ in every solid state system constructed according to the invention is connected to the interface circuit (FIG. 13A or 13C) from the car position indicating means (FIG. 17) corresponding to the lowermost landing of its associated system. The circuit terminal of conductor path $\overline{CPT}$ of every one of these solid state systems is connected to the interface circuit from the car position indicating means corresponding to the uppermost landing of its associated system.

In the disclosed system conductor paths AU and AD are connected to the associated control equipment shown in block diagram form in FIG. 17 to enable the establishment of the respective up and down directions of travel as well as being connected to various components of the solid state equipment shown on the printed circuit boards herein. Conductor paths VAU and VAD and their associated control switch circuit terminals are provided on each of the circuit boards made in accordance with FIG. 3 for use in conjunction with equipment that provides optional operations. A binary 0 signal along either of these conductor paths causes its associated direction establishing switch to produce a binary 1 signal notwithstanding the signals which normally produce such binary 1 signals are all themselves in the binary 1 condition and would otherwise produce binary 0 signals at the outputs of the direction establishing switches. It is understood, of course, that neither of the direction establishing switches can be operated in this manner if a binary 0 signal is being applied to the other direction establishing switch. Conductor paths VAU and VAD and their associated circuit terminals are provided on each of the printed circuit boards of the FIG. 3 variety for standardization purposes notwithstanding they might not be used in a particular elevator system. In the latter circumstances the dtl gates to which these paths are connected operate as if binary 1 signals are applied along these paths.

Delay elements D1 and D2 are both provided to prevent noise signals from affecting the operation of the up and down direction establishing switch circuits. Each of these delay elements require the application of a binary 0 signal at its input for at least 5 milliseconds before a binary 1 signal can be produced at its output. The internal circuitry of each of these elements is shown in FIG. 3A.

Conductor path FD conducts a binary 1 signal to signify a further demand requiring its associated elevator car to continue to travel in its established direction whenever binary 1 signals are applied along paths HD and AU or paths LD and AD.

The start switch comprising the buffer amplifier whose output is connected to path GO generates a binary 1 signal along this path which is transmitted to the associated control equipment of FIG. 17 to enable the car to start whenever a binary 1 signal is applied along path FD and binary 0 signals are applied along paths PTS and RUN. The production of a binary 1 signal along path GO establishes a self-holding circuit through delay element D3 as long as the signals along paths PTS and FD remain in the binary 0 and binary 1 conditions. Delay element D3 provides a 5 millisecond delay between the application of a binary 1 signal to its input and the production of a binary 0 signal at its output. Like elements D1 and D2, its internal circuitry is also shown in FIG. 3A. The production of a binary 0 signal at the output of delay element D3 causes the production of a binary 1 signal along path DGO.

The start switch maintains a binary 1 signal along path GO whenever its associated car is located between landings such that a binary 1 signal is produced along the $\overline{\text{path}}$ designated VCL(I) for a single car elevator and $\overline{\text{CLD}}$(G) for an elevator operating as a member of a group. Another selfholding circuit for the start switch is provided through delay element D4 whenever a binary 0 signal is produced along the conductor path designated VCL(I) and $\overline{\text{CLD}}$(G). The internal circuits of delay element D4 are also shown in FIG. 3A. As mentioned this circuitry establishes a five millisecond delay between the application of a binary 1 signal to its input and the production of a binary 0 signal at its output. This selfholding circuit operates to prevent the transfer of the signal along path GO to its binary 0 condition and in that way prevents the associated car from stopping if the signal along path PTS or FD is not transferred to the binary 1 or binary 0 condition, respectively, within five milliseconds after the indication of the location of the car at a landing by the transfer of the signal along the path designated VCL(I) and $\overline{\text{CLD}}$(G) to the binary 0 condition.

A binary 0 signal along path VGO causes the start switch to produce a binary 1 signal along path GO notwithstanding the other signals applied to its associated circuitry would otherwise cause the start switch to produce a binary 0 signal. This path is provided and connected to its control switch circuit terminal on each of the circuit boards constructed in accordance with FIG. 3 for use in conjunction with equipment which provides optional operations. Even though a particular elevator system may not require this path, it is provided nevertheless for standardization purposes. In those circumstances in which path VGO is not used, its circuit terminal is left unconnected to other equipment and the start switch operates as if a binary 1 signal is applied along the path.

For similar reasons conductor path $\overline{\text{VGO}}$ is also provided and connected to its control switch circuit terminal on each of the circuit boards constructed in accordance with FIG. 3. A binary 0 signal along this conductor path causes the auxiliary start switch comprising the *dtl* gate whose expander node is connected thereto to produce a binary 1 signal for application to the start switch notwithstanding the signals along paths RUN, PTS and FD would otherwise cause the auxiliary start switch to produce a binary 0 signal. If path $\overline{\text{VGO}}$ is not employed in a particular elevator system its circuit terminal is also left unconnected to other equipment and the auxiliary start switch operates as if a binary 1 signal is applied along this path.

The hall call stop switch comprising the dtl gate whose output is connected to conductor path HS produces a binary 1 signal along that path if binary 1 signals are applied along paths $\overline{\text{IND}}$ and FD provided either a binary 0 signal is applied along path VUHS and the associated car is traveling in the up direction so that a binary 1 signal appears along path AU or a binary 0 signal is applied along path VDHS and the associated car is traveling in the down direction so that a binary 1 signal appears along path AD. The production of a binary 1 signal along path HS for five milliseconds selfholds this signal as long as a binary 1 signal is applied along path DT or a binary 0 signal is applied along path $\overline{\text{RDT}}$ so that a binary 1 signal is produced along path DT + RDT. The five millisecond delay is provided by delay element D9 whose internal circuitry is shown in FIG. 2C. The operation of the delay element D9 in response to a binary 1 signal along path HS produces a binary 1 signal along path THS.

Conductor path $\overline{\text{VHS}}$ is provided and connected to its control switch circuit terminal on each circuit board made in accordance with FIG. 3 for use in conjunction with equipment which provides optional operations. Notwithstanding this conductor path and its circuit terminal may not be used in particular elevator systems, it is provided nevertheless for standardization purposes. In those situations in which it is not used, its circuit terminal is left unconnected to other equipment and the hall stop switch operates as if a binary 1 signal is applied along this path. A binary 0 signal along this path prevents the transfer of the signal along path HS from its binary 0 condition to its binary 1 condition notwithstanding the signals along paths $\overline{\text{IND}}$, FD and either VUHS and AU or VDHS and AD are such as to otherwise produce this transfer.

The call stop switch comprising the dtl gate whose output is connected to conductor path PTS produces a binary 1 signal along that path in response to the application of binary 1 signals along paths HS and $\overline{\text{RDT}}$ or a binary 0 signal along path $\overline{\text{DT}}$. A binary 0 signal along path $\overline{\text{VPTS}}$ prevents the call stop switch from producing a binary 1 signal along path PTS notwithstanding the signals along paths HS, $\overline{\text{RDT}}$ and $\overline{\text{DT}}$ are such as to otherwise cause this production. A binary 0 signal along path VPTS causes the auxiliary call stop switch comprising the *dtl* gate whose expander node is connected to path VPTS to produce a binary 0 signal which operates the call stop switch to produce a binary 1 signal along path PTS. This occurs even though the signals along paths HS, $\overline{\text{RDT}}$ and $\overline{\text{DT}}$ would otherwise operate the auxiliary call stop switch to produce a binary 1 signal to cause the production of a binary 0 signal along path PTS. A binary 0 signal along conductor path VPTS, however, is ineffective to cause the call stop switch to produce a binary 1 signal if a binary 0 signal is applied along path $\overline{\text{VPTS}}$.

Conductor paths VPTS and $\overline{\text{VPTS}}$ are provided and connected to associated control switch circuit terminals on each of the circuit boards made in accordance with FIG. 3 for use in conjunction with equipment which provides optional operations. Notwithstanding either one or both of these conductor paths might not be used in a particular system, they are provided on the circuit board so that each and every one of the FIG. 3 circuit boards of every system built in accordance with this invention is identical. In those situations in which one or both of these conductor paths is not used, the associated circuit terminal or terminals is left unconnected to other equipment and the call stop switch operates as if a binary 1 signal is applied along the appropriate conductor path or paths.

A binary 1 signal is produced along conductor path CCR 5 milliseconds after the application of binary 1 signals along paths $\overline{PRR}$ and DT + RDT. The circuit terminals of conductor path CCR is connected to the solid state equipment shown in FIG. 1 as well as through appropriate interface circuits (not shown) to the associated control equipment of FIG. 17. Its application to the circuitry of FIG. 1 when its associated car is located at a landing removes the effect of a car call for that landing from its associated elevator system. The application of this signal to its associated interface circuits causes the actual cancellation of the call by combining with a position indicating signal to reset the car call registration device associated with the call. In this way the effect of the call is removed from the system in a matter of nanoseconds which is considerably faster than the actual reset of the car call registering device.

Similarly binary 1 signals along paths UHR and DHR cause the removal of the effect of up and down hall calls from the system and the actual cancellation of the call by combining with a position indicating signal to reset the associated up and down hall call registering devices. A binary 1 signal is produced along path UHR five milliseconds after the application of binary 1 signals along paths THS, HL and DT + RDT provided the car is traveling in the up direction so that a binary 1 signal is applied along path AU. Under similar conditions a binary 1 signal is produced along path DHR provided the car is traveling in the down direction so that a binary 1 signal is applied along path AD. In order to enable the signals along paths UHR and DHR to produce both the call removal and cancellation functions the circuit terminals of these conductor paths are also connected to the solid state equipment of FIG. 1 as well as through appropriate interface circuits (not shown) to the associated control equipment of FIG. 17. The 5 millisecond delays in the production of signals along paths UHR and DHR are provided by delay elements D5 and D6, the internal circuitry of both of which is shown in FIG. 3A. These delays insure that the appropriate direction of travel is maintained or established by the production of a binary 1 signal along path $\overline{HL}$ before a binary 0 signal along path HL causes the production of a binary 1 signal along either path UHR or DHR.

The direction maintaining switch comprising the buffer amplifier whose output is connected to path $\overline{HL}$ produces a binary 0 signal along this path 5 milliseconds after the application of binary 1 signals along paths DT and FD provided binary 1 signals are at the same time applied along paths $\overline{IND}$ and $\overline{PRR}$. Simultaneously a binary 1 signal is produced along path HL. This latter signal maintains binary 0 and binary 1 signals along paths $\overline{HL}$ and HL, respectively, as long as a binary 1 signal is applied along path DT.

If a stop is made without a further demand existing so that a binary 0 signal is applied along path FD the direction maintaining switch does not operate until the doors start to open and a binary 1 signal is applied along path $\overline{DFC}$. This operation enables a hall lantern, if hall lanterns are provided, to be lighted but does not maintain the previously established direction of travel. The lighting of hall lanterns is accomplished by applying the binary 0 signal produced along path $\overline{HL}$ through suitable interface circuitry (not shown) to the associated control equipment of FIG. 17.

Also connected in the direction maintaining switch circuit is path $\overline{VHL}$ and its associated control switch circuit terminal. A binary 0 signal along this conductor path prevents the production of binary 1 and binary 0 signals along paths HL and $\overline{HL}$, respectively, notwithstanding the other inputs to the direction maintaining switch circuit would otherwise provide such signals. Conductor path $\overline{VHL}$ is provided and connected to a circuit terminal on every circuit board built in accordance with FIG. 3 for use with equipment which provides optional operations. Notwithstanding a particular elevator control system may not use this conductor path it is provided on every circuit board of the FIG. 3 variety so that any one of them may be used with any solid state elevator control system built in accordance with this invention.

The five millisecond delay in the circuit of the direction maintaining switch is provided by delay element D10 whose internal circuitry is schematically represented in FIG. 2C. This delay prevents noise signals from interfering with the operation of the direction maintaining switch circuit and prevents the flickering of the hall lanterns, if provided.

The connections for conductor paths E1 and ground (not shown other than at the corresponding circuit terminals) are provided to this board from the power supply of the individual car associated therewith for connection to components requiring the potentials applied along these paths.

The circuits shown in FIG. 4 are mounted on another of the circuit boards associated with an individual elevator car's basic control circuitry. These circuits provide protection against both an undue delay at a landing and a failure of the door means to open the doors.

An undue delay at a landing causes the delayed car protection circuit to produce binary 0 signals along paths $\overline{DLC}$ and $\overline{VHL}$ and a binary 1 signal along path DLC. These signals are produced a predetermined period after the signal along any of paths $\overline{PRR}$, $\overline{LD}$ or $\overline{HD}$ assumes the binary 0 condition if at the same time the signals along paths $\overline{IND}$ and RUN are in the binary 1 and binary 0 conditions, respectively. This period is provided by timer T4 and as will be explained is extended if the signal along path DO assumes the binary 0 condition before the original period expires.

In response to the production of a binary 0 signal along path $\overline{VHL}$ the signals along paths HL and $\overline{HL}$ (FIG. 3) are transferred to the binary 0 and binary 1 conditions, respectively. The latter turns off the lighted hall lantern, if provided, while the former prevents the further cancellation or removal of hall calls registered at the landing at which the car is located. The binary 0 signal along path $\overline{DLC}$ is applied to the identically designated conductor path shown in FIG. 2 and prevents the reversal devices of the safety type from further reopening the doors thereby enabling the doors to close. The production of a binary 1 signal along path DLC produces a binary 0 signal along path $\overline{VPTS}$ if the signal along path $\overline{PRR}$ is also in the binary 1 condition. A binary 0 signal along path $\overline{VPTS}$ is applied to the identically designated conductor path shown in FIG. 3 to cause the call stop switch to produce a binary 0 signal along path PTS. This enables the car to start by causing the start switch to operate to produce a binary 1 signal along path GO (FIG. 3) provided a further demand exists in the system so that a binary 1 signal is applied along path FD. In addition, the binary 0 signal along path $\overline{VPTS}$ prevents a hall call from producing a binary 1 signal along path PTS. As a result a hall call cannot cause the production of a binary 0 signal along path $\overline{DT}$ (FIG. 2) and the doors are prevented from reopening in response to such a call.

The internal circuitry of timing device T4 is schematically represented in FIG. 4A. A binary 1 signal applied to the base of transistor Q6 causes it to conduct which transfers its collector to ground potential. As a result condenser CT6 starts to charge to the potential applied along path E2. After a predetermined period the charge on condenser CT6 has increased sufficiently to cause the base of transistor Q7 to be at a lower potential than the potential applied to its emitter through the voltage divider comprising resistors R6 and R7. This causes transistor Q7 to conduct and as a result transistors Q8 and Q9 are transferred to their conduction states also. This produces a binary 0 signal along the output circuit of the timing device.

The generation of a binary 0 signal along path DO causes transistor Q10 to conduct which inserts resistor R10 in parallel with resistor R7. If at this time transistor Q7 has not started to conduct this decreases the potential applied to its emitter requiring condenser CT6 to acquire more charge than previously before transistor Q7 can conduct. As a result the application of the binary 1 signal to the base of transistor Q10 extends the period of timing device T4.

Assume transistors Q6 and Q7 are conducting and a binary 0 signal is applied to the base of transistor Q6. This causes the latter to transfer to its non-conducting state and raises its collector potential to the magnitude of the potential applied along path E2. As a result condenser CT6 starts to discharge through diode D6. When this charge decreases sufficiently the potential on the base of transistor Q7 increases above the potential of its emitter causing it to transfer to its non-conducting state. This in turn causes transistors Q8 and Q9 to similarly transfer to their non-conducting states and produces a binary 1 signal along the output circuit of the timing device.

The rest of the circuitry of FIG. 4 protects against the failure of the doors to open fully within a predetermined period after they are supposed to. This causes the door protection circuit to produce a binary 1 signal along path DP and binary 0 signals along paths $\overline{DP}$, $\overline{VDLC}$, $\overline{VDT}$ and $\overline{VHL}$. This occurs as a result of the application of binary 0 signals along paths RUN and DFO for this predetermined period while the signal along path DO is in the binary 1 condition.

A binary 1 signal along path DP causes the production of a binary 0 signal along path VGO if the signal along path $\overline{PRR}$ is also in the binary 1 condition. A binary 0 signal along path VGO is applied to the identically designated path on FIG. 3 to enable the car to start by causing the start switch to produce a binary 1 signal along path GO. The binary 0 signal along path $\overline{VDLC}$ is applied to the delayed car protection circuit to cause the reset of timing device T4.

The binary 0 signal along path $\overline{VDT}$ is applied along the identically designated path of FIG. 2 to cause the door time switch to produce a binary 1 signal along path $\overline{DT}$ to enable the doors to close. The binary 0 signal along path $\overline{VHL}$ is applied to the identically designated path of FIG. 3 and produces the same results as the similar signal produced when generated in response to the operation of the delayed car protection circuit.

The internal circuitry of timing device T5 which establishes the predetermined period for the door protection circuit is illustrated in FIG. 4B. The application of a binary 1 signal to the base of transistor Q11 causes it to conduct which transfers its collector to ground potential. As a result condenser CT11 starts to charge to the potential applied along path E2. After a predetermined period condenser CT11 charges sufficiently to decrease the potential on the base of transistor Q12 below that applied to its emitter by the voltage dividing circuit formed by resistors R12 and R13. As a result transistor Q12 conducts and transfers transistors Q13 and Q14 to their conducting states which produces a binary 0 signal along the output circuit of timing device T5.

The application of a binary 0 signal to the base of transistor Q11 transfers it to its non-conducting state and causes condenser CT11 to discharge. The presence of diode D12, however, prevents this discharging action from having any effect on the rest of the circuitry and as a result transistors Q12, Q13 and Q14 remain in their conducting state and a binary 0 signal is maintained along the output of timing device T5.

The reset of timer T5 is accomplished in the following manner. As explained in connection with the conductor path RUN of FIG. 2, when the elevator car starts to move a binary 1 signal is applied along this path. This signal is simultaneously transmitted along the identically designated path (RUN) of FIG. 4 to the base of transistor Q15 and causes it to conduct which transfers its collector to ground potential. As a result condenser CR11 starts to discharge through resistor R13. After a predetermined period the potential at the emitter of transistor Q12 is insufficient to maintain its conduction and it transfers to its non-conducting state. This causes transistors Q13 and Q14 also to transfer to their non-conducting states and produces a binary 1 signal along the output circuit of timing device T5.

If the elevator car starts to move so that a binary 1 signal is applied along path RUN to the base of transistor Q15 before condenser CT11 charges sufficiently to enable transistor Q12 to transfer to its conducting state the conduction of transistor Q15 and the subsequent reduction in the emitter potential of transistor Q12 prevents it from thereafter transferring to its conducting state so that timing device T5 does not produce a binary 0 signal.

From the foregoing description of the circuits of FIG. 4 and from the consideration of the diagram shown in that Figure it is evident that diodes isolate the connection in the door protection circuit to path $\overline{VHL}$ from the connection in the delayed car protection circuit to the identical path $\overline{VHL}$. This enables both of these circuits to operate on the direction maintaining switch circuit of FIG. 3 while preventing one circuit from affecting the operation of the other notwithstanding they are both connected to the same conductor path of the circuit board of FIG. 3. As a result the production of a binary 0 signal along path $\overline{VHL}$ in the delayed car protection circuit does not produce a binary 0 signal along path $\overline{DP}$, $\overline{VDLC}$ or $\overline{VDT}$ in the door protection circuit. Likewise the production of a binary 0 signal along path $\overline{VHL}$ in response to the operation of the door protection circuit does not produce a binary 0 signal along path $\overline{DLC}$ in the delayed car protection circuit.

The connections for conductor paths E1, E2 and ground (not shown other than at the corresponding circuit terminals) are provided to this board from the power supply of the car associated therewith for connection to components requiring the potentials applied along these paths.

The foregoing first plurality of circuit boards shown in FIGS. 1, 2, 3 and 4 are sufficient when properly connected through appropriate interface circuits to the associated control equipment of FIG. 17 to control the operation of a single selective collective elevator car. Moreover these boards are so made that optional operations may be provided for such a car without any change in the solid state equipment, the conductor paths on any of the boards or the wiring between the circuit terminals of the different ones of these boards. As will be seen from what follows this is accomplished through the provision of input circuit conductor paths QDT, $\overline{MDT}$, DCB, $\overline{VDT}$, VDO, $\overline{VPH}$, VHD, VLD, VAU, VAD, $\overline{VGO}$, VGO, $\overline{VHS}$, VPTS, $\overline{VPTS}$ and $\overline{VHL}$ and their associated circuit terminals. This provides these boards with a universal character in that the same boards are useful in many different systems of the disclosed type, each of which can include different optional operations or none at all. Also contributing to the universality of these circuit boards is the fact that all of the foregoing conductor paths except QDT, $\overline{MDT}$ and DCB are connected to expander nodes of switching gates. This, as explained above with respect to path $\overline{VHL}$, enables a connection from one circuit to any one of these conductor paths to be isolated from the connection from any other circuit to the same conductor path.

In order now to understand how this first plurality of circuit boards shown in FIGS. 1 through 4 are used in conjunction with auxiliary equipment so as to provide optional operations consider FIGS. 5 and 6.

FIG. 5 shows equipment for use with an individual associated elevator for providing an optional operation which changes the time that the associated doors are maintained opened at a particular landing. This is auxiliary equipment in the sense that it is only required to enable the car to perform an optional operation and is not required for its basic performance as a single car selective collective elevator as such. This equipment is mounted on an auxiliary printed circuit board.

Assume the particular landing at which it is desired to change the door open time is the lobby landing and further assume that this is the lowermost landing of the elevator system. Upon the car approaching the lobby landing a binary 0 signal is produced along conductor path $\overline{CP1}$ in a similar manner as explained in connection with the identically designated conductor path shown in FIG. 1. This in conjunction with binary 1 signals along conductor paths RUN and DT provides a binary 0 or ground signal for conductor path QDT through timing device T6. At the same time a binary 0 signal is produced along conductor path $\overline{MDT}$. These binary 0 or ground signals are maintained through delay element D8 until the signal along conductor path DT assumes the binary 0 condition. The internal circuitry of timing device T6 and delay element D8 are shown in FIGS. 2B and 3A, respectively.

The binary 0 signal produced along path $\overline{MDT}$ is transmitted to the identically designated path in FIG. 2 to prevent paths to grounds through either timing device T1 or T2. As a result timing device T6 is substituted for one or the other of these timing devices providing a different discharge time for condenser CD1 of timing device T. In the disclosed constructed embodiment this is provided if desired to increase the door time at the lobby over that which is provided at any other landing.

FIG. 6 shows equipment for providing an optional operation which enables a fully loaded car to bypass, without stopping at, those landings it encounters at which hall calls for its direction of travel are registered. This equipment is mounted on another auxiliary printed circuit board. The circuit terminal of conductor path FLW is connected through a suitable interface circuit to a load weighing device (not shown) which comprises part of the associated control equipment of a car if this particular optional operation is provided. This device provides a binary 0 signal along path FLW whenever less than a predetermined load is being carried by its associated car and a binary 1 signal whenever its associated car is carrying this predetermined load or more. When the car is stopped the binary 0 signal along path RUN cooperates with a binary 1 signal along path FLW to produce a binary 1 signal along path PFLC and a binary 0 signal along path $\overline{PFLC}$. The binary 0 signal along path $\overline{PFLC}$ is transmitted to conductor path $\overline{VPH}$ for application to the identically designated conductor path shown in FIG. 2 to prevent further response to hall calls by the higher and lower call circuits of the car. The binary 1 signal along path PFLC in conjunction with similar signals along paths $\overline{DFC}$ and $\overline{FLC}$ produces binary 0 signals along paths $\overline{VPTS}$ and $\overline{VDT}$. The binary 0 signal along path $\overline{VDT}$ causes the production of a binary 1 signal along path $\overline{DT}$ (FIG. 2) to enable the doors to close. The binary 0 signal along path $\overline{VPTS}$ produces a binary 0 signal along path PTS (FIG. 3). This, as explained in connection with the delayed car protection circuit, operates the start switch to produce a binary 1 signal along path GO (FIG. 3) if a binary 1 signal exists along path FD. The operation of the start switch enables the car to start without further delay.

The binary 0 signals along paths $\overline{VDT}$ and $\overline{VPTS}$ exist only as long as delay unit D7 inhibits the production of a binary 0 signal along path $\overline{FLC}$. The extent of this delay is in the order of 20 milliseconds. This, however, is sufficient to enable the start switch to produce a binary 1 signal along path GO which becomes self-holding after 5 milliseconds. At about the time that this delay elapses a binary 1 signal is also produced along path DGO and this in conjunction with the binary 1 signal along path PFLC causes the production of binary 0 signals along paths $V\overline{HL}$ and $V\overline{HS}$. The binary 0 signal along path $V\overline{HL}$ causes the production of a binary 1 signal along path $\overline{HL}$ (FIG. 3) which extinguishes the hall lantern, if provided. The binary 0 signal along path $V\overline{HS}$ prevents further response to a registered hall call at the landing.

The signals along path $V\overline{PH}$, $V\overline{HL}$ aNd $V\overline{HS}$ are maintained in the binary 0 condition through the holding circuit provided by delay unit D7 to prevent response to hall calls while the elevator car is running. The transfer of the signal along path $\overline{FLC}$ to the binary 0 condition, however, enables response to car calls since it transfers the signals along paths $V\overline{PTS}$ and $V\overline{DT}$ to the binary 1 condition.

When the car next stops at a landing the signal along path DGO is transferred to its binary 0 condition to cause the signals along paths $V\overline{HL}$ aNd $V\overline{HS}$ to transfer to the binary 1 condition. This enables the hall lantern to be lighted, if provided, and the cancellation of a hall call for the direction in which the car is traveling if one is registered.

Conductor path $V\overline{FLC}$ is provided and connected to an associated circuit terminal on each of the auxiliary circuit boards made in accordance with FIG. 6 for use with equipment which provides additional optional operations. These can be provided by applying, as desired, a binary 0 signal along path $V\overline{FLC}$. This prevents the previously described optional operation which causes a car to bypass hall calls when carrying a predetermined load because while a binary 0 signal is applied along path $V\overline{FLC}$ a binary 1 signal along path FLW cannot transfer the signals along paths PFLC and $P\overline{FLC}$ to the binary 1 and binary 0 conditions notwithstanding the car is not running and the signal along path RUN is in the binary 0 condition.

It will be noticed that the failure of the equipment on either of the circuit boards of FIGS. 5 or 6 will have no affect on the operation of the controlling switching logic circuitry of FIGS. 1 through 4 if that failure is such that the output gates of the auxiliary switching logic circuits of the boards of EIGS. 5 and 6 fail in their non-conducting condition; i.e. they produce binary 1 signals along all output conductor paths. Whereas, if these components should fail in their conducting condition such that binary 0 signals are produced along some or all of the output circuit conductor paths the removal of these two boards will enable those of FIGS. 1 through 4 to continue to operate in the same manner in which they would operate if neither of these optional operations is provided. As will be evident from later discussions the removal of these circuit boards is a simple expediency.

The connections for conductor paths E1 and ground (not shown other than at the corresponding circuit terminals) are provided to the boards of FIGS. 5 and 6 from the power supply of the individual car associated therewith for connection to components requiring the potentials applied along these paths.

Other optional operations in addition to those provided by the equipment of FIGS. 5 and 6 are also considered desirable in single car selective collective elevator system. Among other optional operations, for example, it is often desired to have the system capable of being operated by an attendant. In this case an additional auxiliary printed circuit board is provided with components arranged to produce among other things the functions shown in the diagrams of FIGS. 7A, 7B and 7C. FIG. 7A represents circuitry whose actual physical components are not shown but which is provided to produce signals along conductor path VDO on the associated auxiliary board for transmission to the identically designated conductor path on the board shown in FIG. 2. A binary 0 signal is produced along paths VDO (FIGS. 2 and 7A) to cause the elevator doors to remain open, or if closing to reopen, if a binary 1 signal is produced along line $\overline{DFC}$ signifying the doors are not fully closed and binary 0 signals are produced along paths $\overline{ATT}$ and DCB signifying the elevator is operating under attendant control and the door close button is not pressed. Conductor path $\overline{ATT}$ and DCB, if provided, are connected through suitable interface circuits to manual switches comprising part of the car's associated control equipment which are normally located in the elevator car and which provide binary 1 signals along paths $\overline{ATT}$ and DCB, respectively, when the elevator is not to operate under the control of an attendant and the door close button is not pressed and binary 0 signals when the opposite conditions exist.

FIG. 7B also represents circuitry whose actual physical components are not shown but which is provided to produce signals along path $V\overline{GO}$ on the associated auxiliary board for transmission to the identically designated conductor path on the board shown in FIG. 3. A binary 0 signal is produced along conductor paths $V\overline{GO}$ (FIGS. 3 and 7B) in response to the production of a binary 0 signal along path $\overline{ATT}$ and the production of binary 1 signals along paths DO and $\overline{PRR}$ signifying that the elevator car is operating under attendant control and that the doors have not started to close.

FIG. 7C also represents circuitry whose actual physical components are not shown but which is provided to produce signals along paths $V\overline{HS}$ and $V\overline{PH}$ on the associated auxiliary board for transmission to the identically designated conductor paths on the essential boards shown in FIGS. 3 and 2, respectively. Binary 0 signals are produced along paths $V\overline{HS}$ (FIGS. 3 and 7C) and paths $V\overline{PH}$ (FIGS. 2 and 7C) whenever binary 0 signals are produced along paths $\overline{ATT}$ and $\overline{NSB}$. The former signals prevent response to hall calls and are produced when the elevator car is operating under attendant control and the attendant has pressed a non-stop button. This latter button, if provided, comprises part of the associated control equipment and is located in the elevator car to be effective to produce a binary 0 signal along path $\overline{NSB}$ through suitable interface circuits when it is pressed and a binary 1 signal along that path when it is not pressed.

In order now to understand how different sets of the single car circuit boards shown in FIGS. 1 through 4 provided for a plurality of elevator cars are used in conjunction with group equipment for enabling those cars to operate as a group supervisory system consider FIGS 8 through 11. FIG. 8 shows a plural car circuit board associated with one car of a plural car group which together with a circuit board of the FIG. 9 variety and a set of single car circuit boards comprise a first plurality of circuit boards forming individual car control circuitry for a car which is to operate as a member of a group supervisory control system. The plural car circuit boards of FIGS. 8 and 9 include circuits for enabling their associated car to operate as a member of a group. The circuits of FIG. 8 generate signals signifying, among other things, the location of the associated car in any one of three zones, the assignment of that car to one of those zones and the ability of it to start in response to registered hall calls. As will be understood in those systems having more than three zones an additional plural car board of the FIG. 8 variety is provided for each car for every three additional zones. Where the number of zones in a system is not a multiple of three a circuit board similar to that shown in FIG. 8 is provided for each car with all of the conductor paths required for three zones but with only that equipment required for one or two zones.

As previously mentioned, the circuit terminals associated with conductor paths VCLG1, VCLG2 and VCLG3 of each car are connected to the circuit terminals of conductor paths VCL1, etc. (FIG. 1) of their respective car which are associated with those landings located in the first, second and third zones, respectively. Upon the location of the associated car at a landing, say in the first zone, a binary 0 signal is applied along conductor path VCLG1 which produces a binary 0 signal along conductor path VCLG. At the same time this produces a binary 1 signal along conductor path ZP1 and a binary 0 signal along conductor path $\overline{ZP1}$. The binary 1 signal along path ZP1 in conjunction with a binary 1 signal along path CIG (FIG. 9) signifying the car is operating under the control of the group supervisory system produces a binary 0 signal along path VGZO1 which, as will be further explained later, signifies the location of one of the cars of the group in the first zone. If at this time a binary 1 signal is transmitted along conductor path CAV (FIG. 9) signifying the car is available for assignment and a binary 1 signal is transmitted along conductor path $\overline{GZA1}$ signifying the absence of an assigned car in the first zone a binary 0 signal is produced along path VRQA. As will be explained, this signal institutes an operation to assign the associated car to the first zone. As a result of this assignment a binary 0 signal is produced along conductor path $\overline{ASG}$ (FIG. 10). In conjunction with the binary 1 signals along paths CAV and ZP1 this produces binary 0 signals along conductor paths $\overline{CZ1}$, VCAZ and VGZA1. The first of these signals signifies the assignment of the associated car to zone one, the second signifies the assignment of the associated car to some zone and the third signifies the assignment of some car to zone one.

Similar circuits to those described above are provided for the second and third zones which operate in a similar fashion to perform the same functions for their respective zones.

In each of the group of circuits for each of the zones two holding circuits are provided. One of these in each group maintains the indication that the car is located in the respective zone while it is traveling between landings therein and the other maintains the indication that the car is assigned to the zone until it leaves it or is no longer operating as a member of the group. Each of the first of these circuits includes an individual delay element D16, D17 and D18. The internal circuitry of each of these units is illustrated in FIG. 2C. Each of these produces a binary 1 signal for use in conjunction with binary 1 signals along path $\overline{CL}$ (FIG. 9) to maintain binary 0 signals along its associated path $\overline{ZP1}$, etc. when, as mentioned, the elevator car is traveling between landings.

Each of the circuits for maintaining the signals indicating the assignment of the associated car (VCAZ, $\overline{CZ1}$, etc.) includes an individual delay element D13, D14 and D15. The internal circuitry for each of these is also illustrated in FIG. 2C. Each produces a binary 0 signal which maintains the binary 0 signals indicating the assignment of the car until a binary 0 signal is produced either along path ZP1, etc. of the associated zone or along path CAV indicating the departure of the car from a zone or the release of its availability for assignment to a zone, respectively.

The signals for enabling the associated car to start in response to registered hall calls are produced along conductor paths PZH1, etc. Before proceeding with a description of the generation of signals along these paths it should be understood that like conductor path $\overline{LC1}$ and $\overline{LC5}$ of FIG. 1 conductor path LCZ4 on each of the circuit boards of the FIG. 8 variety associated with a particular car is connected through appropriate circuit terminals to conductor path LCZ1 on the circuit board corresponding to the next succeeding higher zone or zones. Likewise conductor path $\overline{LZD4}$ on each of the circuit boards of the FIG. 8 variety associated with a particular car is connected to conductor path $\overline{LZD1}$ on the circuit board for that car associated with the next succeeding higher zone or zones. The circuit terminals of conductor paths LCZ4 and $\overline{LZD4}$ or their counterparts on that board for a particular car which is associated with the highest zone or zones in a building are left unconnected to any other equipment as is the circuit terminal of conductor path LCZ1 on that board for a particular car which is associated with the lowest zones in a building. Conductor path $\overline{LZD1}$ on that board for a particular car which is associated with the lowest zones in a building is connected to the identically designated path on FIG. 9. Conductor path PZHO of each of the circuit boards of the FIG. 8 variety associated with a particular car is connected to conductor path PZH3 on the circuit board for that car associated with the next succeeding lower zones. Conductor path PZH3 or its counterpart on that board for a particular car which is associated with the highest zone or zones in a building is left unconnected as is conductor path PZHO on that board for a particular car which is associated with the lowest zones in a building.

In response to the location of its associated car in a zone, say the first zone, a binary 0 signal is produced along path $\overline{ZP1}$. This in conjunction with the production of a binary 1 signal along conductor path PH (FIG. 2) produces a binary 1 signal along conductor path PZH1. This signal is transmitted to the respective car's higher and lower call circuits (FIG. 1) for the landings in the first zone to enable those circuits to operate in response to calls registered at any of the landings in the first zone. Similarly, the respective car's higher and lower call circuits for the landings in the second or third zone receive binary 1 signals generated on path PZH2 or PZH3, respectively, in response to the production of a binary 1 signal along path PH and a binary 0 signal along path $\overline{ZP2}$ or $\overline{ZP3}$.

As will be explained later, if no car is located in the second zone a binary 1 signal is transmitted along conductor path $\overline{GZO2}$ (FIG. 11). This in conjunction with a binary 1 signal along path PZH1 produces a binary 1 signal along path PZH2. Like the binary 1 signal along path PZH1 such a signal along path PZH2 enables the respective car's higher and lower call circuits (FIG. 1) for the landings in the second zone to operate in response to hall calls registered at any landing in the second zone. Similarly, if no car is located in the third zone a binary 1 signal is transmitted along path $\overline{GZO3}$ (FIG. 11). This in conjunction with a binary 1 signal along path PZH2 enables the respective car's higher and lower call circuits for the landings in the third zone to operate in response to hall calls registered at any landing in the third zone.

The foregoing circuits enable a respective car's higher and lower call circuits to operate in response to the registration of hall calls at landings in contiguous unoccupied zones above and adjacent a zone to which the car is assigned as well as in response to the registration of hall calls at the landings in the zone to which the car is assigned. In addition thereto other circuits are provided for enabling a car in the lowest occupied zone to respond to hall calls registered in unoccupied zones below it. The location of a car in a zone, say the third zone, produces a binary 0 signal along conductor path $\overline{ZP3}$. This produces a binary 1 signal along conductor path LCZ3. If at the same time no car is located below the third zone in the first and second zones a binary 1 signal, as will be explained, is produced along conductor path $\overline{GZL3}$ (FIG. 11). This in conjunction with the binary 1 signal along conductor path LCZ3 and the production of a similar signal along path PH (FIG. 2) produces a binary 1 signal along conductor path PZH2. Similarly the absence of a car from the first zone, as will be explained, produces a binary 1 signal along path $\overline{GZL2}$ (FIG. 11) and this in conjunction with the binary 1 signals along paths LCZ3, $\overline{GZL3}$ and PH produces a binary 1 signal along conductor path PZH1. As a result the higher and lower call circuits of a car assigned to the third zone are responsive not only to hall calls registered in the third zone but also to those registered in the unoccupied first and second zones as well.

Lastly, the circuit board shown in FIG. 8 includes circuits for generating binary 0 signals along paths VHZD and $\overline{LZD1}$ signifying the existence of an empty zone above or below the location of the car, respectively. Assuming the car associated with the circuit board illustrated in FIG. 8 is located in a zOne, say the second zone, the signal along path ZP2 is in the binary 1 condition. If no car is located in the third zone the signal along path $\overline{GZD3}$ (FIG. 11), as will be explained, is in the binary 0 condition and since the car associated with this circuit board is not located in the third zone the signal along path $\overline{ZP3}$ is in the binary 1 condition. This causes the production of a binary 0 signal along path $\overline{LZD3}$. In conjunction with the binary 1 signal along path ZP2 the binary 0 signal along path $\overline{LZD3}$ produces a binary 0 signal along path VHZD signifying the existence of an empty zone above the car associated with this circuit board.

Again assuming the car is located in the second zone the signal along conductor path $\overline{ZP1}$ of the circuit board associated with this car is in the binary 1 condition since the car is not located in the first zone. If no other car is located in the first zone the signal along path $\overline{GZD1}$ (FIG. 11), as will be explained, is in the binary 0 condition and this in conjunction with the binary 1 signal along path $\overline{ZP1}$ produces a binary 0 signal along path $\overline{LZD1}$ signifying the existence of an empty zone below the car.

The gate circuits connected to conductor paths VHZD, VRQA, VGZO1, VGZO2 and VGZO3 are each of the type without an internal resistor in its output circuit. These have been chosen so that the shorting to ground of the power supply connected to the circuit board does not produce binary 0 signals along these paths. As will become evident such a choice reduces the effect a failure of an individual car's power supply has on proper operation of the rest of the group supervisory control circuits.

The connections for conductor paths E1 and ground (not shown other than at the corresponding circuit terminals) are provided to this board from the power supply of the individual car associated therewith for connection to components requiring the potentials applied along these paths.

The circuits on the plural car circuit board shown in FIG. 9 are also associated with one car of a group supervisory system. These circuits include control switches for generating signals signifying that the associated car is operating as a member of its group, is available for assignment to a zone of the system, is located at a landing and is assigned to a zone. Additional control signals are generated for causing the operation of the higher and lower call switches and the up direction establishing switch as well as for preventing the hall call responsive switch from operating.

A binary 1 signal along conductor path CIG signifies that the associated car is operating as a member of its group and is produced in response to binary 1 signals being applied along conductor paths $\overline{IND}$ (FIG. 2), $\overline{DP}$ (FIG. 4), $\overline{DLC}$ (FIG. 4), $\overline{FLC}$ (FIG. 6) and $\overline{VCIG}$. If a particular elevator car is not provided with the load weighting by-pass option of FIG. 6, a binary 1 signal is permanently applied along conductor path $\overline{FLC}$ by leaving the circuit terminal of the board of FIG. 9 associated therewith unconnected to any other equipment. Likewise conductor path $\overline{VCIG}$ if not employed (as is the case with the disclosed system) nevertheless is provided but also left open circuited by leaving its associated circuit terminal unconnected to any other equipment.

A signal indicating the availability of the associated car for assignment to a zone is produced in the form of a binary 1 signal along conductor path CAV whenever binary 1 signals are produced along path CIG and path $\overline{VCAV}$. As is the case with conductor path $\overline{VCIG}$, conductor path $\overline{VCAV}$ is also not usefully employed in the disclosed system. Notwithstanding it is provided on each of the circuit boards of the FIG. 9 variety for purposes of universality and when not employed its associated circuit terminal is also left unconnected to any other equipment.

A binary 0 signal transmitted along conductor path $\overline{CL}$ signifies the location of the associated car at a landing and is produced in response to the production of a binary 0 signal along conductor path VCLG (FIG. 8). This latter signal also produces a binary 0 signal along conductor path $\overline{CLD}$ approximately 20 milliseconds after the production of a corresponding signal along conductor path $\overline{CL}$. This delay is provided by element D25 (internal circuitry shown in FIG. 3A). The delayed signal is employed in the starting switch circuit of FIG. 3 and its purpose is to delay the operation of that circuit upon the associated car entering a zone. This delay insures that a car which enters a zone and does not become assigned thereto does not stop unnecessarily at the initial landing it encounters in the zone in response to the production of a binary 0 signal along path GO (FIG. 3) before a binary 0 signal is produced along either path VHD or VLD (FIG. 9) to enable the car to continue in its established direction of travel.

A binary 0 signal is conducted along path $\overline{CAZ}$ signifying the assignment of the associated car to a zone in response to the application of a binary 1 signal along conductor path GWC (FIG. 10) or the application of a binary 0 signal along conductor path VCAZ (FIG. 8). Simultaneous with the production of a binary 0 signal along path $\overline{CAZ}$, a binary 1 signal is produced along path $\overline{VPH}$ in order to enable the hall call responsive switch (FIG. 2) to operate. In this way cars operating under a group supervisory control system are permitted to start and to continue to travel in response to hall calls only if they are assigned to a zone. Unassigned cars start and continue to travel in a particular direction only in response to the registration of car calls for landings in that direction or the existence of an unoccupied zone in that direction, although they can stop in response to hall calls at landings they encounter while traveling.

A binary 0 signal is produced along conductor path VHD or VLD to cause the operation of the higher or lower call switch (FIG. 3) in order to cause unassigned cars to run toward unOccupied zones above or below their location. The existence of an unoccupied zone above or below the location of a car causes the production of a binary 0 signal along path VHZD (FIG. 8) or $\overline{LZD1}$ (FIG. 8), respectively. These in conjunction with binary 1 signals along conductor paths $\overline{CAZ}$, $\overline{IND}$ and $\overline{FLC}$ cooperate to produce the binary 0 signal along the appropriate path VHD or VLD. Conductor path $\overline{VUZR}$ is provided on each of the circuit boards of the FIG. 9 variety notwithstanding it might not be usefully employed in a particular system as is the case in the presently disclosed one. A binary 0 signal along this path enables the operation of the higher and lower call switches in response to the existence of an unoccupied zone above or below the location of a car notwithstanding the signals along paths $\overline{CAZ}$, $\overline{IND}$ and $\overline{FLC}$ are such as to otherwise prevent the operation of these switches. The provision of path $\overline{VUZR}$ together with paths $\overline{VCAV}$, $\overline{VCIG}$ and $\overline{FLC}$ makes every board of the FIG. 9 variety identical notwithstanding these particular paths may not be employed in certain systems. Like paths $\overline{FLC}$, $\overline{VCIG}$ and $\overline{VCAV}$, path $\overline{VUZR}$ is open circuited if not usefully employed by having its circuit terminal left unconnected to any other equipment so that a binary 1 signal appears along the path.

A binary 0 signal is produced along conductor path VAU to enable the operation of the up direction establishing switch upon the production of a binary 1 signal along path CIG indicating the car is operating as a member of its group, a binary 0 signal along path $\overline{CP1}$ indicating the car is located at the main landing and a binary 1 signal along path $\overline{LD}$ indicating there is no further lower demand for the car. In those systems in which the main landing is the lowermost one, a binary 1 signal is permanently applied along conductor path $\overline{LD}$ (FIG. 9) by not connecting the circuit terminal of that path to the circuit terminal of the correspondingly designated path of FIG. 3.

The connections for conductor E1 and ground are provided to this board from the power supply of the individual car associated therewith for connection to components requiring the potentials applied along these paths.

FIGS. 10 and 11 disclose a second plurality of printed circuit boards which include those circuits utilized with a plurality of elevator cars for enabling those cars to operate as a group supervisory system. A set of boards of the FIG. 10 and FIG. 11 variety is provided for each group system and the circuitry included on these boards is common to the group and provide it with its group supervisory control circuitry.

The board shown in FIG. 10 includes circuitry sufficient for a six-car group for enabling the assignment of each of the six cars to any one of the zones of the system provided the equipment shown on FIG. 8 has produced a binary 0 signal along conductor path VRQA associated with the car. Thus, if a binary 0 signal is produced along conductor path VRQAa associated with car *a* of a group supervisory control system it causes the production of a binary 0 signal along conductor path $\overline{ASG}$a provided binary 1 signals are simultaneously being produced along conductor paths $\overline{ASG}$*b*, $\overline{ASG}$*c*, $\overline{ASG}$*d* and $\overline{ASG}$*e–f*. From this it can be seen that the assignment enabling circuit for each of the cars is interlocked with the corresponding circuit for every other car in its group so that no two cars can be assigned simultaneously. This prevents two cars from entering a particular zone at the same time and each becoming assigned to that zone. Because of the interlocking of these assignment circuits each contains a delay element D19 through D24, the internal circuitry of each of which is shown in FIG. 2C. These elements prevent a noise signal from causing a misoperation of this circuitry.

In addition to each of the assignment enabling circuits the board of FIG. 10 contains two OR circuits. Each of these receives the signal from a plurality of the assignment circuits to produce a binary 0 output when any one of its associated circuits produces a binary 0 output. One of these receives the output signals of four of the assignment circuits while the other receives the outputs of the other two of these circuits. From this it should be evident that the circuit board of FIG. 10 is suitable for a group of any number of cars up to eight, provided the appropriate number of assignment enabling circuits and OR circuits are included on the board. With seven or eight cars, of course, one or two additional assignment circuits are added to the board and the outputs of these are applied to the second OR circuit.

Lastly, the circuit board of FIG. 10 contains equipment which enables each of a plurality of cars which is to operate as a supervised group to perform independently of their normal group supervision. As can be seen from inspection a binary 1 signal applied along conductor path GWC (FIG. 10) to the corresponding path (GWC) of each of the circuit boards of the FIG. 9 variety of each car of a group produces a binary 0 signal along conductor path $\overline{CAZ}$ and a binary 1 signal along conductor path $\overline{VPH}$. This causes each car in a group to be assigned and enables each to respond to hall calls. Simultaneously the binary 1 signal along conductor path GWC (FIG. 10) causes the production of a binary 0 signal along conductor path $\overline{GWC}$ (FIG. 11). As will be explained, this latter signal causes each of the zones to assume an unoccupied status, notwithstanding one or more cars may be located in it, and thus every car in the group is enabled to respond to every hall call that is registered.

In order to produce a binary 1 signal along path GWC, a corresponding signal is transmitted along conductor path VGDH signifying the existence of a registered hall call. This causes timing circuit T7 to produce a binary 0 signal at the expiration of a predetermined period of time which in turn causes the production of the binary 1 signal along path GWC. A similar operation occurs upon the production of a binary 1 signal along path $\overline{VGWC}$. In the present system this latter path is not employed and because of this its corresponding circuit terminal is grounded so that a binary 0 signal is continuously transmitted along the path. Notwithstanding this path may not be employed in a particular system as it is not in the presently disclosed one, for purposes of standardization it and its control switch circuit terminal are provided on the circuit boards of the FIG. 10 variety of every group systems as is every one of the conductor paths that is required to make the board suitable for an eight-car group. Thus a circuit board of the FIG. 10 type for a group having a particular number of cars is interchangable with that of any other group having the same number of cars notwithstanding the two groups might operate differently in response to identical control signals from their respective associated control equipment.

Timing circuit T7 operates to produce a binary 0 signal along its output a predetermined period of time after the application of a binary 1 signal along its input. This latter signal causes transistor Q16 to start to conduct providing a charging circuit for condenser CT16. Upon the charge on this condenser reaching a predetermined amount, the potential on the base of transistor Q17 is low enough with respect to that of its emitter to cause it to start to conduct. This, in turn, causes transistors Q18 and Q19 to conduct thereby applying ground, a binary 0 signal, along the output of the timing circuit. The reset of this timing circuit is rapid. A binary 0 signal applied along the input of timing circuit T7 causes transistor Q16 to cease conduction raising its collector potential to that along path E2'. As a result condenser CT16 discharges rapidly through diode V16. This causes the potential of the base of transistor Q17 to rise and when it reaches a high enough magnitude with respect to its emitter potential it ceases conduction causing transistors Q18 and Q19 to cease conduction. Upon transistor Q19 turning off, a binary 1 signal is applied along the output of the timing circuit.

The connections for conductor paths E1', E2', and ground are provided to this board from the group power supply for connections to components requiring the potentials applied along these paths. Thus, the failure of any one of the power supplies of the individual cars does not interfere with the continued operation of the rest of the cars.

The circuits of FIG. 11 are mounted on another of the group circuit boards common to all cars in a group and includes another portion of the group supervisory control circuitry. A separate circuit board of the FIG. 11 variety is provided for every three zones of each group supervisory system. Thus for systems having more than three zones an additional board of the FIG. 11 variety is provided for each additional three zones. In those systems in which the number of zones is not a multiple of three, a circuit board similar to that shown in FIG. 11 is provided with all of the conductor paths required for three zones but with only that equipment required for one or two zones.

The circuits of FIG. 11 include control switches which generate signals which, among other things, signify the assignment of a car to each of the three associated zones, the occupation of each of the associated zones by a car, that each of the associated zones is not occupied by a car, which of the three associated zones is the lowest occupied zone and the registration of a hall call in each of the three associated zones as well as in any of the three zones.

Each of the conductor paths VGZA1, VGZA2 and VGZA3 is connected through the associated circuit terminals to the correspondingly designated conductor path shown in FIG. 8 of each of the cars in a group. Thus, the production of a binary 0 signal along any one of the paths associated with any one of the individual cars produces a binary 0 signal along the corresponding path $\overline{GZA1}$, $\overline{GZA2}$ or $\overline{GZA3}$. These signals indicate that one of the cars is assigned to the corresponding zone. As can be seen from FIG. 8 each of paths VGZA1, VGZA2 and VGZA3 of each car is connected through a diode to the equipment which produces the signals for its individual car along these paths. In this way the equipment of one car is isolated from the corresponding equipment of all other cars in a group so as to prevent each car's equipment from interfering with the proper operation of any other car's in the group.

As previously mentioned in connection with the description of the FIG. 8 circuitry, conductor paths VGZO1, VGZO2 and VGZO3 are similarly so connected to the corresponding paths of the circuit boards of the FIG. 8 variety for each car in a group to produce binary 0 signals along conductor paths $\overline{GZO1}$, $\overline{GZO2}$ and $\overline{GZO3}$ whenever a car is occupying the corresponding zone. No isolation is necessary between the equipment of each car connected to its paths VGZO1, VGZO2 and VGZO3 and the corresponding equipment of the other cars because the signals along the paths are not employed in the circuits individual to the respective cars and no interference is possible.

Conductor paths $\overline{VGZO1}$, $\overline{VGZO2}$ and $\overline{VGZO3}$ are provided on the circuit board of FIG. 11 for use with the auxiliary group control circuitry shown in FIGS. 14 and 15. Binary 0 signals along these paths cause the production of binary 1 signals along paths $\overline{GZO1}$, $\overline{GZO2}$ and $\overline{GZO3}$ to signify the absence of a car from the corresponding zone notwithstanding the individual control circuitry of one of the cars may be producing a signal along its path VGZO1, etc. which otherwise would produce a binary 0 signal along path $\overline{GZO1}$, etc. Conductor paths V$\overline{GZO1}$, etc. and their associated control switch circuit terminals are provided on each of the circuit boards of the FIG. 11 variety for standardization purposes notwithstanding auxiliary group control circuitry for connection to these paths may not be provided. In such cases the circuit terminals of these conductor paths of FIG. 11 are left unconnected to any other equipment so that binary 1 signals appear along the respective paths.

The production of a binary 1 signal along conductor path $\overline{GWC}$ in response to the registration of a hall call for a predetermined period of time as explained in connection with FIG. 10 causes the signal along each of paths $\overline{GZO1}$, $\overline{GZO2}$ and $\overline{GZO3}$ to assume the binary 1 condition, as does the application of binary 0 signals along paths V$\overline{GZO1}$, etc. Thus, each of the zones appears to be unoccupied in response to the production of the binary 0 signal along path $\overline{GWC}$.

Binary 0 signals along paths $\overline{GZO1}$, $\overline{GZO2}$ and $\overline{GZO3}$ signifying that their respective zones are not occupied cause the production of binary 1 signals along paths $\overline{GZD1}$, $\overline{GZD2}$ and $\overline{GZD3}$. Each of these is connected through appropriate circuit terminals to the correspondingly designated paths on each of the boards of the FIG. 8 variety for each car of an associated group. As explained in connection with the circuitry of FIG. 8, such signals enable the production of binary 0 signals along paths VHZD and $\overline{LZD1}$ for each car.

Similarly binary 0 signals along paths V$\overline{GZD1}$, V$\overline{GZD2}$ and V$\overline{GZD3}$ also produce binary 1 signals along paths $\overline{GZD1}$, $\overline{GZD2}$ and $\overline{GZD3}$. Conductor paths V$\overline{GZD1}$, etc. and their associated control switch circuit terminals are used with auxiliary group equipment and notwithstanding they are not usefully employed in a particular system (as is the case with the disclosed system) for standardization purposes they are provided on each of the circuit boards of the FIG. 11 variety. Where not employed, the corresponding circuit terminals are left unconnected to any other equipment so as to cause a binary 1 signal to be applied to the respective conductor paths.

Before proceeding with a description of the generation of signals along paths $\overline{GZL1}$, etc. it should be understood that conductor path $\overline{GZL4}$ on each of the circuit boards of the FIG. 11 type associated with a particular group system is connected through appropriate circuit terminals to conductor path $\overline{GZL1}$ on the circuit board associated with the next succeeding higher zone or zones. The circuit terminal of conductor path $\overline{GZL1}$ on that board which is associated with the lowest zones in each group system is left unconnected to any other equipment so that a binary 1 signal is continuously transmitted along that path.

The production of a binary 1 signal along conductor path $\overline{GZO1}$ signifying that the first zone is not occupied by a car together with the permanent binary 1 signal along path $\overline{GZL1}$ causes a binary 1 signal to be produced along path $\overline{GZL2}$. This signal is transmitted to the circuit of conductor path $\overline{GZL3}$ which in turn is connected to the circuit of conductor path $\overline{GZL4}$ so that if the second zone or second and third zones are also unoccupied binary 1 signals are also produced along conductor path $\overline{GZL3}$ or $\overline{GLZ3}$ and $\overline{GZL4}$, respectively. These paths $\overline{GZL2}$, etc. are connected through associated circuit terminals to the correspondingly designated conductor paths of the FIG. 8 variety of each of the cars of the associated group so as to enable the car assigned to the lowest occupied zone to respond to hall calls registered at landings in unoccupied zones below, as explained in connection with FIG. 8.

Binary 0 signals produced along conductor paths V$\overline{GZL2}$, V$\overline{GZL3}$ and V$\overline{GZL4}$ likewise produce binary 1 signals along paths $\overline{GZL2}$, $\overline{GZL3}$ and $\overline{GZL4}$, respectively, notwithstanding the signals along paths $\overline{GZO1}$, etc. and $\overline{GZL2}$, etc. are such as to otherwise produce binary 0 signals along paths $\overline{GZL2}$, etc. Conductor paths V$\overline{GZL2}$, etc. and their associated control switch circuit terminals are used with auxiliary group equipment and notwithstanding such auxiliary equipment is not employed in a particular system (as is the case with the instant system) conductor paths V$\overline{GZL2}$, etc. and their associated circuit terminals are provided on each of the circuit boards of the FIG. 11 variety for standardization purposes. Where not employed, the circuit terminals associated with these conductor paths are left unconnected to any other equipment so that binary 1 signals are applied along their respective conductor paths.

Conductor paths DGZ1, DGZ2 and DGZ3 are associated with the first, second and third zones, respectively. Each of these paths is connected through associated circuit terminals to conductor paths GZU1, GZD2, etc. (FIGS. 12A and 12C) of the interface circuits of each of the hall call registering devices for each landing in its associated zone. Upon the registration of a hall call at a landing in any one of the zones, say the second zone, a binary 1 signal is transmitted along the associated path, in this case DGZ2. This causes the transistor of the associate buffer amplifier B2 to conduct and produce binary 0 signals along paths $\overline{GZH2}$ and VGDH. In a similar manner the registration of a hall call at a landing in the first or third zone produces binary 0 signals along its respective path $\overline{GZH1}$ or $\overline{GZH3}$ and path VGDH. Conductor paths $\overline{GZH1}$, etc. and their associated circuit terminals are used with auxiliary group equipment and notwithstanding such auxiliary equipment is not employed in a particular system (as is the case with the presently disclosed system) these conductor paths and their associated circuit terminals are also provided on each of the circuit boards of the FIG. 11 variety for standardization purposes. Where not employed the circuit terminals associated with these conductor paths are left unconnected to any other equipment.

Each of the FIG. 11 type boards contains the same conductor paths and circuit terminals whether used for one or more zones. As a result such a board for a particular number of zones is interchangeable with any other board for the same number of zones whether the boards are in control systems which operate the same or not.

The connections for conductor paths E1′ and ground are provided to this board from the group power supply for connections to components requiring the potentials applied along these paths.

Observe that in FIGS. 10 and 11 the gates connected to paths GWC, $\overline{GZA1}$, etc., $\overline{GZO1}$, etc. and $\overline{GZL2}$, etc. are each of the power amplifier class which, as explained in connection with FIG. 3D, do not have internal resistors nor diode circuits in parallel therewith in their collector circuits. Upon a failure of these group supervisory control circuits to operate, such as would occur should the group power supply short to ground, each of these gates produce a binary 1 signal at their output rather than a binary 0 signal as would be produced if they were of the type which included internal resistors with parallel diodes in their collector circuits. From the foregoing description of the group supervisory control circuits, it should be evident that upon such a failure the production of binary 1 signals along the forementioned conductor paths enables the cars of the group to operate as individual cars entirely independently of these group circuits.

Similarly, each car of the group can operate entirely independently of the group supervisory control circuits of FIGS. 10 and 11 if such circuits should fail to some condition other than that described above and specifically to a condition in which binary 1 signals are not produced along each of paths GWC, $\overline{GZA1}$, etc., $\overline{GZO1}$, etc. and $\overline{GZL2}$, etc. Independent operation is obtained under these circumstances by disconnecting the circuit boards of FIGS. 10 and 11 from the system simply by removing them from their plug-in receptacles which will be described later in connection with FIG. 16.

FIGS. 12A through 12C show circuit boards containing interface circuits for both electronic and mechanical hall call registering devices. Each board contains six such circuits making it suitable for three intermediate landings in a typical elevator control system. Since, of course, only one hall call registering device is provided at both the lower and upper terminals, the board associated with these landings provides interface circuits for those two landings as well as two additional ones.

The interface circuits for electronic hall call registering devices are shown in FIGS. 12A and 12B. Upon the conduction of an electronic hall call registering device at a particular landing in response to the touch of a person intending to register a hall call at that landing, a signal from the device is transmitted along the corresponding path U1, D2, etc. This signal causes the actuation of the associated relay SH (FIG. 12B). Upon such actuation contacts SH1 of this relay engage to apply ground potential, i.e. a binary 0 signal, to the input of the associated power amplifier (FIG. 12A). As a result, a binary 1 signal appears along the associated conductor paths UH1 and GZU1 or DH2 and GZD2, etc. The binary 1 signal along path UH1, etc. causes the associated transistor Q20 (FIG. 12B) to conduct. This provides a circuit to ground for the associated conductor path QZU1, etc.

Conductor paths VUH1, VDH2, etc. are used with auxiliary group equipment and notwithstanding such auxiliary equipment is not employed in a particular system (as is the case with the instant system) these conductor paths and their associated circuit terminals are provided on each of the circuit boards of the FIG. 12A variety for standardization purposes. When not employed the circuit terminals associated with these conductor paths are left unconnected to any other equipment so that binary 1 signals are applied along their respective conductor paths.

The interface circuits for mechanical hall call registering devices are shown in FIG. 12C. The actuation of a mechanical hall call registering device at a particular landing by the depressing of its button by a person intending to register a hall call at that landing causes a binary 0 signal to be applied to the associated conductor path U1, D2, etc. This causes the associated neon tube NE1 to conduct from the a.c. potential applied along path E4′ to the ground established by the binary 0 signal produced by the depressing of the hall call button. As a result, the associated transistor Q22 is turned off thereby applying a binary 1 signal to its associated inverting amplifier and two input dt1 gate. This causes the associated power amplifier to produce a binary 1 signal along the associated paths UH1 and GZU1, or DH2 and GZD2, etc. In response to the binary 1 signal along path UH1, etc. the two input *dt*1 gate applies a binary 0 signal to the base of its associated transistor Q23 causing to to cease conduction. This applies the potential along path E1′ to the gate of the associated triac causing that device to conduct from its electrode MT2 to its electrode MT1. This conduction maintains the associated interface circuit in its actuated state after the intending passenger releases the hall button and in this way the call is maintained registered in the system.

The production of the binary 1 signal along path UH1, DH2, etc. in response to the registration of the associated hall call provides a circuit to ground for the associated path OZU1, QZD2, etc. on the mechanical interface circuit in the same way such a circuit to ground was provided on the electronic interface circuit.

Conductor paths VUH1, VDH2, etc. are provided on the mechanical hall call interface circuit boards for the same purpose and in the same manner as the corresponding paths are provided on the electronic hall call interface boards.

As mentioned earlier, the presently disclosed control systems include an arrangement for removing the effect of a hall call as well as an arrangement for causing the cancellation of such hall calls. In those systems containing electronic hall call registering devices, each of these functions is separate and distinct. Thus, as explained in connection with FIG. 1 the removal of a hall call registered by an electronic device results in the application of a binary 0 signal along the associated conductor path UH1, DH2, etc., whereas the cancellation of the call by the extinguishment of the associated conducting electronic device takes place as a result of the application of the signal along path UHR or DHR in conjunction with the appropriate car position signal.

With mechanical hall call registering devices the removal of a call from an elevator control system and the cancellation of that call are virtually co-incidental functions. Thus, the application of the binary 0 signal from the circuitry of FIG. 1 to the conductor path associated with the call UH1, DH1, etc. causes the associated *dt*1 gate (FIG. 12C) to apply a binary 1 signal to the base of its corresponding transistor Q23. This causes this transistor to conduct removing the potential applied along path E1′ from the gate circuit of the associated triac whereupon during the next negative half cycle of the a.c. signal applied along path E4' the triac ceases conduction causing the cancellation of the call and the extinguishment of the associated neon tube NE1.

The connections for conductor paths E1', E4' and ground are provided to the circuit boards of FIGS. 12A through 12C from the power supply common to the group associated with these circuit boards when they are provided with a group system and from the individual car power supply when they are provided for a system having only a single car.

FIGS. 13A through 13D show circuit boards containing interface circuits for electronic and mechanical car call registering devices as well as interface circuits for the position indicating means. Each of the mechanical and electronic car call interface boards includes circuits suitable for handling the car calls and the car position indicating signals for four landings.

In response to the registration of a car call for a particular landing on the electronic call registering device for that landing, a signal is applied along the associated conductor path C1, C2, etc. to the board shown in FIG. 13A. This signal causes the actuation of its associated relay ECS which thereupon closes its contacts ECS1. This applies a binary 0 signal to the associated dtl gate which as a result provides a binary 1 signal along the associated conductor path CC1, CC2, etc.

In a system with electronic car call registering devices, the location of a car at a particular landing causes its associated position indicating means to produce a binary 1 signal along the conductor path associated with that landing P1, P2, etc. Because of this, the corresponding transistor Q27 conducts and applies a binary 0 signal along the associated conductor path $\overline{CP1}$, $\overline{CP2}$, etc.

Conductor paths VC1, etc. on the electronic interface boards of the FIG. 13A variety are used with auxiliary equipment and whether or not employed in a particular system they and their associated circuit terminals are provided for standardization purposes. The circuit terminals of these paths are left unconnected to any other equipment when the auxiliary equipment with which they are employed is not provided.

Upon the registration of a car call for a particular landing on the mechanical car call registering device for that landing, a binary 1 signal is applied along the associated conductor path C1, C2, etc. of FIG. 13C. This causes the associated transistor Q25 to conduct which applies a binary 0 signal to the input of the associated five input dtl gate. As a result, a binary 1 signal is applied along the associated conductor path CC1, CC2, etc. This signal causes the associated two input dtl gate to apply a binary 0 signal to the base of its associated transistor Q24 causing that transistor to cease conduction. As a result, the binary 1 signal along path C1, C2, etc. actuates its associated relay MCS closing its contacts MCS1 to self-hold itself through the potential applied along conductor path E5. Thus, upon the release by the passenger of the button associated with the car call registering device, the potential along path E5 maintains relay MCS actuated and transistor Q25 conducting to maintain the call registered.

In a system with mechanical car call registering devices the location of a car at a particular landing also causes its associated car position indicating means to apply a binary 1 signal along the associated conductor path P1, P2, etc. This causes its associated transistor Q26 to conduct which applies a binary 0 signal along the associated path $\overline{CP1}$, $\overline{CP2}$, etc.

Conductor paths VCC1, VCC2, etc. on the mechanical interface circuit boards are provided for the same purpose and in the same manner as the corresponding conductor paths are provided on the electronic interface circuit boards.

The car position interface circuits shown in FIGS. 13A through 13D, it should be understood, are employed only with those car position indicating means, i.e. floor selector machines, which provide a continuous signal indicating the location of the car at a particular landing at which it is stopping at least from the time it approaches within stopping distance of that landing throughout the period it is stopped thereat until it is ready to leave the landing. With those selector machines which do not provide such a continuous signal (usually those provided with elevators whose speed requires a stopping distance less than one floor height) a different but similar type interface circuit is required. Those skilled in the art will understand that such a circuit would require a memory to span the period of discontinuity which occurs with such type selectors.

The connections for conductor paths E1, E5 and ground for the circuit boards shown on FIGS. 13A through 13D are provided to these circuit boards from the individual power supply for the car associated with these circuit boards.

In order now to understand how the combined control circuitry of a plural car system including both the single and plural car boards of the individual car control circuitry of each car of the system together with the group supervisory control circuitry common to all the cars of the system are used with auxiliary group circuits and auxiliary individual car circuits which alter the operation of the system consider FIGS. 14, 14A, 14B and 15.

FIG. 14 shows auxiliary group circuits which generate signals signifying the number of landing calls in registration in each of two zones in a system as well as signals signifying the average of the number of landing calls in these two zones. In response to the number of landing calls in either of the zones exceeding the average by a predetermined amount signals are generated to signify that that zone is unoccupied even though a car may be located therein and assigned thereto. This enables cars outside the zone to travel thereto to serve the landing calls registered therein.

Although circuits for only two zones are illustrated in FIG. 14 it is to be understood that in the disclosed constructed embodiment the circuit board upon which these auxiliary group circuits are contained is made with sufficient appropriate conductor paths for circuits for up to six zones. Each such circuit, if provided, includes components identical to those shown for each of the two circuits illustrated.

Each of conductor paths QZH2 and QZH3 and its associated circuitry is provided for a separate zone. These conductor paths are connected through appropriate circuit terminals to conductor paths QZU1, QZD2, etc. (FIGS. 12A and 12C) associated with each of the landing call registering means for the landings in their associated zones. Each landing call registration device is capable of producing a signal suitable to saturate the base of its associated transistor Q20 (FIG. 12A) whenever a passenger registers a corresponding landing call. Each of these signals causes its respective transistor to conduct thus providing a circuit to ground along conductor path QZU1, QZU2, etc. through its corresponding collector resistor. As a result, the resistance circuit to ground along each conductor path QZH2, QZH3 (FIG. 14) decreases as a function of the number of landing calls in registration in its respective zone.

Conductor paths QZH2 and QZH3 are connected to comparison means comprising individual comparator switching circuits S1 and S2, one for each zone. One output from each comparator switching circuit is connected to an averaging means A common to all zones. The output of the latter device is connected in a feedback arrangement to a second input of each comparator switching circuit. A second output from each comparator switching circuit is connected through individual circuitry to associated conductor paths $V\overline{GZO2}$ and $\overline{GZT2}$ or $V\overline{GZO3}$ and $\overline{GZT3}$.

Each comparator switching circuit S1 and S2 includes three transistors Q28, Q30 and Q31 (FIG. 14B). The base of each transistor Q28 is connected permanently to the potential applied along path E1'. Its emitter is connected to its associated conductor path QZH2 or QZH3 and its collector is connected through a resistor and rectifier to the potential applied along path E2'. As a result, the amount of current flowing through its collector-emitter circuit is a function of the resistance circuit to ground of its associated conductor path QZH2 or QZH3. Since, as explained, the resistance of each of these circuits decreases as a function of the number of landing calls in registration in its respective zone, the potential at the collector of each transistor Q28 also decreases as a function of the number of landing calls in its respective zone. Each collector potential is applied both to the base of its associated transistor Q30 and to the conductor path connected to the input circuit of averaging means A.

An identical resistor is connected between the circuit from transistor Q28 of each comparator switching circuit S1 and S2 to the base of transistor Q32 (FIG. 14A) of averaging means A. By selecting small resistance values for these resistors in relation to the input impedance of transistor Q32 it will be understood that the magnitude of the composite input signal to the base of transistor Q32 is equal to the average magnitude of the individual input signals of comparator switching circuits S1 and S2. With the circuit configuration shown for transistors Q32 and Q33 (FIG. 14A) they operate as amplifiers to generate a voltage at the emitter of transistor Q33 which is a function of the average of the number of landing calls in registration in each of the zones. As this average increases, the magnitude of this emitter voltage decreases.

Transistor Q34 operates to decrease the voltage produced at the emitter of transistor Q33 and thus the voltage produced at the emitter of transistor Q35 which decreases are of a predetermined amount depending upon the magnitude of the resistance in the emitter circuit of transistor Q34. This produces a threshold voltage at the output of averaging means A which is a function of the average of the number of hall calls in registration in each of the zones plus some predetermined number of landing calls which as will be understood can be a whole integer or some fractional part thereof.

The threshold voltage at the output of averaging means A is transmitted back to a second input circuit of each of the comparator switching circuits S1 and S2. In each it is applied to the emitter of its associated transistor Q30. The base of each of these transistors as mentioned before is connected to the collector of its associated transistor Q28 whose voltage is an inverse function of the number of landing calls in its respective zone. Thus, if the number of landing calls in a particular zone, say that associated with conductor path QZH2, is greater by the forementiond predetermined number than the average number of landing calls, the base of transistor Q30 of comparator switching circuit S1 is at a lower potential than its emitter, enabling it to conduct. This applies a signal from its collector to the base of transistor Q31 enabling it also to conduct. As a result, the comparator switching circuit S1 presents a virtual ground to its associated inverting amplifier causing it to produce a binary 1 signal. This, in turn, produces binary O signals along conductor paths $V\overline{GZ02}$ and $\overline{GZT2}$. The binary 0 signal along path $V\overline{GZ02}$, as explained in connection with FIG. 11 causes the production of a binary 1 signal along path $\overline{GZ02}$ signifying the second zone is unoccupied. This and the binary 0 signal along path $\overline{GZD2}$ resulting therefrom are transmitted to the FIG. 8 board of each car to enable cars outside the second zone to start in response to hall calls registered therein or in response to the fact that it is an unoccupied zone. The effect of the binary 0 signal along path $\overline{GZT2}$ will be explained hereinafter in connection with FIG. 15.

The connections for conductor paths E1', E2' and ground for the circuit board of FIG. 14 is provided from the common power supply for its associated group of elevators.

FIG. 15 shows auxiliary individual car circuits which generate a binary 0 signal along path VCAZ signifying that a car is assigned to a zone whenever it is located therein as signified by the production of a binary 1 signal along path ZP2, ZP3, etc. and the number of hall calls in that zone exceeds the average by a predetermined amount as signified by the product of a binary 0 signal along path $\overline{GZT2}$, $\overline{GZT3}$, etc. It is to be understood that the auxiliary individual car circuits shown in FIG. 15 are contained on a circuit board which is provided individually for each car of a particular group supervisory system which is to perform in accordance with the optional operation provided by the auxiliary equipment of FIGS. 14 and 15. Further, it is to be understood that even through circuits for only two zones are illustrated in FIG. 15 the circuit board upon which these circuits are contained in the disclosed constructed embodiment is made with sufficient appropriate conductor paths for circuits up to six zones. Each such circuit if provided includes components identical to those shown for each of the two circuits illustrated.

It should be evident to those skilled in the art that the diode in path VCAZ (FIG. 15) isolates the equipment to which that path is connected from the equipment to which the identically designated path in FIG. 8 is connected.

The connections for conductor paths E1 and ground for circuit boards of the FIG. 15 type are provided from the power supply individual to their associated cars.

It should also be understood that a failure of the auxiliary group circuits such that binary 1 signals are produced along all paths $\overline{VGZ02}$ and $\overline{GZT2}$, etc. has no effect on the operation of the group supervisory control circuits. If a failure of another nature occurs such that binary 1 signals are not produced along all these paths but owing to the failure binary 0 signals are produced on some or all the board of FIG. 14 is removable by unplugging it from its plug-in receptacle which enables the system to operate as if the option provided by this board and those of the FIG. 15 variety had never been provided.

Likewise a failure of the FIG. 15 type board of one of the cars of a group permits that car to continue to operate albeit not subject to the optional operation provided by the FIG. 14 and FIG. 15 type boards if the failure is such as to produce a binary 1 signal along path VCAZ or if the FIG. 15 board is removed should the failure produce a binary 0 signal along path VCAZ.

FIG. 16 shows a partial representation of a printed circuit board 10 used in systems constructed in accordance with this invention together with a plug-in type receptacle 12 with parts cut away for use with such a circuit board. Each of these printed circuit boards has a plurality of electrical components 14 which are interconnected by conductor paths 16. In additions, some of these components are connected by way of conductor paths to male circuit terminals 18 on their respective boards. Male circuit terminals on each board are inserted into female circuit terminals 20 on the receptacle 12 associated with the board. These female terminals terminate in leads (not shown) which permit wires 22 to be connected thereto so that components on different boards may be connected together by wires which join their respective circuit terminals together. This type of connection by means of a plug-in receptacle, of course, enables each circuit board to be readily disconnected from the system by simply removing its male terminals from the female terminals of its associated receptacle.

The block diagram of FIG. 17 is presented as an aid in the presentation of a recapitulation of the disclosure. In elevator systems constructed in accordance with the present invention, as in standard electric traction elevator systems, each elevator car CA and its counterweight CW are supported by ropes R from a traction sheave SH. This sheave rotates to move the car whenever its brake BR is released and its motor (not shown) is enabled to rotate. Each system is provided with associated control equipment including motor control equipment MCE for each car, which may be of any well-known construction, a car position indicating means CPIM for each car, normally referred to as a landing selector machine, hall call registering devices HCRD common to the system, and car carried control equipment CCRD for each car, comprising car call registering devices, door control means and miscellaneous optional control mechanism including door open and close buttons, attendant operation switches, etc.

According to the present invention each car which operates alone in a single car system is also provided with a first plurality of single car printed circuit boards ECL, the circuitry on each of which is connected through appropriate circuit terminals to each other and to the control equipment associated with their respective car. The basic control circuitry, or controlling switching logic circuitry, formed by these interconnected boards operates in a predetermined manner in response to control signals it receives from the associated control equipment to control its car according to a particular mode of operation. For standardization this circuitry of each car includes control switches on its various circuit boards which are connected by conductor paths to control switch circuit terminals notwithstanding such conductor paths are not required for the boards to operate in their predetermined manner.

For each single car which is to operate in a manner different than according to said particular mode of operation, an additional or auxiliary circuit board or boards ACL are provided. These boards of each such car are connected through appropriate circuit terminals to the associated control equipment and to circuit terminals of the first plurality of circuit boards including control switch circuit terminals. In this way without changing the connections between the various boards of the first plurality or the connections between those boards and the associated control equipment, the basic control circuitry of a particular car is caused to operate differently than in said predetermined manner to control its car differently than according to said particular mode of operation in response to the same control signals which without said auxiliary board or boards caused said circuitry to operate in said predetermined manner to control said car according to said particular mode of operation.

From this it should be understood that corresponding ones of the first plurality of circuit boards are interchangeable from one car's system to another even through one system may be provided with an auxiliary circuit board or boards and the other may not or the two systems may be provided with the same auxiliary circuit board or boards or with different ones. It is also to be understood that the auxiliary board or boards provided with any car are removable simply by unplugging them without affecting the ability of the first plurality of boards to operate in the predetermined manner to control that car in accordance with said particular mode of operation.

To enable each car which is to operate as a member of a group system to so operate, plural car circuit boards GECL are added to the single car boards to form the first plurality of circuit boards for each such car. These boards like the single car boards also include control switches which, for standardization purposes, are connected by conductor paths on their associated circuit boards to control switch circuit terminals even though such conductor paths are not required for the circuitry of the boards to serve its primary purpose of cooperating with the circuitry of the single car boards and enabling an associated car to operate as a member of a group system. For each car the individual car control circuits on these single and plural car boards are connected through appropriate circuit terminals to each other and to the associated control equipment of its respective group which includes not only the hall call registering devices which in a group system are common to all cars in the group but also the associated control equipment of its respective car. (Primarily the interconnections between the single car boards of each car are the same as they would be if the car was operating in a single car system with only two exceptions made to accommodate the group operation.)

Notwithstanding the addition of said plural car boards to said single car boards and the interconnections therebetween, each group of said boards operates to control its associated car in response to control signals from associated control equipment in the same manner as said single boards alone would in response to the same control signals if interconnected as they would be for a single car system.

For each group of cars a second plurality of printed circuit boards EGL are provided to control the cars as a supervised group. These boards are connected together and to the first plurality of circuit boards of each car in the group through respective circuit terminals. Specifically, the second plurality of circuit boards are connected only to the plural car circuit boards of the first plurality of each group car and vice versa. Although none of the connections between the various boards of the first plurality of each group car and between those boards and the associated control equipment of each car and the hall call registering devices are altered, the second plurality of boards comprise group supervisory control circuitry which when connected to the first plurality of each car of its group operates said group in accordance with a predetermined group supervisory mode of operation.

From the foregoing it should be understood that the second plurality of boards of any group forming the group supervisory control circuitry are removable simply by unplugging them without affecting the ability of the first plurality of boards forming the individual car control circuitry of any car in the group to operate in response to control signals in said predetermined manner to control its associated car in said particular mode of operation as it would be controlled in response to the same control signals in a single car system.

For standardization the second plurality of printed circuit boards associated with each group includes group control switches which are connected by conductor paths on their associated circuit boards to group control switch circuit terminals even though such conductor paths are not required for the boards to comprise group supervisory control circuitry capable of controlling a group in accordance with said predetermined mode of operation.

For each group of cars operating as a group supervised control system which is to operate differently than in accordance with said predetermined mode of operation, an additional or auxiliary group circuit board or boards AGL are provided. These boards of each such group are connected through appropriate circuit terminals to the control equipment associated with the group and to the circuit terminals of the second plurality of circuit boards of the group including group control switch terminals. Thus without changing the connections between the various boards of the associated second plurality or the connections between those boards and the control equipment of the group, the group supervisory control circuitry is caused to operate to control its associated group differently than according to said predetermined mode.

In addition each car of each group which is to operate differently than according to said predetermined mode may be provided with auxiliary individual car circuits GACL. These are mounted on an additional board or boards for each car and are connected through appropriate circuit terminals to the associated auxiliary group circuitry and to the control switch circuit terminals of the individual car control circuits of its associated car to enable that car to operate as a member of its supervised group when that group is operating differently than according to its predetermined mode of operation.

It is understood, of course, that both the auxiliary group circuit boards and the auxiliary individual car circuits are removable by unplugging them from their associated system without affecting the ability of the first and second plurality of circuit boards to control an associated group in accordance with said predetermined mode of operation. From this it should also be evident that corresponding ones of the first and second plurality of circuit boards of one car and system, respectively, are interchangeable with those of another car and system notwithstanding the cars and systems are operable in different modes in response to identical control signals.

Various modifications of the present invention are possible. For example, in differently operating control systems more or fewer control switch terminals and associated conductor paths may be desirable for standardization purposes such that the circuitry of such systems corresponding to what is herein referred to as the circuitry of the first plurality of circuit boards may be more or less different. Nevertheless if the control switches whose operation it is desired to change under optional operating conditions are properly selected and conductor paths and circuit terminals are provided on the associated circuit boards so that auxiliary signals can be transmitted to such switches which signals are capable of controlling the operation of such switches, the flexibility possessed by the presently disclosed systems and apparatus will be possessed by those different systems also. For these reasons what is described and shown herein is intended to be in no way exclusive or limiting but is to be considered illustrative only.

What is claimed is:

1. A control system for a conveyor car serving a plurality of stops, said system operating in response to control signals produced by associated control equipment including call registering devices and car position indicating means, comprising a plurality of electrical conductors, a first plurality of solid state circuit components interconnected by electrical conductors and forming controlling switching means having a plurality of circuit terminals, predetermined ones of which are connected by said conductors to predetermined ones of said first plurality of solid state components and to said associated control equipment to receive the control signals produced thereby, predetermined others of said circuit terminals also being connected by electrical conductors to said first plurality of solid state components, said other circuit terminals and their associated conductors being unnecessary for said controlling switching means to be operable in said predetermined manner, said controlling switching means when so connected operating in a predetermined manner in response to said control signals to control said car to serve said stops according to a particular mode of operation, a second plurality of solid state circuit components interconnected by electrical conductors and forming auxiliary switching means, wherein electrical conductors also connect the auxiliary switching means to certain of said circuit terminals and to said associated control equipment and transmit signals therebetween which cause said controlling switching means to operate in response to the same control signals in a manner different from said predetermined manner and to control said car differently than according to said particular mode of operation notwithstanding the interconnections between said first plurality of solid state components and the connections from said first plurality of solid state components to said circuit terminals remain unaltered and said circuit terminals receive said same control signals.

2. A control system according to claim 1, wherein said call registering devices include hall call registering devices located at said stops and said controlling switching means includes a hall call stop switch which operates to stop said car in response to registered hall calls according to said particular mode of operation, and one of said other circuit terminals is connected to said hall stop switch whereby a signal applied thereto prevents said switch from operating to stop said car.

3. A control system according to claim 2, wherein electrical conductors connect said auxiliary switching means to the other circuit terminal connected to said hall stop switch whereby the operation of said auxiliary switching means prevents said hall stop switch from operating notwithstanding that part of the controlling switching means which otherwise operates to cause said hall stop switch to operate to stop said car has so operated.

4. A control system according to claim 1, wherein said associated control equipment includes door means which opens and closes to permit passenger transfers and wherein said controlling switching means includes a door time switch which according to said particular mode of operation operates a predetermined time after the door means opens to enable it to close, and one of said other circuit terminals is connected to said door time switch whereby a signal applied thereto delays the operation of said switch for a period longer than said predetermined time.

5. A control system according to claim 4, wherein an electrical conductor connects said auxiliary switching means to the other circuit terminal connected to said door time switch whereby the operation of the auxiliary switching means delays said door time switch from operating for a period after the door means opens longer than said predetermined time.

6. A control system according to claim 3, wherein said associated control equipment includes door means which opens and closes to permit passenger transfers and wherein said controlling switching means includes a door time switch which according to said particular mode of operation operates a predetermined time after the door means opens to enable it to close, and one of said other circuit terminals is connected to said door time switch whereby a signal applied thereto delays the operation of said switch for a period longer than said predetermined time.

7. A control system according to claim 6, wherein an electrical conductor connects said auxiliary switching means to the other circuit terminal connected to said door time switch whereby the operation of the auxiliary switching means delays said door open time switch from operating for a period after the door means opens longer than said predetermined time.

8. A control system according to claim 7, wherein a second one of said other circuit terminals is also connected to said door time switch whereby a signal applied thereto delays the operation of said switch for a still longer period than said previously mentioned period.

9. A control system according to claim 8, wherein one of said predetermined ones of said circuit terminals is also connected to said door time switch whereby a signal applied thereto operates said switch prior to the elapse of said predetermined time.

10. A control system according to claim 4, wherein said controlling switching means includes a door open switch which operates to a first condition to cause the door means to open and operates to a second condition in response to the operation of said door time switch to cause the door means to close, and one of said other circuit terminals is connected to said door open switch whereby a signal applied thereto causes said door open switch to remain in its first condition notwithstanding said door time switch has operated.

11. A control system according to claim 1, wherein said controlling switching means includes a start switch which operates to enable said car to start according to said particular mode of operation, and one of said predetermined ones of said circuit terminals is connected to said start switch whereby a signal applied thereto operates said switch to enable said car to start differently than according to said particular mode of operation.

12. A control system according to claim 11, wherein said controlling switching means includes an auxiliary start switch which operates when said controlling switching means is operating in said predetermined manner to cause said start switch to operate and one of said other circuit terminals is connected to said auxiliary start switch whereby a signal applied thereto prevents said auxiliary start switch from operating.

13. A control system according to claim 1, wherein said conveyor car is an elevator car and said controlling switching means includes a higher call switch which operates in response to the registration of a call above the location of the car, and one of said other circuit terminals is connected to said higher call switch whereby a signal applied thereto causes the operation of said higher call switch notwithstanding a call is not in registration above the location of the car.

14. A control system according to claim 1, wherein said conveyor car is an elevator car and said controlling switching means includes a lower call switch which operates in response to the registration of a call below the location of the car, and one of said other circuit terminals is connected to said lower call switch whereby a signal applied thereto causes the operation of said lower call switch notwithstanding a call is not in registration below the location of the car.

15. A control system according to claim 1, wherein said conveyor car is an elevator car and said controlling switching means includes an up direction establishing switch which operates in response to particular conditions when said controlling switching means is operating in said predetermined manner to establish the up direction as the direction of travel for said car, and one of said other circuit terminals is connected to said up direction establishing switch whereby a signal applied thereto operates said up direction establishing switch to establish the up direction of travel for said car notwithstanding said particular conditions do not exist.

16. A control system according to claim 1, wherein said conveyor car is an elevator car and said controlling switching means includes a down direction establishing switch which operates in response to particular conditions when said controlling switching means is operating in said predetermined manner to establish the down direction as the direction of travel for the car, and one of said other circuit terminals is connected to said down direction establishing switch whereby a signal applied thereto operates said down direction establishing switch to establish the down direction of travel for said car notwithstanding said particular conditions do not exist.

17. A control system according to claim 1, wherein said controlling switching means includes a call stop switch which operates to enable said car to stop in response to registered calls according to said particular mode of operation and one of said predetermined ones of said circuit terminals is connected to said call stop switch whereby a signal applied thereto prevents said switch from operating to enable said car to stop.

18. A control system according to claim 17, wherein said controlling switching means includes an auxiliary call stop switch which operates under certain conditions when said controlling switching means is operating in said predetermined manner to cause said call stop switch to operate and one of said predetermined ones of said circuit terminals is connected to said auxiliary call stop switch whereby a signal applied thereto causes said auxiliary call stop switch to operate notwithstanding said certain conditions do not exist.

19. A control system according to claim 1, wherein said controlling switching means includes a direction maintaining switch which operates when said controlling switching means is operating in said predetermined manner to maintain an established direction of travel for said car so that it operates according to said particular mode of operation and one of said predetermined ones of said circuit terminals is connected to said direction maintaining switch whereby a signal applied thereto prevents said switch from operating notwithstanding the conditions are such that it otherwise would so operate in accordance with the predetermined manner of operation of said controlling switching means.

20. A control system according to claim 2, wherein said controlling switching means includes a hall call responsive switch which operates to enable said car to travel in response to hall calls according to said particular mode of operation, and one of said other circuit terminals is connected to said hall call responsive switch whereby a signal applied thereto prevents said switch from operating.

21. A control system according to claim 1, wherein said controlling switching means includes predetermined switches, each of which has an input connected to one of said other circuit terminal through an electrical conductor which enables auxiliary switching means to be connected thereto.

22. A control system according to claim 21, wherein a predetermined switch is capable of being connected through associated electrical conductors to more than one of said second solid state circuit components.

23. A control system for an elevator car serving a plurality of landings in response to control signals produced by associated control equipment including call registering devices and a car position indicating means, comprising a plurality of printed circuit boards, each board including a plurality of printed circuit conductor paths and a plurality of electrical components mounted thereon interconnected by associated conductor paths and forming controlling switching circuits, each board also including a plurality of circuit terminals connected to various ones of the switching circuits of its associated board by conductor paths associated with said board, wiring means interconnecting the controlling switching circuits of different boards through respective circuit terminals and also connecting said circuits through said terminals to receive the control signals produced by said associated control equipment thereby forming elevator control circuitry which operates in a particular manner in response to said control signals to control said car, said elevator control circuitry including control switches and wherein said circuit terminals include control switch terminals connected by conductor paths on their associated printed circuit boards to control switches mounted thereon whereby said control switches have the capacity to be connected through said control switch terminals to auxiliary switching circuits by auxiliary wiring means so that without altering said elevator control circuitry it can be made capable of operating in response to the same control signals produced by said call registering devices and said car position indicating means in a manner different from said particular manner.

24. A control system according to claim 23, wherein said control switches include starting and stopping switches which operate according to said particular manner in response to said control signals to enable the car to start and to stop and wherein individual conductor paths connect said starting and stopping switches to individual control switch terminals.

25. A control system according to claim 24, wherein said control switches include up and down direction establishing switches which operate according to said particular manner in response to said control signals to establish the up and the down direction, respectively, as the preferred direction of travel for the car and wherein individual conductor paths connect the up direction establishing switch and the down direction establishing switch to individual control switch terminals.

26. A control system according to claim 25, wherein said control switches include higher and lower call switches which operate according to said particular manner in response to said control signals to indicate the registration of a call above and below the location of the car, respectively, and wherein individual conductor paths connect the higher call switch and the lower call switch to individual control switch terminals.

27. A control system according to claim 26, wherein said associated control equipment includes door means which opens and closes to permit passenger transfer and wherein said control switches include a door open switch which operates according to said particular manner in response to said control signals to cause the door means of said car to open and a control switch terminal is connected to said door open switch by an individual conductor path.

28. A control system according to claim 27, wherein said control switches include a door time switch which operates according to said particular manner in response to said control signals to maintain said door means open for a predetermined period and a control switch terminal is connected to said door time switch by a conductor path on its associated printed circuit board.

29. A control system according to claim 28, wherein said call registering devices include hall call registering devices and said stopping switches include a call stop switch and a hall call stop switch which operate according to said particular manner in response to said control signals to enable said car to stop in response to calls and in response to hall calls, respectively, and individual conductor paths connect the call stop switch and the hall call stop switch to individual control switch terminals.

30. A control system according to claim 29, wherein said control switches include a direction maintaining switch which operates according to said particular manner in response to said control signals to maintain an established direction of travel for the car and a control switch terminal is connected to said direction maintaining switch by an individual conductor path.

31. A control system according to claim 30, wherein said elevator control circuitry includes a hall call responsive switch which operates according to said particular manner to enable said higher and lower call switches to operate in response to hall calls and a control switch terminal is connected to said hall call responsive switch by a conductor path on its associated printed circuit board.

32. A control system according to claim 31, wherein said starting switches include a start switch and an auxiliary start switch each of which operates according to said particular manner in response to said control signals to enable said car to start and individual conductor paths connect said start switch and said auxiliary start switch to individual control switch terminals.

33. A control system according to claim 32, wherein said control switches include an auxiliary call stop switch which operates according to said particular manner in response to said control signals to enable said car to stop in response to calls and a control switch terminal is connected to said auxiliary call stop switch by a conductor path on its associated printed circuit board.

34. A control system for an elevator car serving a plurality of landings in response to control signals produced by associated control equipment including call registering devices and a car position indicating means, comprising a plurality of printed circuit boards, each board including a plurality of printed circuit conductor paths and a plurality of electrical components mounted thereon interconnected by associated conductor paths which transmit signals between said components, each board also including a plurality of circuit terminals connected to various ones of the electrical components of its associated board by conductor paths associated with said board, wiring means interconnecting the electrical components of different boards through respective circuit terminals and transmitting signals therebetween, said wiring means also connecting said electrical components through said terminals to receive said control signals thereby forming controlling switching logic circuits for said car operable in a particular manner in response to said control signals to control said car, said controlling switching logic circuits including a plurality of control switches which operate in response to signals they receive while said controlling switching logic circuits are operating in said particular manner, and wherein said circuit terminals include control switch terminals connected by conductor paths on their associated printed circuit boards to control switches mounted thereon whereby said control switches are capable of receiving through said control switch terminals and of operating in response to a plurality of auxiliary signals in addition to the signals they receive while said controlling switching logic circuits are operating in said particular manner.

35. A control system according to claim 34, including auxiliary switching logic circuits for generating said auxiliary signals and auxiliary wiring means connecting said auxiliary switching logic circuits to said associated control equipment and to control switch terminals of said controlling switching logic circuits for transmitting said auxiliary signals thereto, wherein the auxiliary switching logic circuits include unidirectional conducting devices, one each of which is connected in predetermined ones of the auxiliary circuits which are connected by the auxiliary wiring means to predetermined ones of said control switch terminals, whereby one auxiliary circuit which generates an auxiliary signal which is transmitted through said auxiliary wiring means to a particular control switch terminal is isolated from any other auxiliary circuit which generates an auxiliary signal which is transmitted through said auxiliary wiring means to said particular control switch terminal.

36. A control system according to claim 35, wherein said associated control equipment includes door means which opens and closes to permit passenger transfers, and wherein while said controlling switching logic circuits are operating in said particular manner the car is controlled to operate as an attendantless single car collective elevator which starts in response to and answers every registered call as it encounters the landings for which the calls are registered and in answering each the door means opens and is maintained open for a predetermined period of time.

37. A control system according to claim 36, wherein said auxiliary switching logic circuits include at least one auxiliary printed circuit board including a plurality of printed circuit conductor paths and a plurality of electrical components mounted thereon interconnected by associated conductor paths, said board also including a plurality of circuit terminals connected to various ones of the electrical components of said board by conductor paths associated therewith and wherein said auxiliary wiring means connects both control switch terminals and other circuit terminals of the printed circuit boards of said controlling switching logic circuits to circuit terminals of said auxiliary circuit board and transmits signals therebetween.

38. A control system according to claim 37, wherein the electrical components of said auxiliary switching logic circuits include auxiliary control switches having output terminals, predetermined ones of which are connected by separate associated conductor paths to two of said unidirectional conducting devices.

39. A control system according to claim 38, wherein the control switches of said controlling switching logic circuits which are connected to said predetermined control switch terminals are transistor logic switches having expander nodes which are connected to said predetermined control switch terminals.

40. A control system according to claim 39, wherein said transistor logic switches having expander nodes are integrated circuit modules of the diode transistor class.

41. A control system according to claim 34, including auxiliary switching logic circuits for generating said auxiliary signals and auxiliary wiring means connecting said auxiliary switching logic circuits to said associated control equipment in predetermined circumstances and to control switch terminals of said controlling switching logic circuits for transmitting said auxiliary signals thereto which cause said control switches to operate in a manner differently than when said controlling switching logic circuits are operating in said particular manner.

42. A control system according to claim 41, wherein said controlling switching logic circuits are operable in said particular manner in response to said control signals notwithstanding the failure of said auxiliary switching logic circuits to operate.

43. A control system according to claim 41, wherein said controlling switching logic circuits are operable in said particular manner notwithstanding the failure of said auxiliary switching logic circuits to a first condition and wherein said auxiliary switching logic circuits are removably connected to said controlling circuits whereby if said auxiliary circuits fail to a second condition they are readily disconnectable without disturbing said controlling circuits whereupon said controlling circuits are operable in said particular manner.

44. A control system according to claim 43, including a plug-in receptacle to which said auxiliary wiring means is connected and wherein said auxiliary switching logic circuits include at least one auxiliary printed circuit board including a plurality of printed circuit conductor paths and a plurality of electrical components mounted thereon interconnected by associated conductor paths, said board also including a plurality of circuit terminals connected to various ones of the electrical components of said board by conductor paths associated therewith, said plug-in receptacle removably receiving said circuit terminals whereby said auxiliary switching logic circuits are disconnected by removing said circuit terminals from said receptacle.

45. A control system for a conveyor car serving a plurality of stops in response to control signals produced by associated control equipment including call registering devices and a car position indicating means, said system comprising a plurality of printed circuit boards, each board including a plurality of printed circuit conductor paths and a plurality of electrical components mounted thereon interconnected by associated conductor paths which transmit signals between said components, each board also including a plurality of circuit terminals connected to various ones of the electrical components of its associated board by conductor paths associated with said board, wiring means interconnecting the electrical components of different boards through respective circuit terminals and transmitting signals therebetween, said wiring means also connecting said electrical components through said terminals to receive said control signals thereby forming controlling switching logic circuits for said car operable in a particular manner in response to said control signals to control said car, auxiliary switching logic circuits, auxiliary wiring means connecting said auxiliary switching logic circuits to circuit terminals of said controlling switching logic circuits and under predetermined conditions to said associated control equipment thereby transforming the operation of said controlling switching logic circuits in response to said control signals to a manner different from said particular manner, said controlling switching logic circuits being operable in said particular manner in response to said control signals notwithstanding the failure of said auxiliary switching logic circuits to operate to a first condition, said auxiliary switching logic circuits being removably connected to said controlling circuits so that if said auxiliary circuits fail to a second condition they are readily disconnectable without disturbing said controlling circuits whereupon said controlling circuits are operable in said particular manner.

46. A control system according to claim 45, including a plug-in receptacle to which said auxiliary wiring means is connected and wherein said auxiliary switching logic circuits include at least one auxiliary printed circuit board including a plurality of printed circuit conductor paths and a plurality of electrical components mounted thereon interconnected by associated conductor paths, said board also including a plurality of circuit terminals connected to various ones of the electrical components of said board by conductor paths associated therewith, said plug-in receptacle removably receiving said circuit terminals whereby said auxiliary switching logic circuits are disconnected by removing said circuit terminals from said receptacle.

47. A control system for a plurality of elevator cars serving a plurality of landings in response to control signals produced by hall call registering devices common to the cars as well as car call registering devices and car position indicating means individual to each car, comprising individual car switching logic circuits individual to each car, group switching logic circuits common to the cars connected to each of the individual car switching logic circuits and together controlling said cars to operate in response to said control signals as a supervised group according to a predetermined mode, wherein each of said individual car switching logic circuits is operable by itself without cooperating with any of said group switching logic circuits to control its associated car to operate in a particular manner in response to the control signals produced by said hall call registering devices and its associated car call registering devices and car position indicating means upon the failure of said group switching logic circuits to operate in their intended manner.

48. A control system according to claim 47, wherein each of said individual car switching logic circuits is operable to control its associated car in said particular manner upon the failure of said group switching logic circuits to a first condition and wherein said group switching logic circuits are removably connected to each of said individual car switching logic circuits whereby if said group switching logic circuits fail to a second condition they are readily disconnectable without disturbing any of said individual car switching logic circuits whereupon each of said individual car switching logic circuits is operable to control its associated car in said particular manner.

49. A control system according to claim 48, including group wiring means connecting said group switching logic circuits to each of said individual car switching logic circuits and a plug-in receptacle to which said group wiring means is connected and wherein said group switching logic circuits include at least one printed circuit board including a plurality of printed circuit conductor paths and a plurality of electrical components mounted thereon interconnected by associated conductor paths, said board also including a plurality of circuit terminals connected to various ones of the electrical components of said board by conductor paths associated therewith, said plug-in receptacle removably receiving said circuit terminals whereby said group switching logic circuits are disconnected by removing said circuit terminals from said receptacle.

50. A control system for a plurality of conveyor cars serving a plurality of stops in response to control signals produced by associated control equipment including call registering devices for said stops and car position indicating means individual to each car, comprising one set of a first plurality of electrical components for each car, a first plurality of electrical conductors for each car interconnecting said associated first plurality of electrical components and connecting them to said associated control equipment to receive said control signals thereby forming individual car control circuitry, each operable in a predetermined manner in response to said control signals to control its associated car, a second plurality of electrical components common to the cars, and a second plurality of electrical conductors interconnecting said second plurality of electrical components and forming group supervisory control circuitry, said second plurality of electrical conductors also connecting said group supervisory control circuitry to each said individual car control circuitry which together and with said cars and said associated control equipment comprise a group supervisory control system which performs particular operations in response to said control signals to control said cars as a supervised group according to a predetermined mode, and wherein the connections between said group supervisory control circuitry and each said individual car control circuitry causes each of the latter to operate in response to the same control signals in a manner different from said predetermined manner notwithstanding the associated interconnections between the first plurality of electrical components of each said individual car control circuitry and the connections between each said individual car control circuitry and said associated control equipment remain unaltered.

51. A control system according to claim 50, including a plurality of group printed circuit boards for said group upon which are mounted said second plurality of electrical components and wherein said second plurality of electrical conductors include both printed circuit conductor paths on each of said plurality of group printed circuit boards interconnecting the electrical components on each board and group wiring means, each of said group printed circuit boards including a plurality of group circuit terminals connected to various ones of the electrical components of its associated board by conductor paths on said board, said group wiring means being connected to respective group circuit terminals thereby interconnecting the electrical components on different boards and connecting the group supervisory control circuitry to each said individual car control circuitry, said group supervisory control circuitry including group control switches which are connected through respective conductor paths to receive group signals from the rest of said group supervisory control system while it is cooperating with each said individual car control circuitry to control said cars as a supervised group according to said predetermined mode, said group circuit terminals including group control switch terminals connected by conductor paths on their associated printed circuit boards to group control switches mounted thereon whereby said group control switches are capable of receiving through said group control switch terminals and of operating in response to a plurality of auxiliary group signals in addition to the group signals they receive while said cars are controlled to operate as a supervised group according to said predetermined mode.

52. A control system according to claim 51, including auxiliary group circuitry common to all cars and auxiliary group wiring means connecting said associated control equipment to said auxiliary group circuitry to enable it to generate said auxiliary group signals and connecting said group control switches through said group control switch terminals to said auxiliary group circuitry to enable it to transmit said auxiliary signals to said group control switches which cause them to operate to control said cars as a supervised group in a manner different than according to said predetermined mode.

53. A control system according to claim 52, wherein said auxiliary group circuitry includes at least one auxiliary printed circuit board including a plurality of printed circuit conductor paths and a plurality of electrical components mounted thereon interconnected by associated conductor paths, said auxiliary board also including a plurality of circuit terminals connected to various ones of the electrical components of said auxiliary board by conductor paths associated therewith and wherein said auxiliary group wiring means connects circuit terminals of said auxiliary group circuitry to group control switch terminals as well as to said associated control equipment.

54. A control system according to claim 52, wherein each said individual car control circuitry includes a plurality of individual car printed circuit boards upon which are mounted one set of said first plurality of electrical components and wherein each of said first plurality of electrical conductors include both printed circuit conductor paths on each of the associated plurality of individual car printed circuit boards interconnecting the electrical components on each said board and individual car wiring means, each said individual car printed circuit board for each car including a plurality of individual car circuit terminals connected to various ones of the electrical components of its associated board by conductor paths on said board, said individual car wiring means for each car being connected to respective individual car circuit terminals thereby interconnecting the electrical components on different individual car boards for that car, each said individual car control circuitry including car control switches which are connected through respective conductor paths to receive individual car signals from the rest of its associated individual car control circuitry and from said group supervisory control circuitry while it is operating as a member of said supervised group according to said predetermined manner, said individual car circuit terminals for each car including individual car control switch terminals connected by conductor paths on the associated individual car printed circuit boards to car control switches mounted thereon whereby said car control switches for each car are capable of receiving through their associated individual car control switch terminals and of operating in response to a plurality of auxiliary individual car signals in addition to the individual car signals they receive while their associated car is operating as a member of said supervised group according to said predetermined mode.

55. A control system according to claim 54, including auxiliary individual car circuits for each car and auxiliary individual car wiring means for each car connecting said auxiliary group circuitry to the associated auxiliary individual car circuits to enable them to generate said auxiliary individual car signals and connecting associated individual car control switch terminals to the associated auxiliary individual car circuits to enable them to transmit the associated auxiliary individual car signals to said associated individual car control switches, wherein the auxiliary individual car circuits for each car includes a unidirectional conducting device which is connected in the associated auxiliary individual car circuits which are connected through the auxiliary wiring means to the associated individual car control switch terminals, whereby an auxiliary individual car circuit which generates an auxiliary individual car signal which is transmitted through such auxiliary individual car wiring means to a particular individual car control switch terminal is isolated from any other circuit which generates a signal which is transmitted to said particular individual car control switch terminal.

56. A control system according to claim 55, wherein each said auxiliary individual car circuits includes at least one auxiliary individual car printed circuit board including a plurality of printed circuit conductor paths and a plurality of electrical components mounted thereon interconnected by associated conductor paths, each said board for each car also including a plurality of circuit terminals connected to various ones of the electrical components of said board by conductor paths associated therewith and wherein said auxiliary individual car wiring means for each car connects circuit terminals of its associated auxiliary individual car circuits to individual car control switch terminals as well as other individual car circuit terminals of said individual car control circuitry for that car.

57. A control system according to claim 56, wherein said auxiliary individual car wiring means for each car also connects an individual car circuit terminal of the associated auxiliary individual car circuits to a circuit terminal of said auxiliary group circuitry.

58. For use in control systems for conveyor cars, apparatus capable of being arranged in different systems to operate in different manners to provide different operating characteristics to the cars thereof, each car of each system serving a plurality of stops in response to control signals produced by associated call registering devices and associated car position indicating means, said apparatus for each car of each system including a first plurality of circuit boards, each board including a plurality of electrical components, first wiring means for each car of each system for interconnecting the electrical components of the first circuit boards of its associated car and for connecting them to receive the control signals produced by the associated call registering devices and car position indicating means to form individual conveyor car control circuitry, the control circuitry of each car being operable in a predetermined manner in response to identical control signals to provide its associated car with predetermined operating characteristics, auxiliary circuit boards for cars whose control circuitry is to be operable in response to said control signals in a manner different from said predetermined manner to provide said cars with operating characteristics different from said predetermined ones, each auxiliary circuit board including a plurality of electrical components, and auxiliary wiring means for each auxiliary circuit board for connecting the electrical components of its associated auxiliary circuit board to the control circuitry provided for the associated car to make said associated control circuitry operable in its specifically different manner, wherein the first circuit boards of one car are interchangeable with the corresponding first circuit boards of another car with the control circuitry of both retaining the ability to operate in said predetermined manner notwithstanding the control circuitry of said one car is operable in response to identical control signals in a manner different from that of said other car so as to provide said one car with operating characteristics different from said other car.

59. Apparatus according to claim 58, wherein the first circuit boards for each car are printed circuit boards and the first wiring means interconnecting the electrical components of the first printed circuit boards for each car includes a plurality of printed circuit conductor paths on each board which interconnect the electrical components mounted thereon, said first printed circuit boards for each car including control circuit terminals each being connected by a conductor path to an electrical component on its associated board notwithstanding the parts to form the individual car control circuitry are complete without such connections.

60. For use in control systems for single conveyor cars as well as for pluralities of conveyor cars which operate as supervised groups, apparatus according to claim 59 which when used in systems for pluralities of elevator cars is operable in different manners to control different groups according to different modes of operation, said apparatus including a second plurality of circuit boards for each system which includes a plurality of cars which operate as a supervised group, each second circuit board including a plurality of electrical components, second wiring means for each such system for interconnecting the electrical components of the second circuit boards to form group control circuitry and for connecting said group control circuitry of each system to the individual conveyor car control circuitry of each car of that system to form combined control circuitry, the combined control circuitry of each such system being operable in a particular manner in response to identical control signals to control its associated cars as a supervised group according to a predetermined mode of operation, an auxiliary group circuit board for each system including a plurality of cars which are to operate as a supervised group and whose combined control circuitry is to be operable in response to said control signals in a manner different from said particular manner to control its associated cars according to a mode of operation different from said predetermined mode, each auxiliary group circuit board including a plurality of electrical components, and auxiliary group wiring means for each auxiliary group circuit board for connecting the electrical components of its associated auxiliary group circuit board to the combined control circuitry provided for the associated group to make said associated combined control circuitry operable in its specifically different manner, wherein the second circuit boards of one plural car system are interchangeable with the corresponding second circuit boards of another such system notwithstanding the combined control circuitry of said one system is operable in response to identical control signals in a manner different from that of said other system so as to control the cars of said one system according to a mode of operation different from that of the cars of said other system.

61. Apparatus according to claim 60, wherein the second circuit boards for each plural car system are printed circuit boards and the second wiring means for each such system includes a plurality of printed circuit conductor paths on each board which interconnect the electrical components mounted thereon, said second printed circuit boards for each such system including group control circuit terminals each being connected by a conductor path to an electrical component on its associated board notwithstanding the parts to form the group control circuitry are complete without such connections.

62. Apparatus according to claim 61, including an auxiliary individual car circuit board for each car of a plural car system whose combined control circuitry is to operate in a manner different from said particular manner so as to control the cars of said system according to a mode of operation different from said predetermined mode, each said auxiliary individual car circuit board including a plurality of electrical components, and auxiliary wiring means for each such auxiliary circuit board for connecting the electrical components of its associated board to the combined control circuitry and to the electrical components of the auxiliary group circuit board provided for the associated system.

63. Apparatus according to claim 62, wherein auxiliary group wiring means is provided for each plural car system for which an auxiliary group circuit board is provided for connecting the electrical components of the associated auxiliary group circuit board to group control circuit terminals of the second printed circuit boards provided for the associated system.

64. For use in control systems for elevator cars, apparatus capable of being arranged in different systems to operate in different manners to control the cars thereof differently, each car of each system serving a plurality of landings in response to control signals produced by call registering devices and associated car position indicating means, said apparatus for each car of each system including a plurality of printed circuit boards, each board including a plurality of printed circuit conductor paths and a plurality of electrical components mounted thereon interconnected by the conductor paths and forming switching circuits, wiring means for each car of each system interconnecting the switching circuits of the various printed circuit boards of that car and connecting them to receive the signals produced by the associated call registering means and car position indicating means thereby forming basic control circuitry, each basic control circuitry being operable in the same manner in response to identical control signals to control its associated car in the same particular manner, wherein the printed circuit boards of each car include control circuit terminals, each being connected by a conductor path to a switching circuit mounted on its associated printed circuit board notwithstanding such connections are unnecessary for the basic control circuitry, an auxiliary printed circuit board for each car which is operable in a manner different from said particular manner, each auxiliary board including a plurality of printed circuit conductor paths and a plurality of electrical components mounted thereon interconnected by the conductor paths and forming different auxiliary switching circuits for each car which operates in an individually different manner, and auxiliary wiring means for each said car connecting its auxiliary switching circuits to its basic control circuitry through predetermined different ones of said control circuit terminals whereby without altering any of the basic control circuitry of any of said cars each is operable in a different manner in response to the same control signals to control its associated car to operate in its individual manner and whereby each first recited printed circuit board of a car is interchangeable with the corresponding printed circuit board of another car notwithstanding the basic control circuitry of the one car is operable in response to certain control signals in a manner different from the manner in which the basic control circuitry of the other car is operable in response to identical control signals.

* * * * *